(12) United States Patent
Masuoka et al.

(10) Patent No.: US 8,039,893 B2
(45) Date of Patent: Oct. 18, 2011

(54) CMOS INVERTER COUPLING CIRCUIT COMPRISING VERTICAL TRANSISTORS

(75) Inventors: Fujio Masuoka, Chuo-ku (JP); Hiroki Nakamura, Chuo-ku (JP)

(73) Assignees: Unisantis Electronics (Japan) Ltd., Tokyo (JP); Tohoku University, Miyagi (JP)

( * ) Notice: Subject to any disclaimer, the term of this patent is extended or adjusted under 35 U.S.C. 154(b) by 0 days.

(21) Appl. No.: 12/284,327

(22) Filed: Sep. 19, 2008

(65) Prior Publication Data

US 2009/0057722 A1 Mar. 5, 2009

Related U.S. Application Data

(63) Continuation of application No. PCT/JP2008/052450, filed on Feb. 14, 2008.

(30) Foreign Application Priority Data

May 30, 2007 (JP) ................................. 2007-143891

(51) Int. Cl.
*H01L 29/732* (2006.01)

(52) U.S. Cl. ........... 257/329; 257/E29.118; 257/E21.41; 257/E21.629; 257/E21.643; 438/212

(58) Field of Classification Search .................. 257/329, 257/E29.118, E21.41, E21.629, E21.643; 438/212
See application file for complete search history.

(56) References Cited

U.S. PATENT DOCUMENTS

| | | | | |
|---|---|---|---|---|
| 4,740,826 A | * | 4/1988 | Chatterjee | 257/334 |
| 5,208,172 A | * | 5/1993 | Fitch et al. | 438/272 |
| 5,258,635 A | | 11/1993 | Nitayama et al. | |
| 6,448,953 B1 | * | 9/2002 | Murade | 345/98 |
| 2004/0173844 A1 | | 9/2004 | Williams et al. | |
| 2004/0262681 A1 | | 12/2004 | Masuoka et al. | |
| 2006/0028861 A1 | * | 2/2006 | Han et al. | 365/154 |

FOREIGN PATENT DOCUMENTS

CN 1757117 A 4/2006
(Continued)

OTHER PUBLICATIONS

Claim recitation for U.S. Appl. No. 12/697,683, filed Feb. 1, 2010.*
Watanebe, et al, "A Novel Circuit Technology with Surrounding Gate Transistors (SGT's) for Ultra High Density DRAM's", IEEE Journal of Solid-State Circuits, vol. 30, No. 9, pp. 960-971, 1995.
Written Opinion of the International Search Authority issued May 9, 2008 in International application No. PCT/JP2008/052450.

(Continued)

*Primary Examiner* — Leonardo Andujar
*Assistant Examiner* — Christopher M Roland
(74) *Attorney, Agent, or Firm* — Brinks Hofer Gilson & Lione

(57) ABSTRACT

There is provided a semiconductor device formed of a highly integrated high-speed CMOS inverter coupling circuit using SGTs provided on at least two stages. A semiconductor device according to the present invention is formed of a CMOS inverter coupling circuit in which n (n is two or above) CMOS inverters are coupled with each other, each of the n inverters has: a pMOS SGT; an nMOS SGT, an input terminal arranged so as to connect a gate of the pMOS SGT with a gate of the nMOS SGT; an output terminal arranged to connect a drain diffusion layer of the pMOS SGT with a drain diffusion layer of the nMOS SGT in an island-shaped semiconductor lower layer; a pMOS SGT power supply wiring line arranged on a source diffusion layer of the pMOS SGT; and an nMOS SGT power supply wiring line arranged on a source diffusion layer of the NMOS SGT, and an n−1th output terminal is connected with an nth input terminal.

61 Claims, 57 Drawing Sheets

FOREIGN PATENT DOCUMENTS

| | | |
|---|---|---|
| JP | 2-71556 A | 3/1990 |
| JP | 2-188966 A | 7/1990 |
| JP | 3-145761 A | 6/1991 |
| JP | 2004-165297 A | 6/2004 |
| JP | 2004-356314 A | 12/2004 |
| JP | 2005-268438 A | 9/2005 |

OTHER PUBLICATIONS

Iwai, Makoto et al., "High-Performance Buried-Gate Surrounding Gate Transistor for Future Three-Dimensional Devices," Japanese Journal of Applied Physics, vol. 43, No. 10, 2004, pp. 6904-6906.

* cited by examiner

EQUIVALENT CIRCUIT

X                                                                X'

Y₁                    Y'₁

Y₂                    Y'₂

X                                                                                          X'

$Y_1$              $Y'_1$ $Y_2$              $Y'_2$

X                                                                                   X'

$Y_1$              $Y'_1$ $Y_2$              $Y'_2$

X                                                                    X'

Y₁                    Y'₁

Y₂                    Y'₂

X                                                                      X'

$Y_1$                    $Y'_1$ $Y_2$                    $Y'_2$

X                                                                              X'

$Y_1$                    $Y'_1$ $Y_2$                    $Y'_2$

X                                                                               X'

Y₁                                  Y'₁

Y₂                  Y'₂

X                                          X'

$Y_1$          $Y'_1$ $Y_2$          $Y'_2$

X                                                                                          X'

Y₁                    Y'₁

Y₂                    Y'₂

X  X'

$Y_1$  $Y'_1$ $Y_2$  $Y'_2$

US 8,039,893 B2

CMOS INVERTER COUPLING CIRCUIT COMPRISING VERTICAL TRANSISTORS

RELATED APPLICATIONS

This application is a continuation of PCT/JP2008/052450, filed on Feb. 14, 2008, which claims priority to Japanese Application No. 2007-143891 filed on May 30, 2007, the entire content of which is incorporated herein by references.

TECHNICAL FIELD

The present invention relates to a semiconductor device.

BACKGROUND ART

Integration of a semiconductor integrated circuit, especially an integrated circuit using MOS transistors is advancing. With this advancement of integration, miniaturization of the MOS transistor used in the circuit has proceeded to a nano level. Although a basic circuit of a digital circuit is an inverter circuit, when miniaturization of the MOS transistor constituting this inverter circuit advances, there occurs a problem that suppressing a leak current is difficult, reliability is reduced to a hot carrier effect, and an area share ratio of the circuit is hardly decreased because a necessary current amount must be assured. To solve such a problem, a surrounding gate transistor (SGT) having a structure in which a source, a gate, and a drain are arranged in a vertical direction with respect to a substrate and the gate surrounds an island-shaped semiconductor layer has been proposed, and a CMOS inverter circuit using the SGTs has been proposed (see, e.g., Japanese Patent Application Laid-open No. JP2-71556, Japanese Patent Application Laid-open No. JP2-188966, and Japanese Patent Application Laid-open No. JP3-145761).

FIG. 1 shows a conventional two-stage CMOS inverter using SGTs in which an output from a first inverter is input to a second inverter (S. Watanabe, K. Tsuchida, D. Takashima, Y. Oowaki, A. Nitayama, K. Hieda, H. Takato, K. Sunouchi, F. Horiguchi, K. Ohuchi, F. Masuoka, H. Hara, "A Nobel Circuit Technology with Surrounding Gate Transistors (SGT's) for Ultra High Density DRAM's", IEEE JSSC, Vol. 30, No. 9, 1995). The first inverter includes two pMOS SGTs 01 and 02 and one nMOS SGT 03. The second inverter includes two pMOS SGTs 04 and 05 and two nMOS SGTs 06 and 07. The conventional two-stage CMOS inverter with the SGTs utilizes the SGTs in which each of a first power supply wiring line $V_{SS}$ and a second power supply wiring line $V_{CC}$ is supplied via a diffusion layer of a silicon substrate through contacts. That is, the power supply lines of the nMOS and the pMOS are arranged in one side of a lower portion of a gate region that is different from a region on the substrate where the NMOS and the pMOS are arranged. A resistance of the diffusion layer is extremely higher than that of a metal wiring line for power supply. When the resistances of the first power supply wiring line $V_{SS}$ and the second power supply wiring line $V_{CC}$ are increased, a source voltage applied to the NMOS SGT is increased beyond a first power supply voltage $V_{SS}$ and a source voltage applied to the pMOS SGT is reduced beyond a second power supply voltage $V_{CC}$. When the source voltage for the nMOS SGT is increased beyond the first power supply voltage $V_{SS}$, a driving current for the NMOS SGT is decreased. When the source voltage for the pMOS SGT is reduced beyond the second power supply voltage $V_{CC}$, a driving current for the pMOS SGT is decreased. When the driving current for the transistor is decreased, a speed of charging/discharging a capacitance at an output terminal of the inverter is reduced. When the speed for charging/discharging the capacitance at the output terminal of the inverter is reduced, a delay time of the inverter is increased. Therefore, a metal wiring line is provided to the diffusion layer through many contacts, the first power supply voltage $V_{SS}$ is applied to a source of the NMOS SGT, and the second power supply voltage $V_{CC}$ is applied to a source of the pMOS SGT.

Further, the conventional SGT CMOS inverter forms contacts in the diffusion layer of a drain to be connected with a metal wiring line, thereby providing a first inverter output. The metal wiring line at the first inverter output is connected with a gate of polysilicon as a second inverter input through the contacts.

That is, in the conventional substrate grounded type two-stage CMOS inverter using the SGTs, a ratio of a contact area with respect to a circuit occupied area is large. Furthermore, when the resistances of the first power supply wiring line $V_{SS}$ and the second power supply wiring line $V_{CC}$ are increased, a delay time of the inverter is increased.

SUMMARY OF THE INVENTION

Therefore, it is an object of the present invention to provide a semiconductor device including a highly integrated high-speed CMOS inverter coupling circuit that uses SGTs and has at least two stages to reduce areas of a first power supply wiring line $V_{SS}$ and a second power supply wiring line $V_{CC}$ and also reduce resistances of the same.

According to one aspect of the present invention, there is provided a semiconductor device comprising a CMOS inverter coupling circuit that couples n (n is two or above) CMOS inverters with each other, each of the n CMOS inverters having:

a first MOS transistor for a first conductivity type channel, which has a structure where a drain, a gate, and a source are arranged in a vertical direction with respect to a substrate and the gate surrounds an island-shaped semiconductor layer;

a second MOS transistor for a second conductivity type channel different from the first conductivity type channel, which has a structure where a drain, a gate, and a source are arranged in a vertical direction with respect to the substrate and the gate surrounds an island-shaped semiconductor layer;

an input terminal of the CMOS inverter arranged so as to connect the gate of the first MOS transistor with the gate of the second MOS transistor;

an output terminal of the CMOS inverter arranged so as to connect a drain diffusion layer of the first MOS transistor with a drain diffusion layer of the second MOS transistor in an island-shaped semiconductor lower layer;

a power supply wiring line for the first MOS transistor, which is arranged on a source diffusion layer of the first MOS transistor;

a power supply wiring line for the second MOS transistor, which is arranged on a source diffusion layer of the second MOS transistor, wherein the semiconductor device further has a coupling portion that is used to connect the output terminal of an n−1th CMOS inverter with the input terminal of an nth CMOS inverter when arranging each of the n CMOS inverters with respect to the substrate, and the coupling portion is arranged between the substrate and the power supply wiring line for the first MOS transistor.

According to a preferred aspect of the present invention, in the semiconductor device, when the n CMOS inverters are arranged in a row with respect to the substrate, the first MOS transistor in the n−1th CMOS inverter and the first MOS transistor in the nth CMOS inverter are arranged to be adjacent to each other, the second MOS transistor in the nth CMOS inverter and the second MOS transistor in the n+1th CMOS inverter are arranged to be adjacent to each other, the power supply wiring line for the first MOS transistor of the n−1th CMOS inverter is connected with the power supply wiring line for the first MOS transistor of the nth CMOS inverter on the source diffusion layers, and the power supply wiring line for the second MOS transistor of the nth CMOS inverter is connected with the power supply wiring line for the second MOS transistor of the n+1th CMOS inverter on the source diffusion layers.

According to another preferred aspect of the present invention, in the semiconductor device, the n CMOS inverters arranged in a row with respect to the substrate are arranged in m rows (m is two or above) with respect to the substrate, the power supply wiring lines for the first MOS transistors of the respective CMOS inverters are connected with each other on the source diffusion layers, and the power supply wiring lines for the second MOS transistors of the respective CMOS inverters are connected with each other on the source diffusion layers.

According to still another preferred aspect of the present invention, the first MOS transistor is a p-channel MOS transistor, and the second MOS transistor is an n-channel MOS transistor. Further, alternatively, the first MOS transistor is an n-channel MOS transistor, and the second MOS transistor is a p-channel MOS transistor.

According to yet another preferred aspect of the present invention, the first MOS transistor is an n-channel MOS transistor, the second MOS transistor is a p-channel MOS transistor, and the number of the p-channel MOS transistors is double the number of the n-channel transistors. Furthermore, alternatively, the first MOS transistor is a p-channel MOS transistor, the second MOS transistor is an n-channel MOS transistor, and the number of the p-channel MOS transistors is double the number of the n-channel transistors.

According to a further aspect of the present invention, there is provided a semiconductor device comprising a CMOS inverter coupling circuit in which CMOS inverters on at least two stages are coupled with each other, the CMOS inverter having a first CMOS inverter and a second CMOS inverter, wherein the first CMOS inverter is a CMOS inverter having:

one n-channel semiconductor device having a structure where a drain, gate, and a source are arranged in a vertical direction with respect to a substrate and the gate surrounds an island-shaped semiconductor layer;

two p-channel semiconductor devices each having a structure where a drain, a gate, and a source are arranged in the vertical direction with respect to the substrate and the gate surrounds an island-shaped semiconductor layer;

an input terminal of the first CMOS inverter arranged so as to connect the gate of the n-channel semiconductor device with the gate of the p-channel semiconductor device;

an output terminal of the first CMOS inverter arranged so as to connect a drain diffusion layer of the channel semiconductor device with a drain diffusion layer of the p-channel semiconductor device in an island-shaped semiconductor lower layer;

a first power supply wiring line $V_{SS}$ connected with a source diffusion layer of the n-channel semiconductor device; and a second power supply wiring line $V_{CC}$ connected with source diffusion layers of the two p-channel semiconductor devices, the second CMOS inverter is a CMOS inverter having:

one n-channel semiconductor device having a structure where a drain, a gate, and a source are arranged in the vertical direction with respect to the substrate and the gate surrounds an island-shaped semiconductor layer;

two p-channel semiconductor devices each having a structure where a drain, a gate, and a source are arranged in the vertical direction with respect to the substrate and the gate surrounds an island-shaped semiconductor layer;

an input terminal of the second CMOS inverter arranged so as to connect the gate of the n-channel semiconductor device with the gate of the p-channel semiconductor device;

an output terminal of the second CMOS inverter arranged so as to connect a drain diffusion layer of the n-channel semiconductor device with a drain diffusion layer of the p-channel semiconductor device in the island-shaped semiconductor lower layer;

a first power supply wiring line $V_{SS}$ connected with a source diffusion layer of the n-channel semiconductor device; and a second power supply wiring line $V_{CC}$ connected with source diffusion layers of the two p-channel semiconductor devices, the output terminal of the first CMOS inverter is connected with the input terminal of the second CMOS inverter, the first power supply wiring line $V_{SS}$ connected with the source diffusion layer of the n-channel semiconductor device in the first CMOS inverter is connected with the first power supply wiring line $V_{SS}$ connected with the source diffusion layer of the n-channel semiconductor device in the second CMOS inverter on the source diffusion layers, and the second power supply wiring line $V_{CC}$ connected with the source diffusion layers of the two p-channel semiconductor devices in the first CMOS inverter is connected with the second power supply wiring line $V_{CC}$ connected with the source diffusion layers of the two p-channel semiconductor devices in the second CMOS inverter on the source diffusion layers.

Additionally, according to a still further aspect of the present invention, there is provided a semiconductor device comprising a CMOS inverter coupling circuit in which CMOS inverters arranged in at least two rows and two columns are coupled with each other, wherein the CMOS inverter in a first row and a second column is a CMOS inverter having:

one n-channel semiconductor device having a structure where a drain, gate, and a source are arranged in a vertical direction with respect to a substrate and the gate surrounds an island-shaped semiconductor layer;

two p-channel semiconductor devices each having a structure where a drain, a gate, and a source are arranged in the vertical direction with respect to the substrate and the gate surrounds an island-shaped semiconductor layer;

an input terminal of the CMOS inverter in the first row and the second column, which is arranged so as to connect the gate of the n-channel semiconductor device with the gate of the p-channel semiconductor device;

an output terminal of the CMOS inverter in the first row and the second column, which is arranged so as to connect a drain diffusion layer of the n-channel semiconductor device with a drain diffusion layer of the p-channel semiconductor device in an island-shaped semiconductor lower layer;

a first power supply wiring line $V_{SS}$ connected with a source diffusion layer of the n-channel semiconductor device; and a second power supply wiring line $V_{CC}$ connected with source diffusion layers of the two p-channel semiconductor devices, the CMOS inverter in the first row and a first column is a CMOS inverter having:

one n-channel semiconductor device having a structure where a drain, a gate, and a source are arranged in the vertical direction with respect to the substrate and the gate surrounds an island-shaped semiconductor layer;

two p-channel semiconductor devices each having a structure where a drain, a gate, and a source are arranged in the vertical direction with respect to the substrate and the gate surrounds an island-shaped semiconductor layer;

an input terminal of the CMOS inverter arranged in the first row and the first column, which is arranged so as to connect the gate of the n-channel semiconductor device with the gate of the p-channel semiconductor device;

an output terminal of the CMOS inverter in the first row and the first column, which is arranged so as to connect a drain diffusion layer of the n-channel semiconductor device with a drain diffusion layer of the p-channel semiconductor device in the island-shaped semiconductor lower layer;

a first power supply wiring line $V_{SS}$ connected with a source diffusion layer of the n-channel semiconductor device; and a second power supply wiring line $V_{CC}$ connected with source diffusion layers of the two p-channel semiconductor devices, the output terminal of the CMOS inverter in the first row and the second column is connected with the input terminal of the CMOS inverter in the first row and the first column in the CMOS inverter coupling circuit, the CMOS inverter in a second row and the second column is a CMOS inverter having:

one n-channel semiconductor device having a structure where a drain, a gate, and a source are arranged in the vertical direction with respect to the substrate and the gate surrounds an island-shaped semiconductor layer;

two p-channel semiconductor devices each having a structure where a drain, a gate, and a source are arranged in the vertical direction with respect to the substrate and the gate surrounds an island-shaped semiconductor layer;

an input terminal of the CMOS inverter in the second row and the second column, which is arranged so as to connect the gate of the n-channel semiconductor device with the gate of the p-channel semiconductor device;

an output terminal of the CMOS inverter in the second row and the second column arranged so as to connect a drain diffusion layer of the n-channel semiconductor device with a drain diffusion layer of the p-channel semiconductor device in the island-shaped semiconductor lower layer;

a first power supply wiring line $V_{SS}$ connected with a source diffusion layer of the n-channel semiconductor device; and a second power supply wiring line $V_{CC}$ connected with source diffusion layers of the two p-channel semiconductor devices, the CMOS inverter in the second row and the first column is a CMOS inverter having:

one n-channel semiconductor device having a structure where a drain, a gate, and a source are arranged in the vertical direction with respect to the substrate and the gate surrounds an island-shaped semiconductor layer;

two p-channel semiconductor devices each having a structure where a drain, a gate, and a source are arranged in the vertical direction with respect to the substrate and the gate surrounds an island-shaped semiconductor layer;

an input terminal of the CMOS inverter in the second row and the first column, which is arranged so as to connect the gate of the n-channel semiconductor device with the gate of the p-channel semiconductor device;

an output terminal of the CMOS inverter in the second row and the first column, which is arranged so as to connect a drain diffusion layer of the n-channel semiconductor device with a drain diffusion layer of the p-channel semiconductor device in the island-shaped semiconductor lower layer;

a first power supply wiring line $V_{SS}$ connected with a source diffusion layer of the n-channel semiconductor device; and a second power supply wiring line $V_{CC}$ connected with source diffusion layers of the two p-channel semiconductor devices, the output terminal of the CMOS inverter in the second row and the second column is connected with the input terminal of the CMOS inverter in the second row and the first column in the CMOS inverter coupling circuit, and the first power supply wiring line $V_{SS}$ connected with the source diffusion layer of the n-channel semiconductor device in the CMOS inverter in the first row and the second column;

the first power supply wiring line $V_{SS}$ connected with the source diffusion layer of the n-channel semiconductor device in the CMOS inverter in the first row and the first column;

the first power supply wiring line $V_{SS}$ connected with the source diffusion layer of the n-channel semiconductor device in the CMOS inverter in the second row and the second column; and the first power supply wiring line $V_{SS}$ connected with the source diffusion layer of the n-channel semiconductor device of the CMOS inverter in the second row and the first column are connected with each other on the source diffusion layers, and the second power supply wiring line $V_{CC}$ connected with the source diffusion layers of the two p-channel semiconductor devices in the CMOS inverter in the first row and the second column;

the second power supply wiring line $V_{CC}$ connected with the source diffusion layers of the two p-channel semiconductor devices in the CMOS inverter in the second row and the second column;

the second power supply wiring line $V_{CC}$ connected with the source diffusion layers of the two p-channel semiconductor devices in the CMOS inverter in the first row and the first column; and the second power supply wiring line $V_{CC}$ connected with the source diffusion layers of the two p-channel semiconductor devices in the CMOS inverter in the second row and the first column are connected with each other on the source diffusion layers.

Further, according to a preferred aspect of the present invention, the n-channel semiconductor device or the n-channel MOS transistor is used in the semiconductor device and has a structure in which a drain, a gate, and a source are arranged in a vertical direction with respect to a substrate and the gate surrounds an island-shaped semiconductor layer, insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

Furthermore, according to another preferred aspect of the present invention, the p-channel semiconductor device or the p-channel MOS transistor is used in the semiconductor device and has a structure in which a drain, a gate, and a source are arranged in a vertical direction with respect to a substrate and the gate surrounds an island-shaped semiconductor layer, insulating film layers are formed above and below the gate, a polysilicon wiring line surrounds a part of a drain diffusion layer in an island-shaped semiconductor lower layer, a drain diffusion layer, the polysilicon wiring line, the gate, and a source diffusion layer are salicided, and a metal wiring line is formed on the source diffusion layer.

The conventional two-stage CMOS inverter using the SGTs utilizes the SGTs having a structure where the first power supply voltage $V_{SS}$ and the second power supply voltage $V_{CC}$ are supplied to the diffusion layer of the silicon substrate through the contacts. That is, the power supply wiring lines of the NMOS SGTs and the pMOS SGTs are arranged in on one side of a lower portion of the gate region.

On the other hand, the present invention has the first power supply wiring lines $V_{SS}$ and the second power supply wiring lines $V_{CC}$ supplied from the upper sides of both the nMOS SGTs and the pMOS SGTs and has:

the first power supply wiring line $V_{SS}$ connected with the source diffusion layer of the n-channel semiconductor device of the first inverter;

the first power supply wiring line $V_{SS}$ connected with the source diffusion layer of the n-channel semiconductor device of the second inverter;

the second power supply wiring line $V_{CC}$ connected with the source diffusion layers of the two p-channel semiconductor devices of the first inverter; and the second power supply wiring line $V_{CC}$ connected with the source diffusion layers of the two p-channel semiconductor devices of the second inverter, thereby providing the semiconductor device formed of the highly integrated CMOS inverter coupling circuit with the SGTs that can reduce areas of the first power supply wiring lines $V_{SS}$ and the second power supply wiring lines $V_{CC}$.

Furthermore, the present invention has the first power supply wiring lines $V_{SS}$ and the second power supply wiring lines $V_{CC}$ supplied from the upper sides of both the nMOS SGTs and the pMOS SGTs, and has:

the first power supply wiring line $V_{SS}$ connected with the source diffusion layer of the n-channel semiconductor device of the first inverter;

the first power supply wiring line $V_{SS}$ connected with the source diffusion layer of the n-channel semiconductor device of the second inverter;

the second power supply wiring line $V_{CC}$ connected with the source diffusion layers of the two p-channel semiconductor devices of the first inverter; and the second power supply wiring line $V_{CC}$ connected with the source diffusion layers of the two p-channel semiconductor devices of the second inverter, thereby providing the semiconductor device formed of the high-speed CMOS inverter coupling circuit with the SGTs that can reduce resistances of the first power supply wiring line $V_{SS}$ and the second power supply wiring line $V_{CC}$.

Since the output terminal wiring line that is arranged to connect the drain diffusion layer of the n-channel semiconductor device with the drain diffusion layer of the p-channel semiconductor device in the island-shaped semiconductor lower layer is provided:

the contact that is used to connect the drain diffusion layer of the n-channel semiconductor device with the metal wiring line;

the contact that is used to connect the drain diffusion layer of the p-channel semiconductor device with the metal wiring line; and the metal wiring line that connects the respective contacts with each other are no longer required, thereby providing the semiconductor device formed of the highly integrated CMOS inverter coupling circuit with the SGTs that can reduce resistances of the first power supply wiring line $V_{SS}$ and the second power supply wiring line $V_{CC}$.

BRIEF DESCRIPTION OF DRAWINGS

FIG. 116 is a $Y_2$-$Y'_2$ cross-sectional process drawing showing the manufacture example of the semiconductor device according to the present invention;

FIG. 117 is an X-X' cross-sectional process drawing showing the manufacture example of the semiconductor device according to the present invention;

FIG. 118 is a $Y_1$-$Y'_1$ cross-sectional process drawing showing the manufacture example of the semiconductor device according to the present invention;

FIG. 119 is a $Y_2$-$Y'_2$ cross-sectional process drawing showing the manufacture example of the semiconductor device according to the present invention;

FIG. 120 is an X-X' cross-sectional process drawing showing the manufacture example of the semiconductor device according to the present invention;

FIG. 121 is a $Y_1$-$Y'_1$ cross-sectional process drawing showing the manufacture example of the semiconductor device according to the present invention;

FIG. 122 is a $Y_2$-$Y'_2$ cross-sectional process drawing showing the manufacture example of the semiconductor device according to the present invention;

FIG. 123 is an X-X' cross-sectional process drawing showing the manufacture example of the semiconductor device according to the present invention;

FIG. 124 is a $Y_1$-$Y'_1$ cross-sectional process drawing showing the manufacture example of the semiconductor device according to the present invention;

FIG. 125 is a $Y_2$-$Y'_2$ cross-sectional process drawing showing the manufacture example of the semiconductor device according to the present invention;

FIG. 126 is an X-X' cross-sectional process drawing showing the manufacture example of the semiconductor device according to the present invention;

FIG. 127 is a $Y_1$-$Y'_1$ cross-sectional process drawing showing the manufacture example of the semiconductor device according to the present invention;

Figure 128:
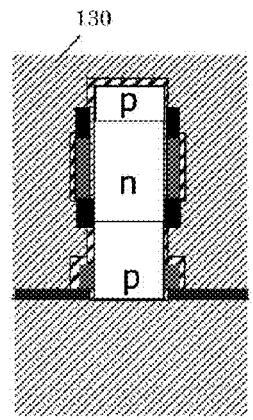
Figure 129:
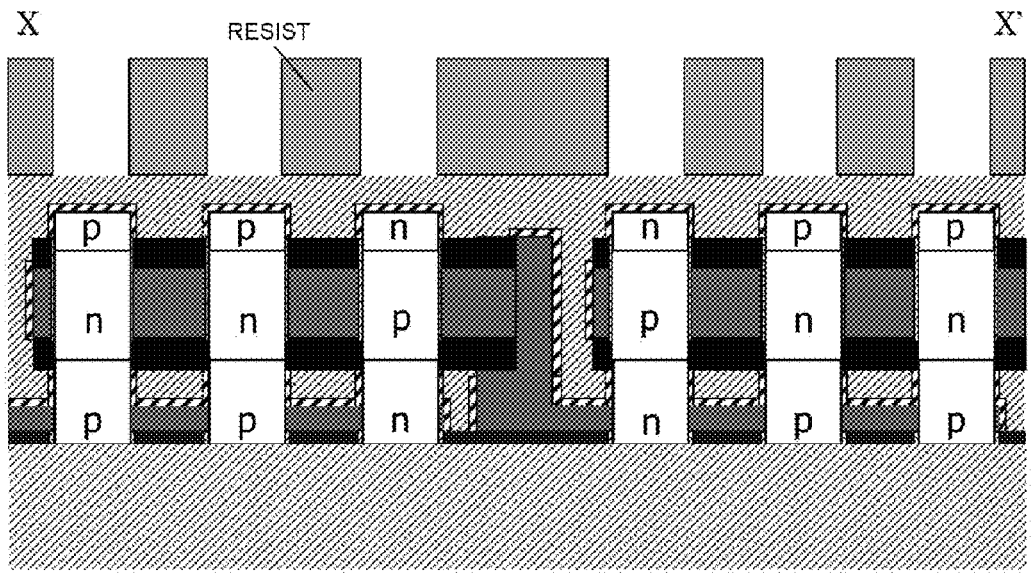
Figure 130:
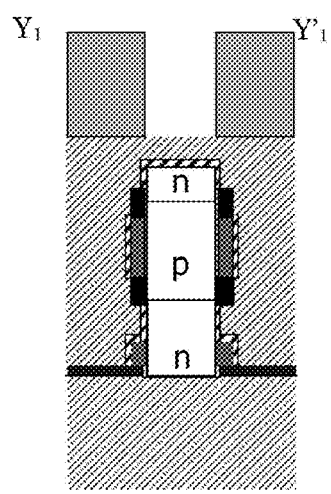
Figure 131:
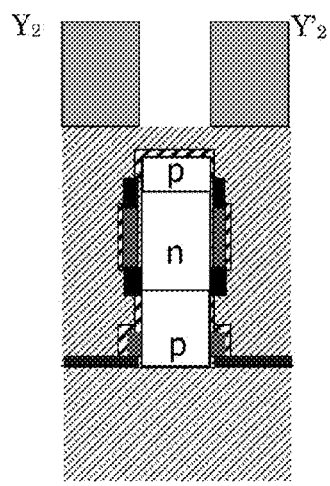
Figure 132:
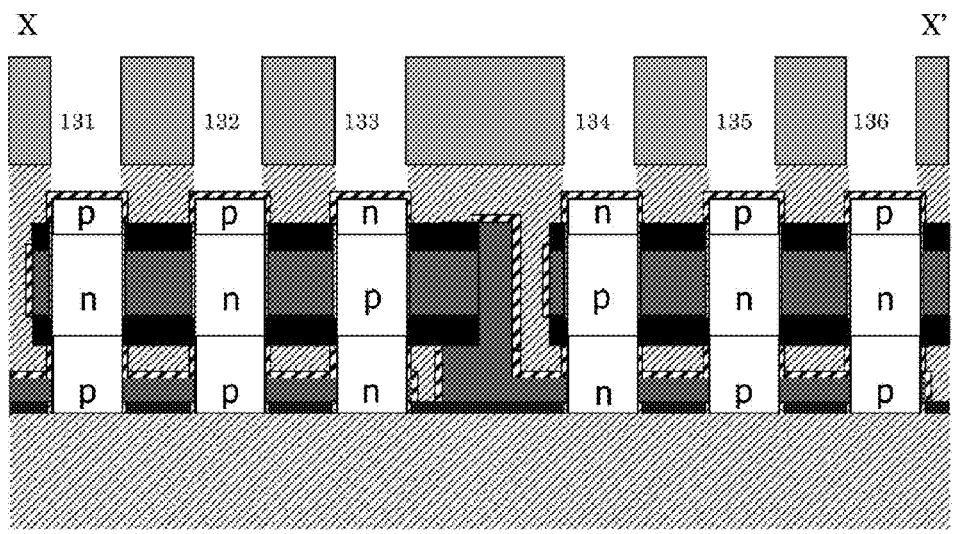
Figure 133:
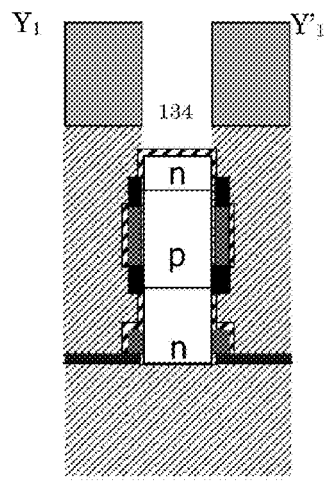
Figure 134:
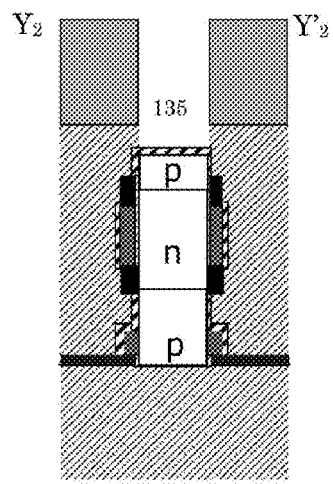
Figure 135:
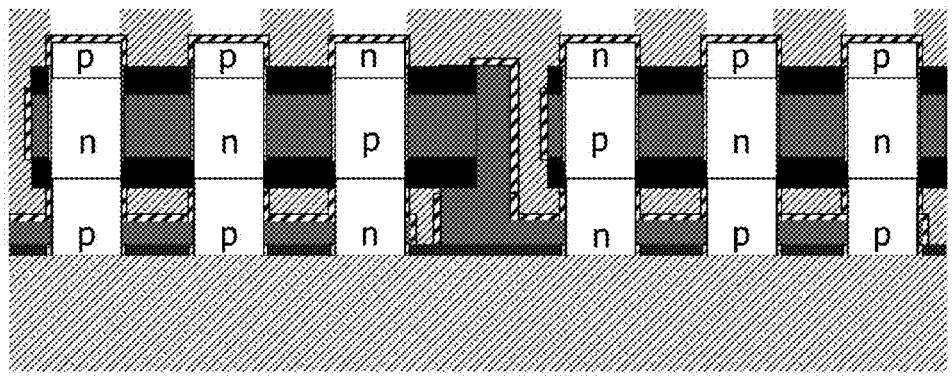
Figure 136:
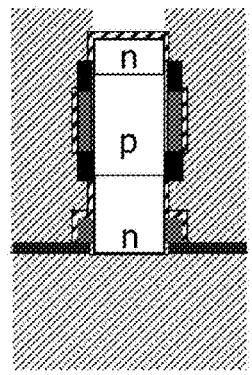
Figure 137:
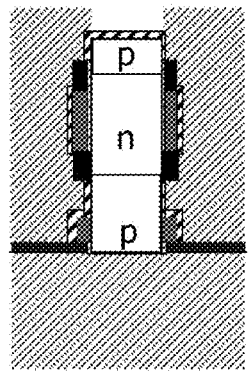
Figure 138:
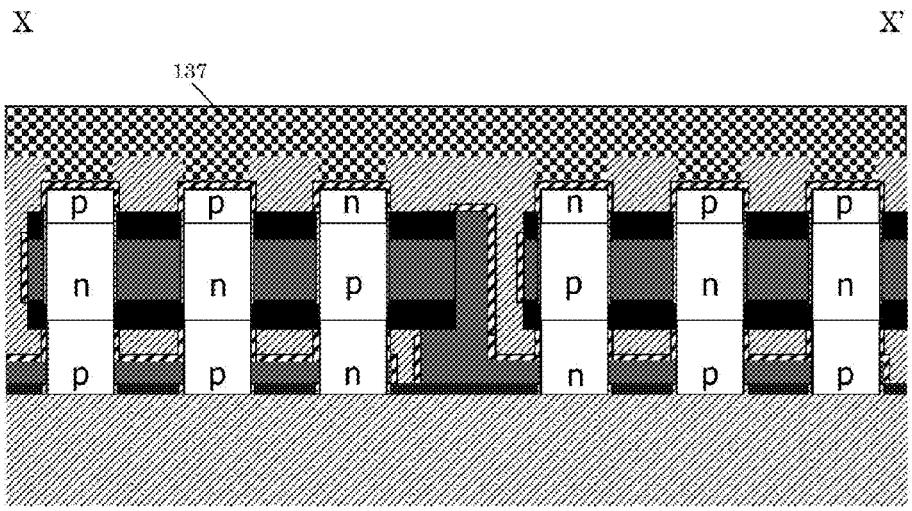
Figure 139:
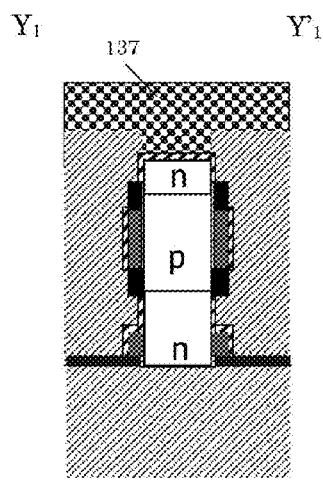
Figure 140:
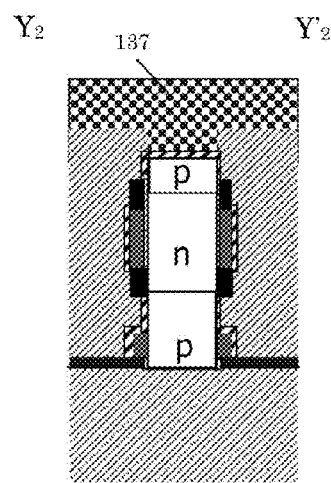
Figure 141:
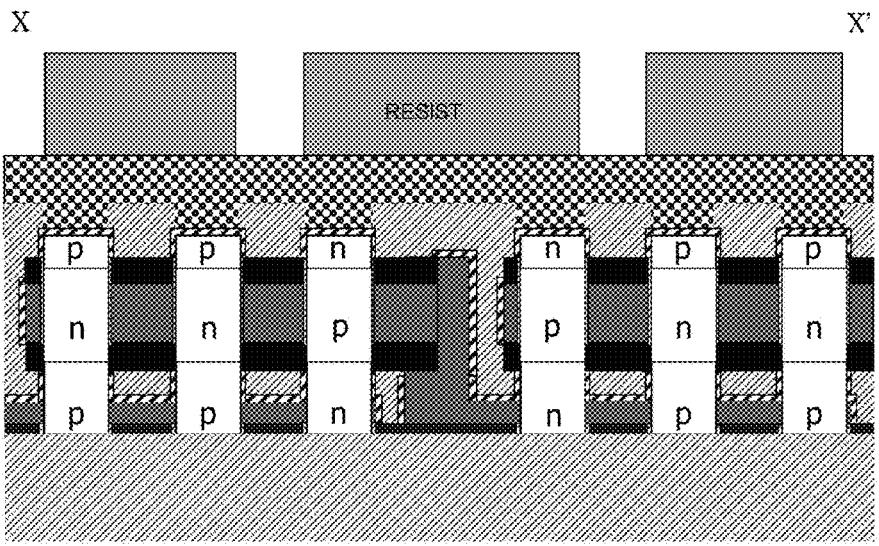
Figure 142:
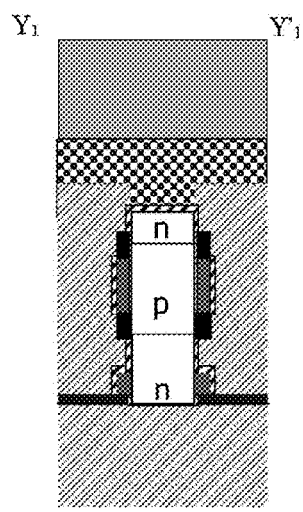
Figure 143:
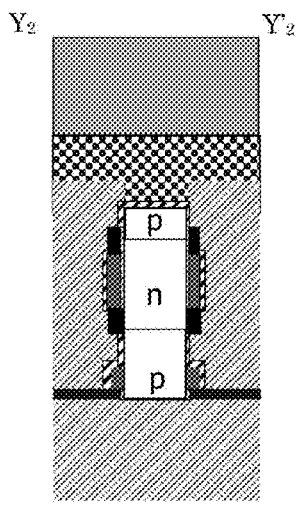
Figure 144:
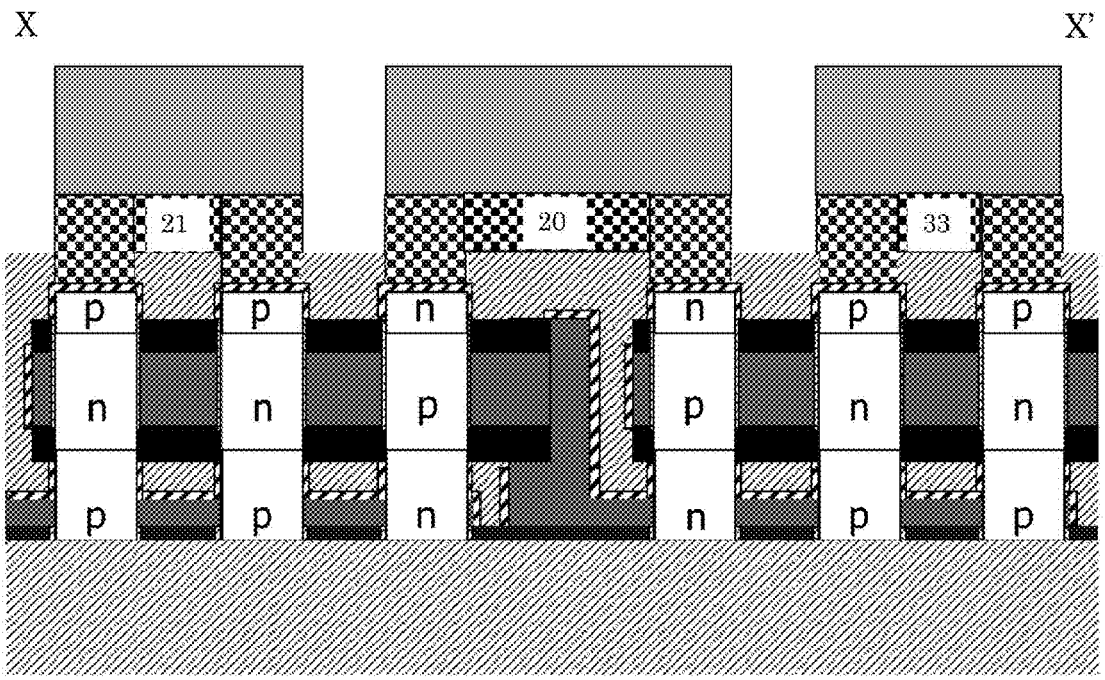
Figure 145:
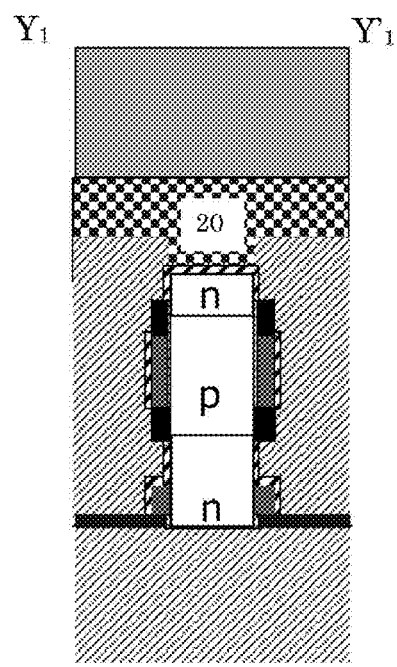
Figure 146:
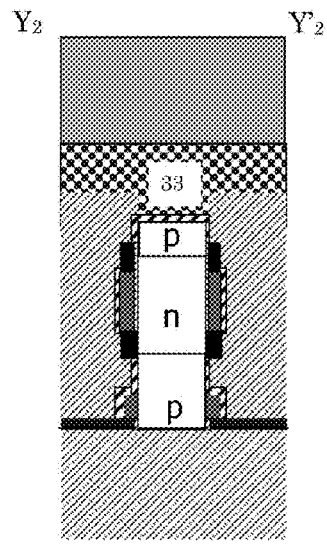
Figure 147:
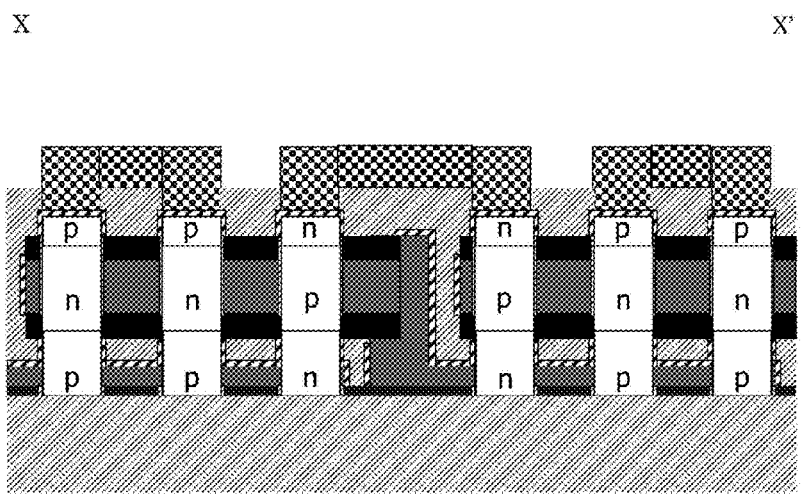
Figure 148:
Figure 148:
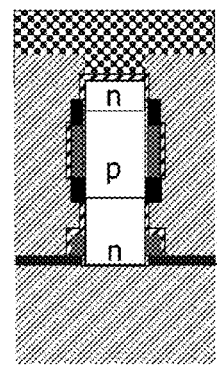
Figure 149:
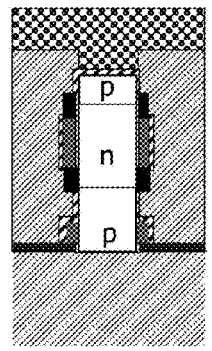
Figure 150:
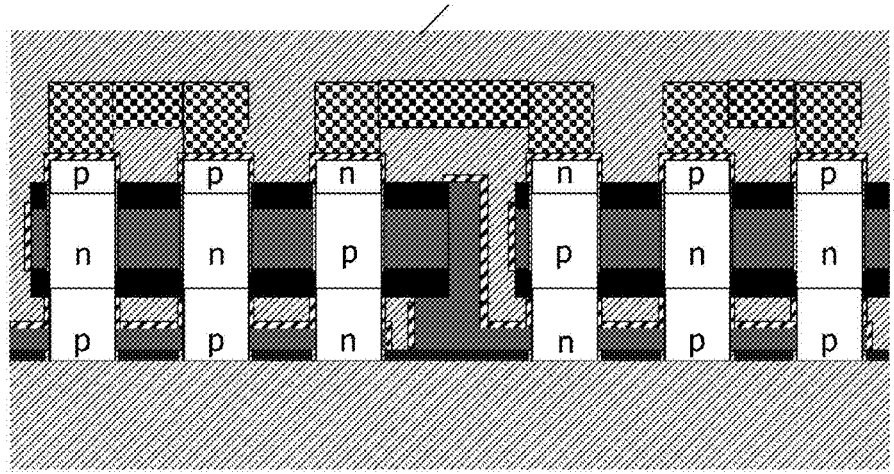
Figure 151:
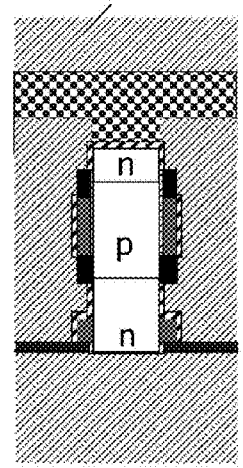
Figure 152:
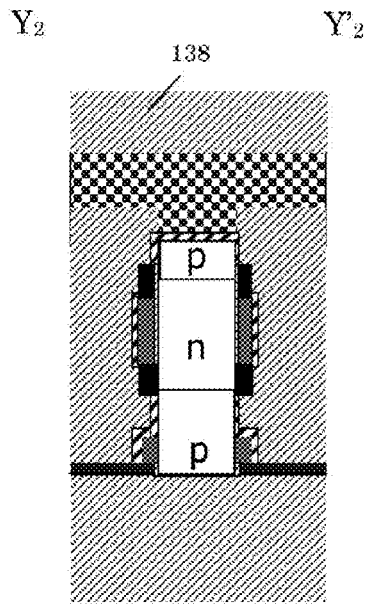
Figure 153:
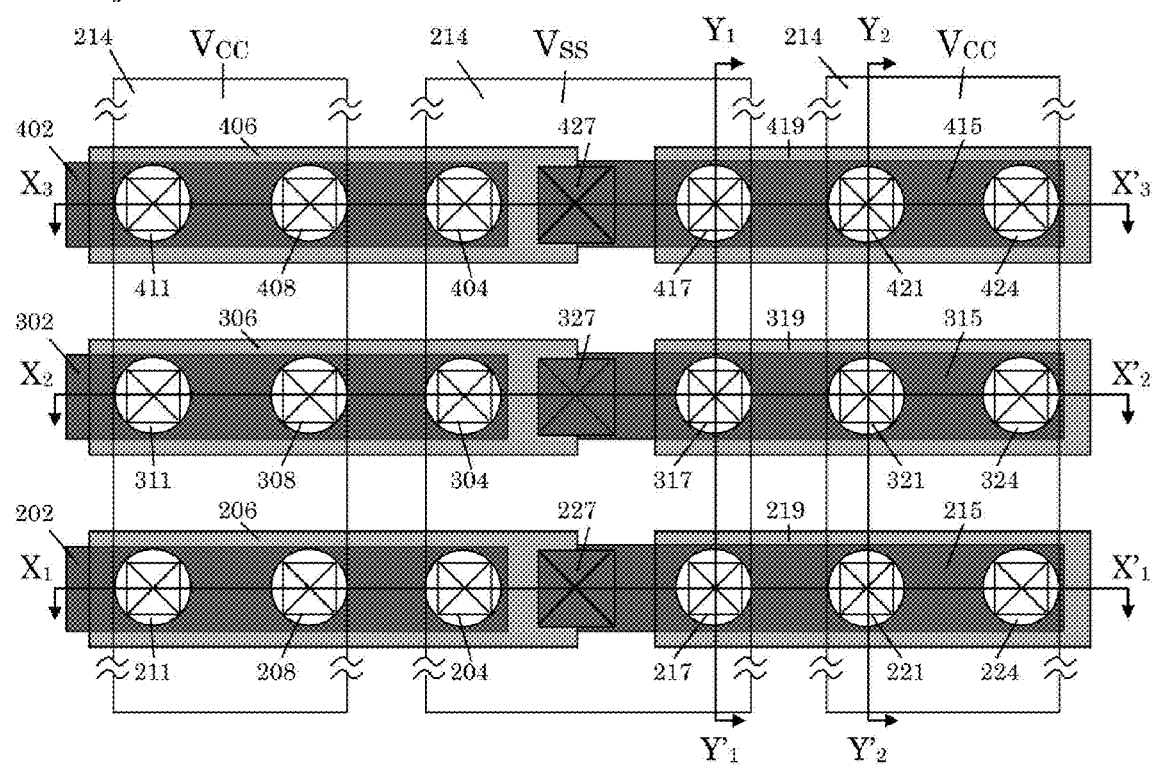
Figure 154:
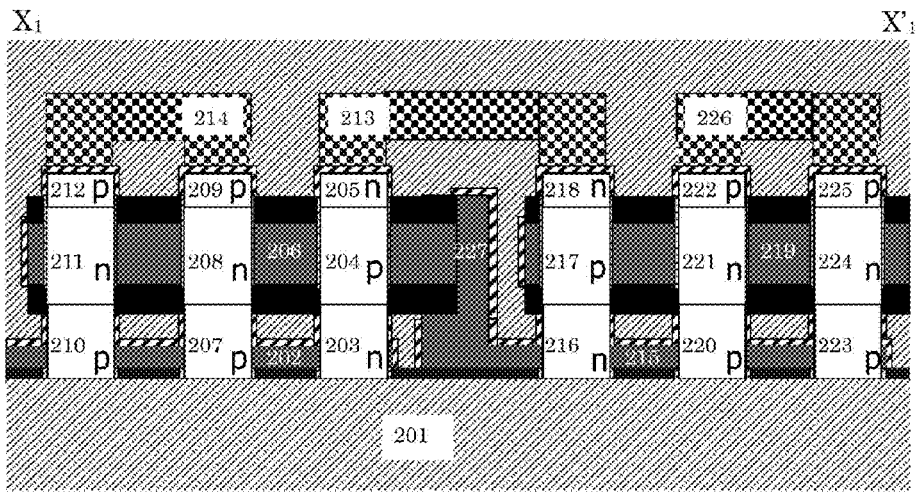
Figure 155:
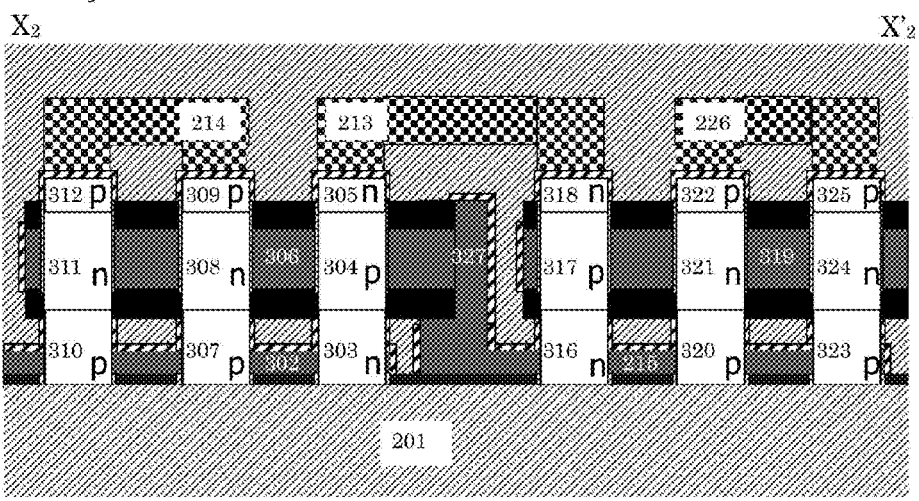
Figure 156:
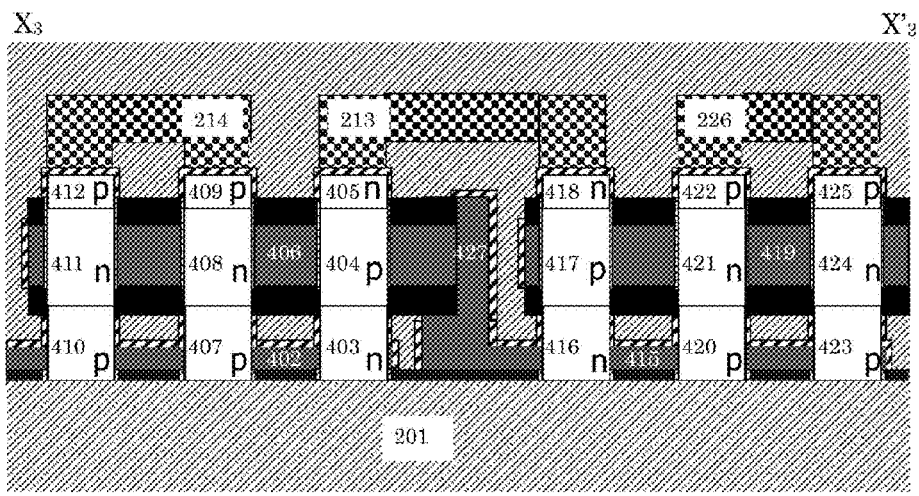
Figure 157:
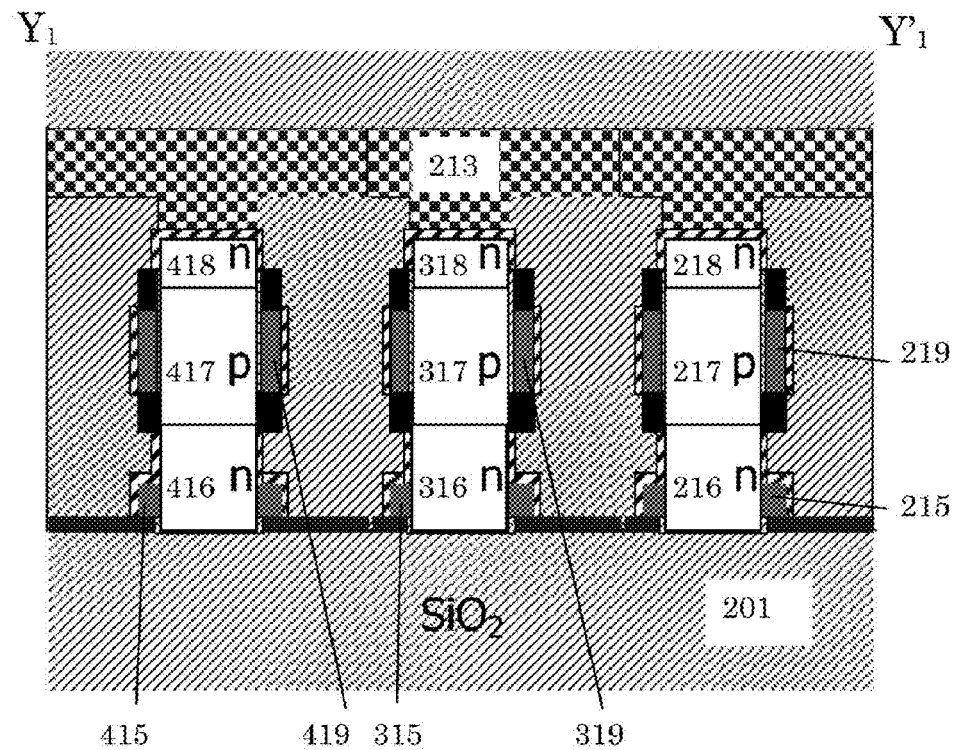
Figure 158:
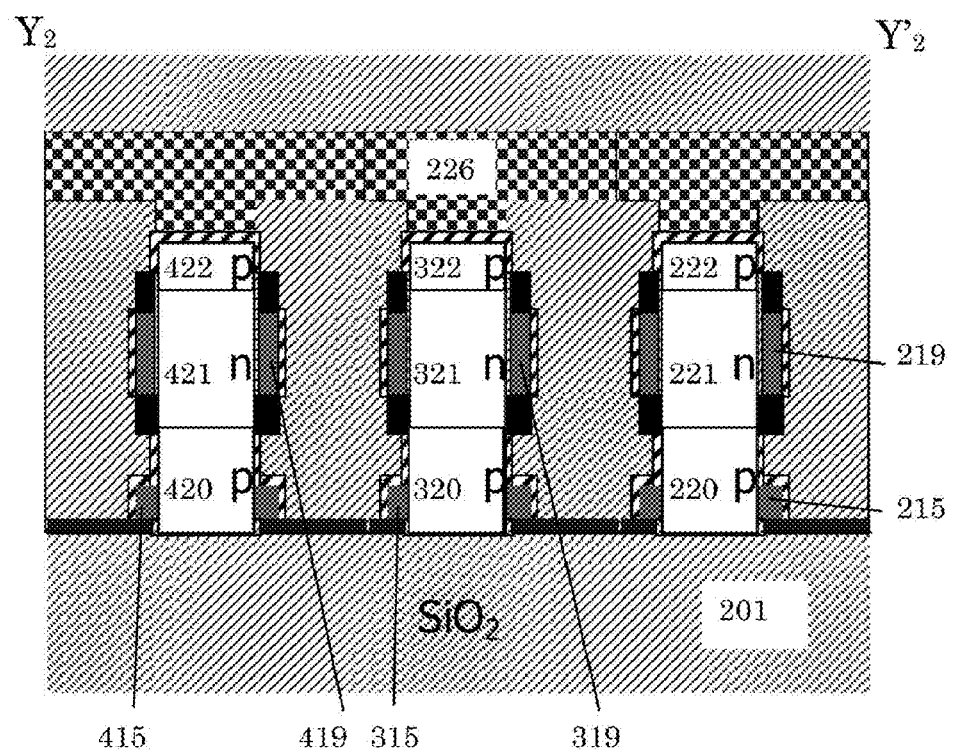

FIG. 128 is a $Y_2$-$Y'_2$ cross-sectional process drawing showing the manufacture example of the semiconductor device according to the present invention;

FIG. 129 is an X-X' cross-sectional process drawing showing the manufacture example of the semiconductor device according to the present invention;

FIG. 130 is a $Y_1$-$Y'_1$ cross-sectional process drawing showing the manufacture example of the semiconductor device according to the present invention;

FIG. 131 is a $Y_2$-$Y'_2$ cross-sectional process drawing showing the manufacture example of the semiconductor device according to the present invention;

FIG. 132 is an X-X' cross-sectional process drawing showing the manufacture example of the semiconductor device according to the present invention;

FIG. 133 is a $Y_1$-$Y'_1$ cross-sectional process drawing showing the manufacture example of the semiconductor device according to the present invention;

FIG. 134 is a $Y_2$-$Y'_2$ cross-sectional process drawing showing the manufacture example of the semiconductor device according to the present invention;

FIG. 135 is an X-X' cross-sectional process drawing showing the manufacture example of the semiconductor device according to the present invention;

FIG. 136 is a $Y_1$-$Y'_1$ cross-sectional process drawing showing the manufacture example of the semiconductor device according to the present invention;

FIG. 137 is a $Y_2$-$Y'_2$ cross-sectional process drawing showing the manufacture example of the semiconductor device according to the present invention;

FIG. 138 is an X-X' cross-sectional process drawing showing the manufacture example of the semiconductor device according to the present invention;

FIG. 139 is a $Y_1$-$Y'_1$ cross-sectional process drawing showing the manufacture example of the semiconductor device according to the present invention;

FIG. 140 is a $Y_2$-$Y'_2$ cross-sectional process drawing showing the manufacture example of the semiconductor device according to the present invention;

FIG. 141 is an X-X' cross-sectional process drawing showing the manufacture example of the semiconductor device according to the present invention;

FIG. 142 is a $Y_1$-$Y'_1$ cross-sectional process drawing showing the manufacture example of the semiconductor device according to the present invention;

FIG. 143 is a $Y_2$-$Y'_2$ cross-sectional process drawing showing the manufacture example of the semiconductor device according to the present invention;

FIG. 144 is an X-X' cross-sectional process drawing showing the manufacture example of the semiconductor device according to the present invention;

FIG. 145 is a $Y_1$-$Y'_1$ cross-sectional process drawing showing the manufacture example of the semiconductor device according to the present invention;

FIG. 146 is a $Y_2$-$Y'_2$ cross-sectional process drawing showing the manufacture example of the semiconductor device according to the present invention;

FIG. 147 is an X-X' cross-sectional process drawing showing the manufacture example of the semiconductor device according to the present invention;

FIG. 148 is a $Y_1$-$Y'_1$ cross-sectional process drawing showing the manufacture example of the semiconductor device according to the present invention;

FIG. 149 is a $Y_2$-$Y'_2$ cross-sectional process drawing showing the manufacture example of the semiconductor device according to the present invention;

FIG. 150 is an X-X' cross-sectional process drawing showing the manufacture example of the semiconductor device according to the present invention;

FIG. 151 is a $Y_1$-$Y'_1$ cross-sectional process drawing showing the manufacture example of the semiconductor device according to the present invention;

FIG. 152 is a $Y_2$-$Y'_2$ cross-sectional process drawing showing the manufacture example of the semiconductor device according to the present invention;

FIG. 153 is a layout of the semiconductor device according to the present invention;

FIG. 154 is a cross-sectional view corresponding to an $X_1$-$X'_1$ cross-sectional view in FIG. 153 of the semiconductor device according to the present invention;

FIG. 155 is a cross-sectional view corresponding to an $X_2$-$X'_2$ cross-sectional view in FIG. 153 of the semiconductor device according to the present invention;

FIG. 156 is a cross-sectional view corresponding to an $X_3$-$X'_3$ cross-sectional view in FIG. 153 of the semiconductor device according to the present invention;

FIG. 157 is a cross-sectional view corresponding to a $Y_1$-$Y'_1$ cross-sectional view in FIG. 153 of the semiconductor device according to the present invention; and FIG. 158 is a cross-sectional view corresponding to a $Y_2$-$Y'_2$ cross-sectional view in FIG. 153 of the semiconductor device according to the present invention.

The present invention will now be explained based on an embodiment shown in the drawings. It is to be noted that the present invention is not restricted thereto. In particular, it is assumed that, as an MOS transistor, one formed of a silicon gate is included.

FIGS. 2, 3, 4, and 5 show a layout and cross-sectional structures of a semiconductor device according to the present invention. In this embodiment, an output terminal wiring line 22 of an island-shaped semiconductor lower layer and a drain diffusion layer 23 are formed on a silicon oxide film 08, an island-shaped semiconductor layer 24 is formed thereon, a source diffusion layer 25 is formed on the island-shaped semiconductor layer 24, and a gate 26 is formed in a channel region of sidewalls sandwiched between the drain diffusion layer and the source diffusion layer through a gate insulating film, thereby forming an n-channel semiconductor device (an n-channel MOS transistor). Further, the island-shaped semiconductor lower portion wiring line 22 and drain diffusion layers 27 and 30 are formed on the silicon oxide film 08, island-shaped semiconductor layers 28 and 31 are formed thereon, source diffusion layers 29 and 32 are formed on the island-shaped semiconductor layers 28 and 31, the gate 26 is formed in a channel region of sidewalls sandwiched between each drain diffusion layer and each source diffusion layer through a gate insulating film, thereby forming p-channel semiconductor devices (p-channel MOS transistors). The two p-channel semiconductor devices and the one n-channel semiconductor device form a first inverter.

Furthermore, an output terminal wiring line 09 of an island-shaped semiconductor lower layer and a drain diffusion layer 10 are formed on the silicon oxide film 08, an island-shaped semiconductor layer 11 is formed thereon, a source diffusion layer 12 is formed on the island-shaped semiconductor layer 11, and a gate 13 is formed in a channel region of sidewalls sandwiched between the drain diffusion layer and the source diffusion layer through a gate insulating film, thereby forming an n-channel semiconductor device. Moreover, an island-shaped semiconductor lower portion wiring line 09 and drain diffusion layers 14 and 17 are formed on the silicon oxide film 08, island-shaped semiconductor layers 15 and 18 are formed thereon, source diffusion layers 16 and 19 are formed on the island-shaped semiconductor layers 15 and 18, and the gate 13 is formed in a channel region of sidewalls sandwiched between each drain diffusion layer and each source diffusion layer through a gate insulating film, thereby forming p-channel semiconductor devices. The two p-channel semiconductor devices and the one n-channel semiconductor device form a second inverter.

A first power supply wiring line $V_{SS}$ 20 is formed on the source diffusion layers 12 and 25 of the n-channel semiconductor devices, and a second power supply wiring line $V_{CC}$ 33 is formed on the source diffusion layers 29 and 32 of the p-channel semiconductor devices in the first inverter. A second power supply wiring line $V_{CC}$ wiring line 21 is formed on the source diffusion layers 16 and 19 of the p-channel semiconductor devices in the second inverter.

The gate 13 serves as an input terminal line of the second inverter. A contact 34 is formed to connect the gate 13 with the output terminal wiring line 22 of the lower layer in the first inverter. It is to be noted that the contact 34 is arranged between the silicon oxide film 08 and the first power supply wiring line $V_{SS}$ 20. That is, the contact 34 is arranged so as to vertically overlap at least a part of the first power supply wiring line $V_{SS}$ 20, thereby reducing an area required for wiring and achieving high integration (see FIG. 2).

It is to be noted that each of the first inverter and the second inverter is configured to have the two p-channel MOS transistors in the above-explained example, but each inverter may be configured to have the single p-channel MOS transistor. Additionally, in this case, it is possible to provide a circuit in which n (n is three or above) CMOS inverters each formed of the single p-channel MOS transistor are coupled with each other. Specifically, when the n CMOS inverters are aligned with respect to a substrate, it is preferable to arrange the p-channel MOS transistor of an n−1th CMOS inverter and the p-channel MOS transistor of an nth CMOS inverter so as to be adjacent to each other and arrange the n-channel MOS transistor of the nth CMOS inverter and the n-channel MOS transistor of an n+1th CMOS inverter so as to be adjacent to each other. With such an arrangement, an entire structure of the circuit, the two p-channel MOS transistors and the two n-channel transistors are arranged to be adjacent to each other, the first and second power supply wiring lines can be shortened, and resistances produced from the power supply wiring lines can be reduced.

Further, in the arrangement of the two CMOS inverters shown in FIGS. 2 to 5 and the arrangement of the n CMOS inverters, the p-channel MOS transistors and the n-channel MOS transistors may be counterchanged to constitute the plurality of inverters.

Furthermore, in the above explanation, the n CMOS inverters aligned with respect to the substrate may be arranged in m rows (m is two or above) with respect to the substrate. In this case, it is preferable to mutually connect the power supply wiring lines for the p-channel MOS transistors in each CMOS inverter on the source diffusion layers and mutually connect the power supply wiring lines for the n-channel MOS transistors in each CMOS inverter on the source diffusion layers. With such an arrangement, as the entire structure of the circuit, the p-channel MOS transistors and the n-channel MOS transistors are arranged to be adjacent to each other in a row direction, the first and second power supply wiring lines can be shortened, and resistances produced from the power supply wiring lines can be reduced.

EXAMPLE

Figure 1A:
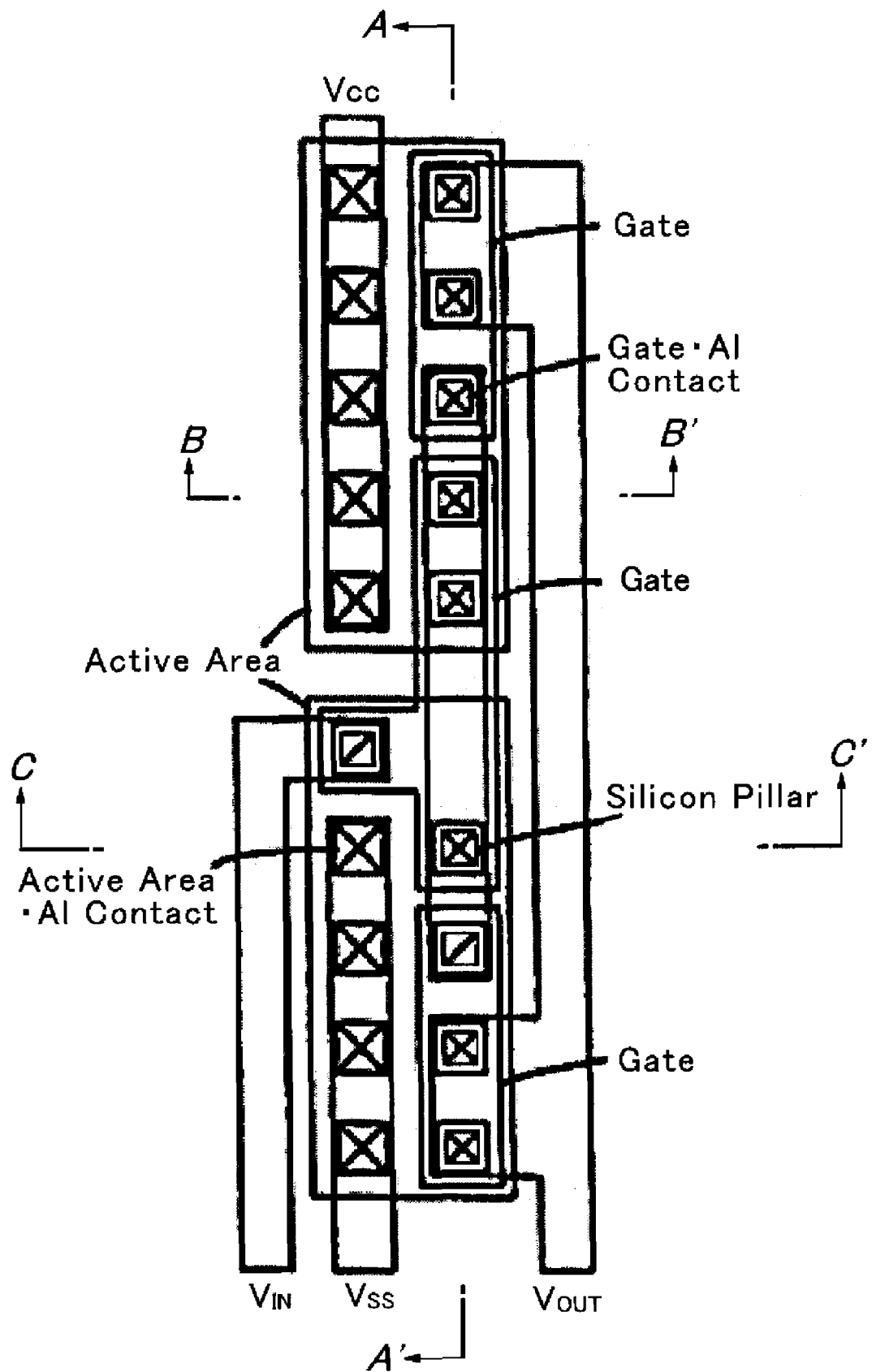
FIG. 1(a) is a view showing a conventional two-stage CMOS inverter using SGTs.
Figure 1B:
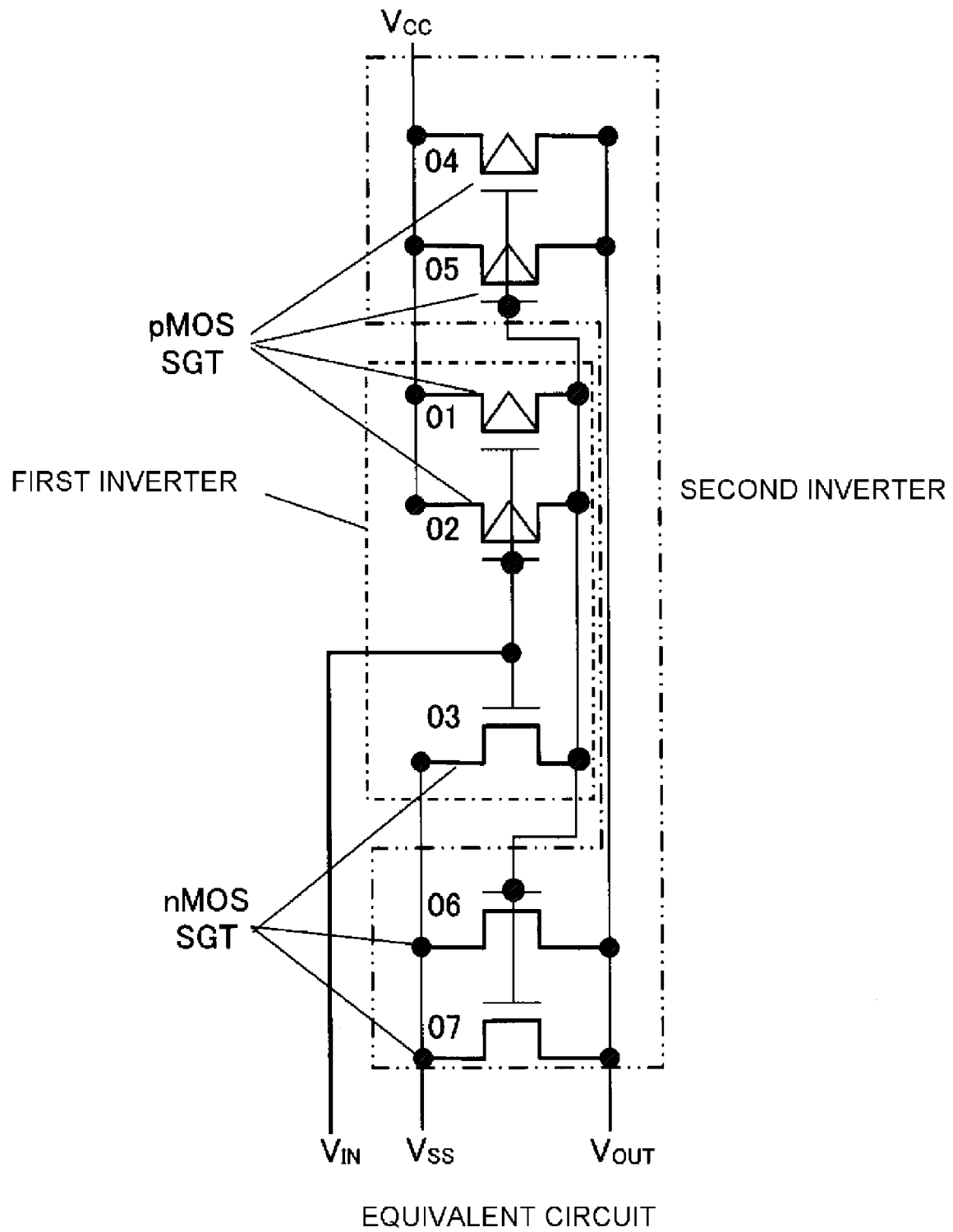
FIG. 1(b) is a view showing an equivalent circuit of the CMOS inverter depicted in FIG. 1(a)
Figure 1C:
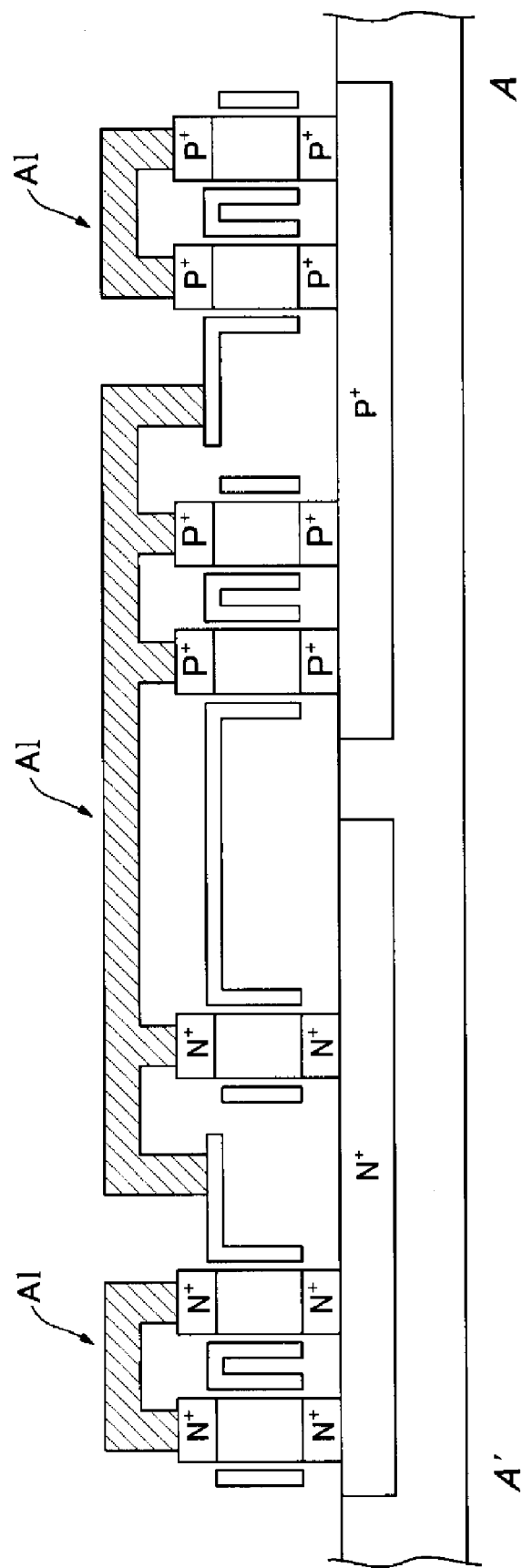
FIG. 1(c) is a view showing an A-A' cross-sectional view of the CMOS inverter depicted in FIG. 1(a)
Figure 1D:
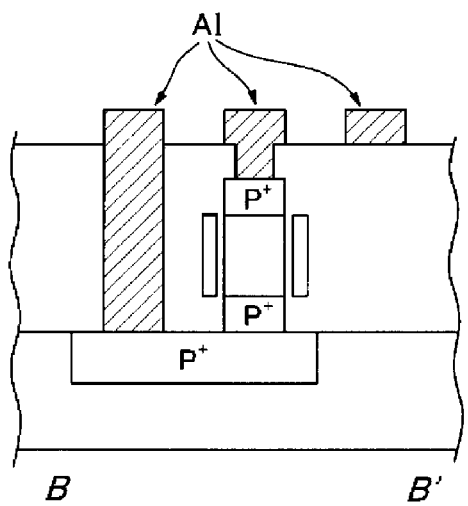
FIG. 1(d) is a view showing a B-B' cross-sectional view of the CMOS inverter depicted in FIG. 1(a)
Figure 1E:
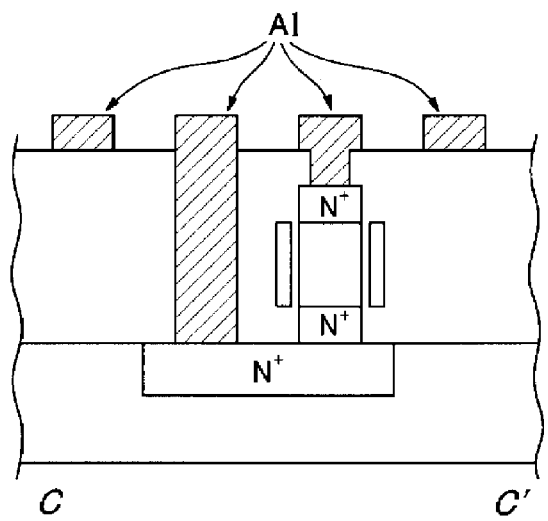
FIG. 1(e) is a view showing a C-C' cross-sectional view of the CMOS inverter depicted in FIG. 1(a)
Figure 2:
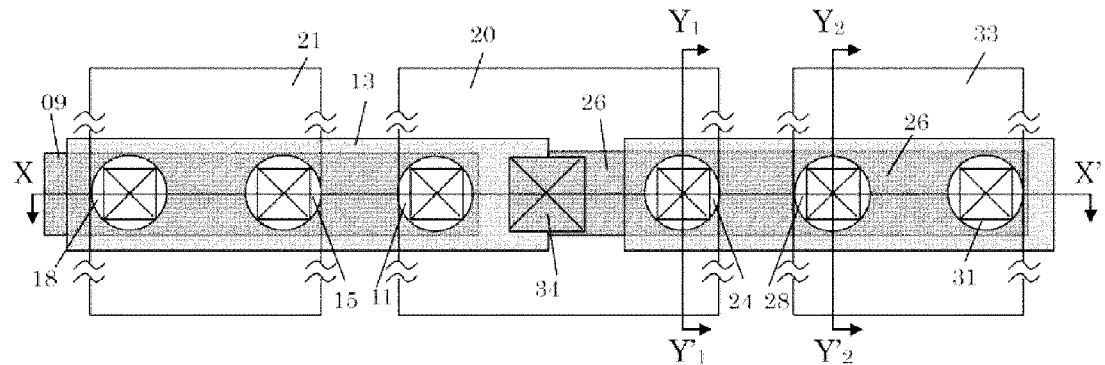
FIG. 2 is a layout of a semiconductor device according to the present invention.
Figure 3:
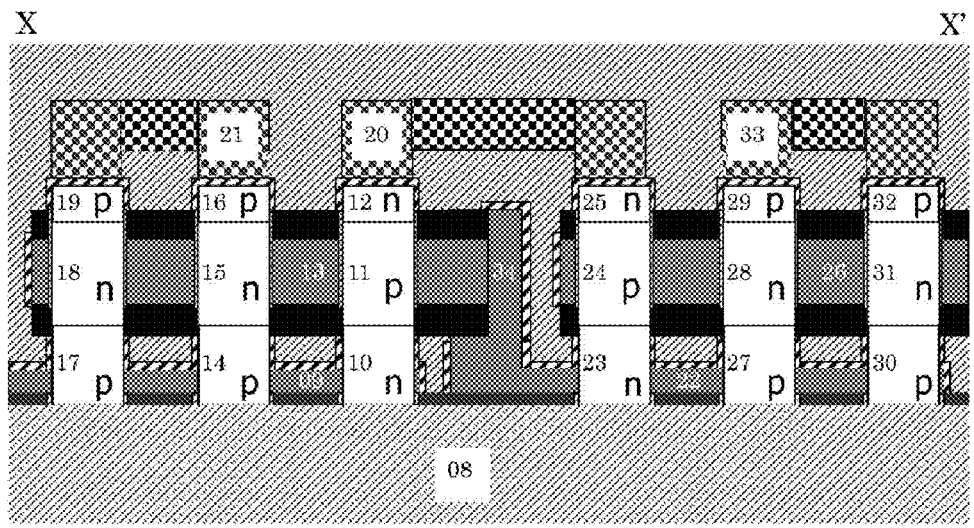
FIG. 3 is a cross-sectional view corresponding to an X-X' cross-sectional view in FIG. 1 of the semiconductor device according to the present invention.
Figure 4:
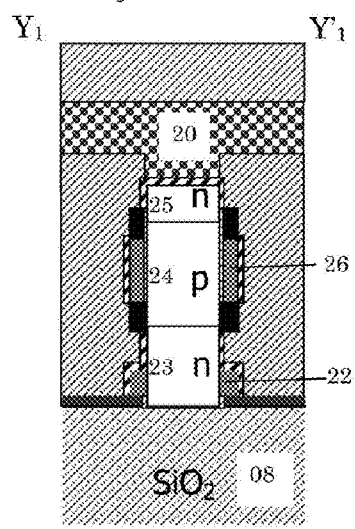
FIG. 4 is a cross-sectional view corresponding to a $Y_1$-$Y'_1$ cross-sectional view in FIG. 1 of the semiconductor device according to the present invention.
Figure 5:
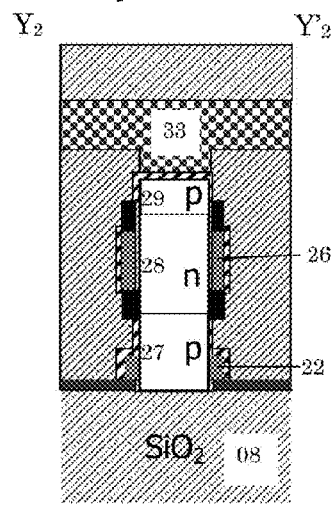
FIG. 5 is a cross-sectional view corresponding to a $Y_2$-$Y'_2$ cross-sectional view in FIG. 1 of the semiconductor device according to the present invention.
Figure 6:
FIG. 6 is an X-X' cross-sectional process drawing showing a manufacture example of the semiconductor device according to the present invention.
Figure 6:
Figure 7:
FIG. 7 is a $Y_1$-$Y'_1$ cross-sectional process drawing of the manufacture example of the semiconductor device according to the present invention.
Figure 7:
Figure 8:
FIG. 8 is a $Y_2$-$Y'_2$ cross-sectional process drawing showing the manufacture example of the semiconductor device according to the present invention.
Figure 8:

An example of a manufacturing process for forming a structure of the semiconductor device according to the present invention will now be explained with reference to FIGS. 6 to 152. FIG. 6 is an X-X' cross-sectional view of an SOI substrate in which silicon 100 is formed on a silicon oxide film, the silicon 100 is oxidized, and an oxide film 101 is formed. Furthermore, FIG. 7 is a $Y_1$-$Y'_1$ cross-sectional view, and FIG. 8 is a $Y_2$-$Y'_2$ cross-sectional view. The X-X' cross section corresponds to FIG. 3, the $Y_1$-$Y'_1$ cross section corresponds to FIG. 4, and the $Y_2$-$Y'_2$ cross section corresponds to FIG. 5.

Figure 9:
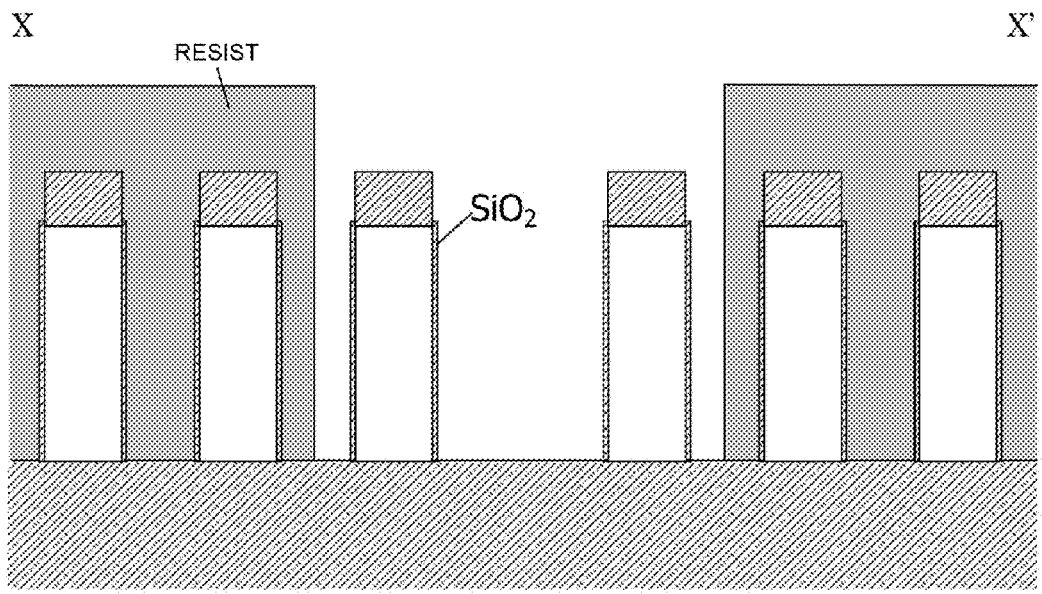
FIG. 9 is an X-X' cross-sectional process drawing showing the manufacture example of the semiconductor device according to the present invention.
Figure 10:
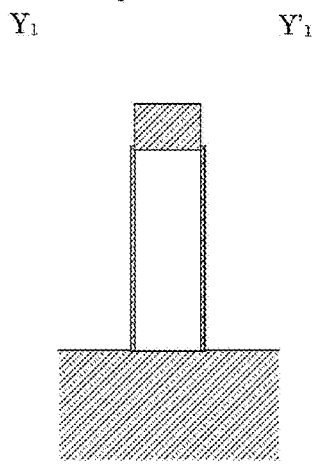
FIG. 10 is a $Y_1$-$Y'_1$ cross-sectional process drawing showing the manufacture example of the semiconductor device according to the present invention.
Figure 11:
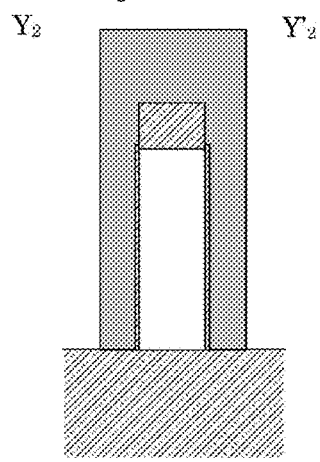
FIG. 11 is a $Y_2$-$Y'_2$ cross-sectional process drawing showing the manufacture example of the semiconductor device according to the present invention.
Figure 12:
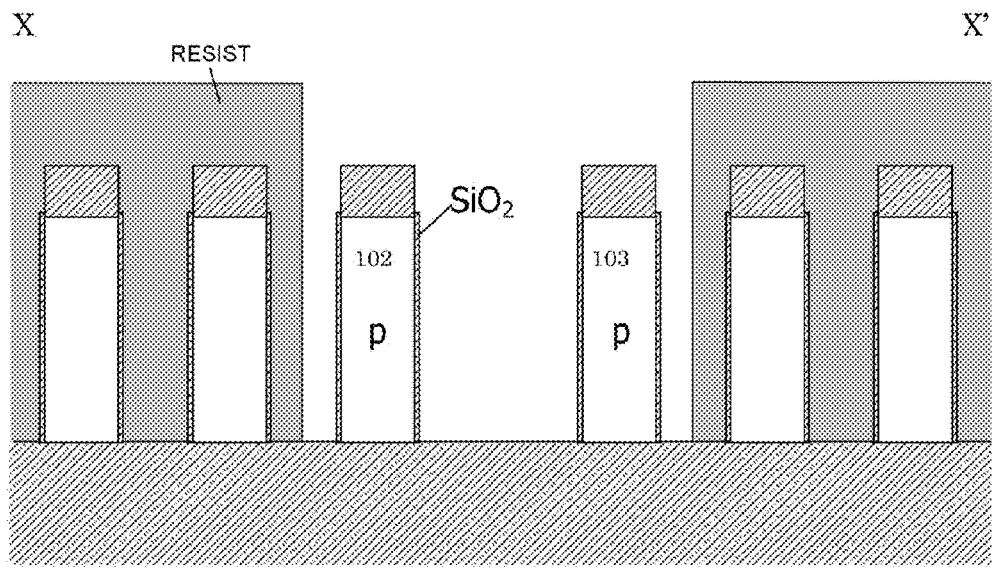
FIG. 12 is an X-X' cross-sectional process drawing showing the manufacture example of the semiconductor device according to the present invention.
Figure 13:
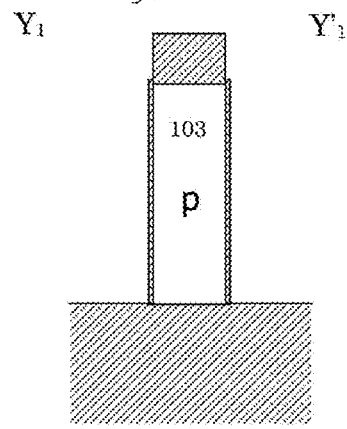
FIG. 13 is a $Y_1$-$Y'_1$ cross-sectional process drawing showing the manufacture example of the semiconductor device according to the present invention.
Figure 14:
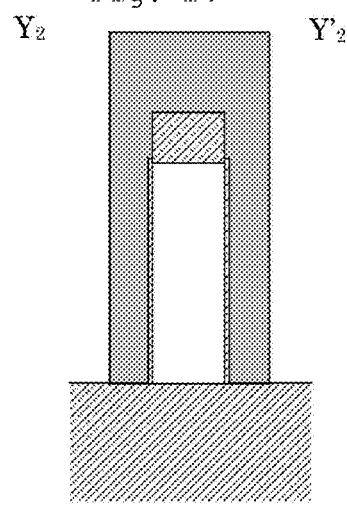
FIG. 14 is a $Y_2$-$Y'_2$ cross-sectional process drawing showing the manufacture example of the semiconductor device according to the present invention.

Resists are used as masks, and the silicon 100 is etched based on reactive ion etching to form silicon pillars. Then, oxidation is carried out to form resists that are used to form p-type silicon (FIG. 9 (X-X'), FIG. 10 ($Y_1$-$Y'_1$), FIG. 11 ($Y_2$-$Y'_2$)). Boron is implanted based on, e.g., an ion implantation method to form p-type silicon 102 and 103 (FIG. 12 (X-X'), FIG. 13 ($Y_1$-$Y'_1$), FIG. 14 ($Y_2$-$Y'_2$)).

Figure 15:
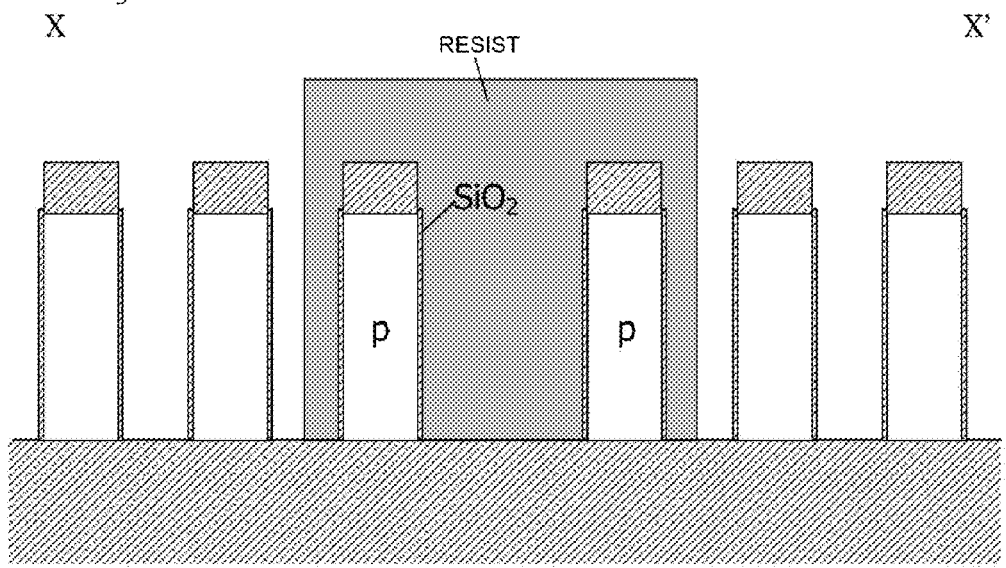
FIG. 15 is an X-X' cross-sectional process drawing showing the manufacture example of the semiconductor device according to the present invention.
Figure 16:
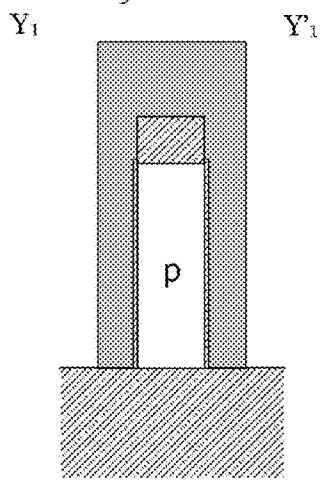
FIG. 16 is a $Y_1$-$Y'_1$ cross-sectional process drawing showing the manufacture example of the semiconductor device according to the present invention.
Figure 17:
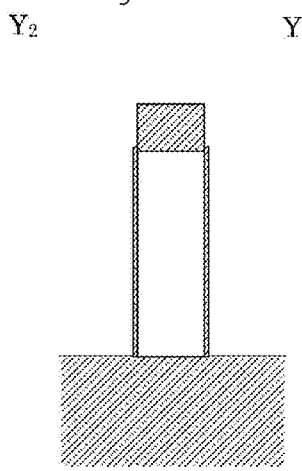
FIG. 17 is a $Y_2$-$Y'_2$ cross-sectional process drawing showing the manufacture example of the semiconductor device according to the present invention.

The resist is separated to form resists that are used to form n-type silicon (FIG. 15 (X-X'), FIG. 16 ($Y_1$-$Y'_1$), FIG. 17 ($Y_2$-$Y'_2$)).

Figure 18:
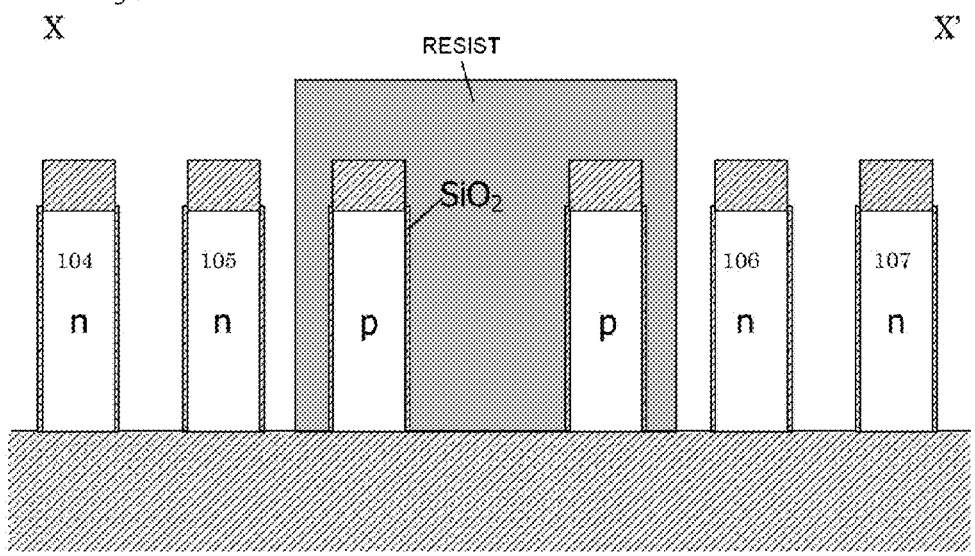
FIG. 18 is an X-X' cross-sectional process drawing showing the manufacture example of the semiconductor device according to the present invention.
Figure 19:
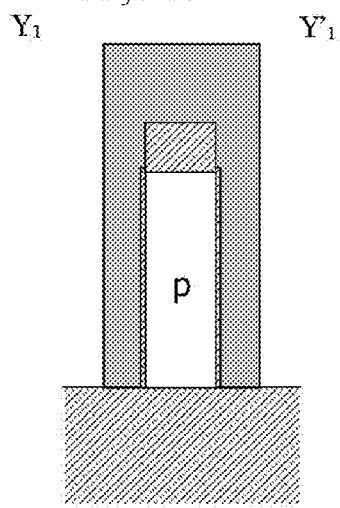
FIG. 19 is a $Y_1$-$Y'_1$ cross-sectional process drawing showing the manufacture example of the semiconductor device according to the present invention.
Figure 20:
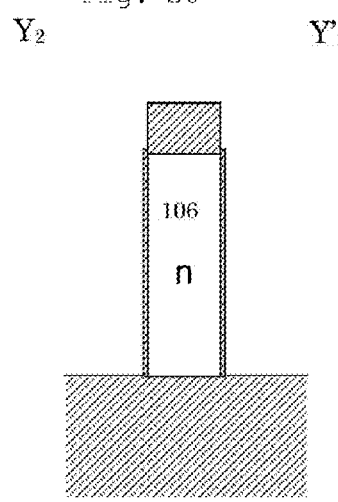
FIG. 20 is a $Y_2$-$Y'_2$ cross-sectional process drawing showing the manufacture example of the semiconductor device according to the present invention.

Phosphor is implanted based on, e.g., the ion implantation method to form n-type silicon 104, 105, 106, and 107 (FIG. 18 (X-X'), FIG. 19 ($Y_1$-$Y'_1$), FIG. 20 ($Y_2$-$Y'_2$)).

Figure 21:
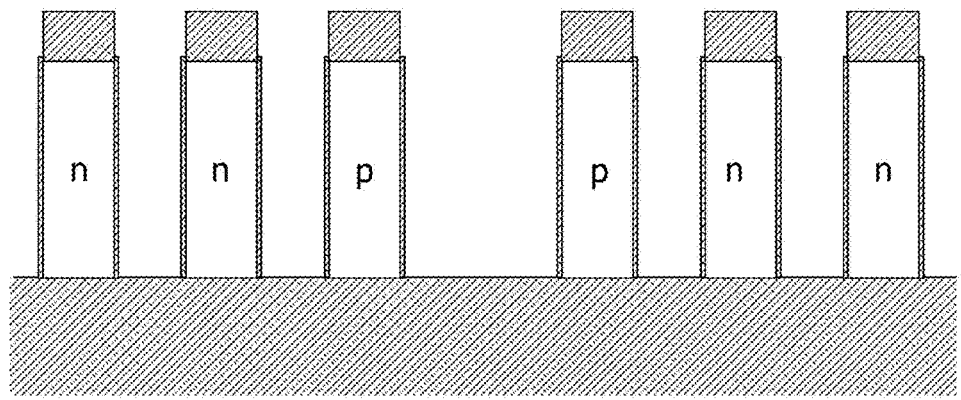
FIG. 21 is an X-X' cross-sectional process drawing showing the manufacture example of the semiconductor device according to the present invention.
Figure 22:
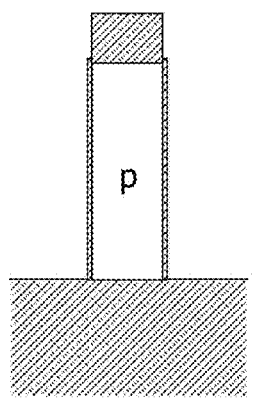
FIG. 22 is a $Y_1$-$Y'_1$ cross-sectional process drawing showing the manufacture example of the semiconductor device according to the present invention.
Figure 23:
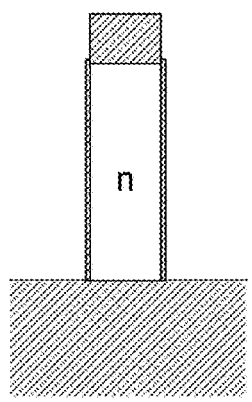
FIG. 23 is a $Y_2$-$Y'_2$ cross-sectional process drawing showing the manufacture example of the semiconductor device according to the present invention.

The resists are delaminated, and a thermal process is carried out to ionize an impurity (FIG. 21 (X-X'), FIG. 22 ($Y_1$-$Y'_1$), FIG. 23 ($Y_2$-$Y'_2$)).

Figure 24:
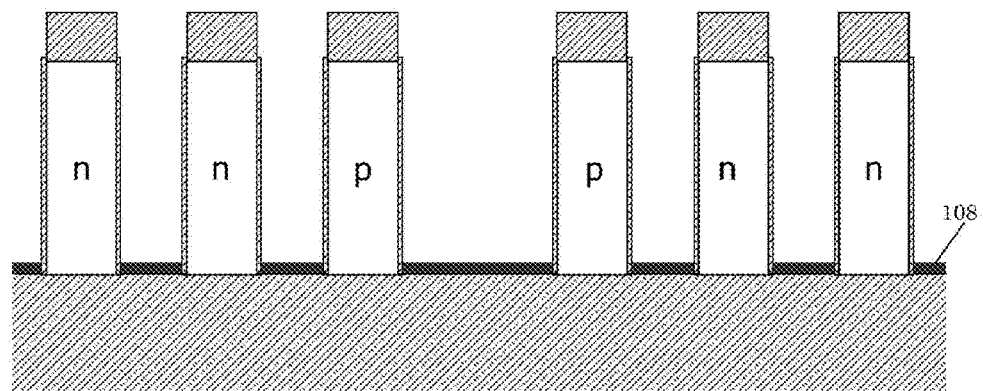
FIG. 24 is an X-X' cross-sectional process drawing showing the manufacture example of the semiconductor device according to the present invention.
Figure 25:
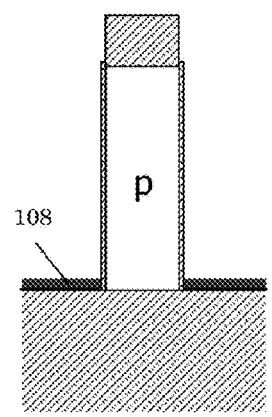
FIG. 25 is a $Y_1$-$Y'_1$ cross-sectional process drawing showing the manufacture example of the semiconductor device according to the present invention.
Figure 26:
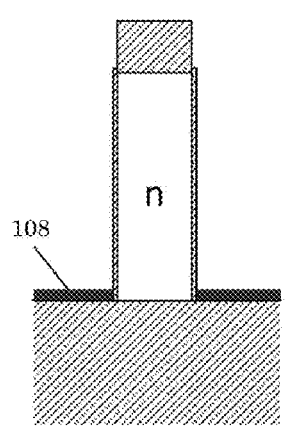
FIG. 26 is a $Y_2$-$Y'_2$ cross-sectional process drawing showing the manufacture example of the semiconductor device according to the present invention.

A nitride film 108 is deposited, flattened based on CMP, and then etched back (FIG. 24 (X-X'), FIG. 25 ($Y_1$-$Y'_1$), FIG. 26 ($Y_2$-$Y'_2$)).

Figure 27:
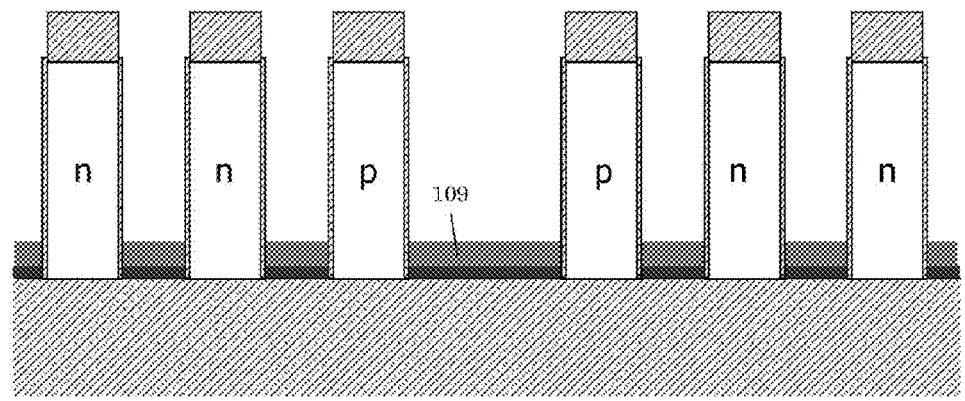
FIG. 27 is an X-X' cross-sectional process drawing showing the manufacture example of the semiconductor device according to the present invention.
Figure 28:
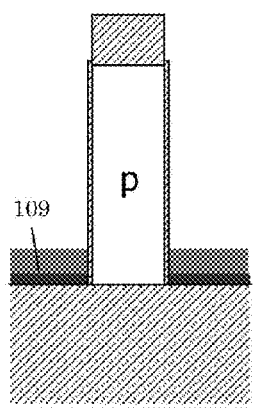
FIG. 28 is a $Y_1$-$Y'_1$ cross-sectional process drawing showing the manufacture example of the semiconductor device according to the present invention.
Figure 29:
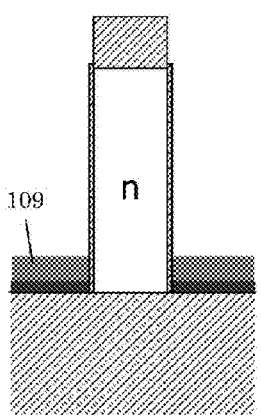
FIG. 29 is a $Y_2$-$Y'_2$ cross-sectional process drawing showing the manufacture example of the semiconductor device according to the present invention.

Polysilicon 109 is deposited, flattened based on CMP, and then etched back (FIG. 27 (X-X'), FIG. 28 ($Y_1$-$Y'_1$), FIG. 29 ($Y_2$-$Y'_2$)).

Figure 30:
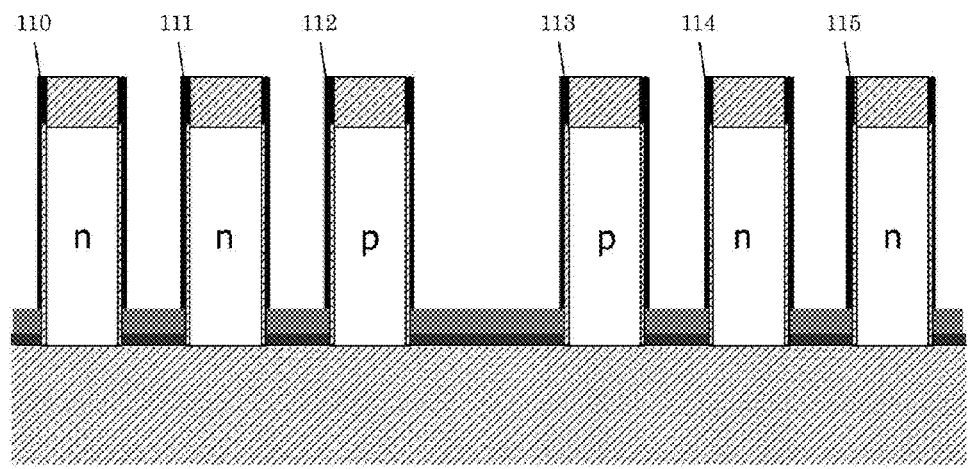
FIG. 30 is an X-X' cross-sectional process drawing showing the manufacture example of the semiconductor device according to the present invention.
Figure 31:
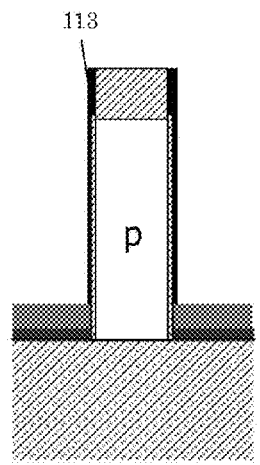
FIG. 31 is a $Y_1$-$Y'_1$ cross-sectional process drawing showing the manufacture example of the semiconductor device according to the present invention.
Figure 32:
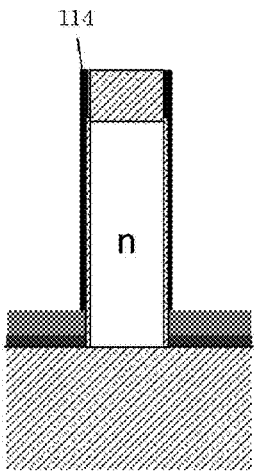
FIG. 32 is a $Y_2$-$Y'_2$ cross-sectional process drawing showing the manufacture example of the semiconductor device according to the present invention.

A nitride film is deposited to remain in the form of a sidewall spacer on island-shaped semiconductor sidewalls 110, 111, 112, 113, 114, and 115 (FIG. 30 (X-X'), FIG. 31 ($Y_1$-$Y'_1$), FIG. 32 ($Y_2$-$Y'_2$)).

Figure 33:
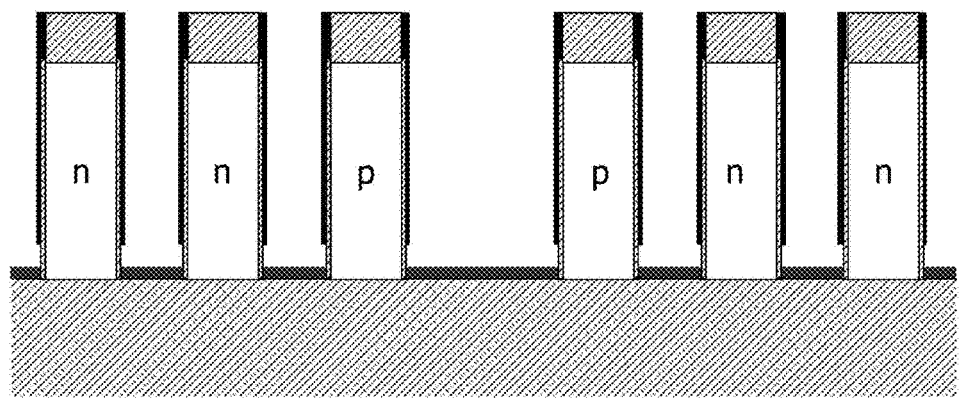
FIG. 33 is an X-X' cross-sectional process drawing showing the manufacture example of the semiconductor device according to the present invention.
Figure 34:
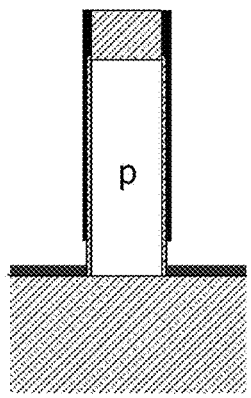
FIG. 34 is a $Y_1$-$Y'_1$ cross-sectional process drawing showing the manufacture example of the semiconductor device according to the present invention.
Figure 35:
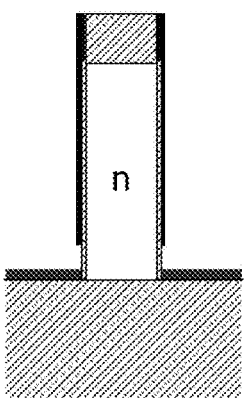
FIG. 35 is a $Y_2$-$Y'_2$ cross-sectional process drawing showing the manufacture example of the semiconductor device according to the present invention.

The polysilicon is etched (FIG. 33 (X-X'), FIG. 34 ($Y_1$-$Y'_1$), FIG. 35 ($Y_2$-$Y'_2$)).

Figure 36:
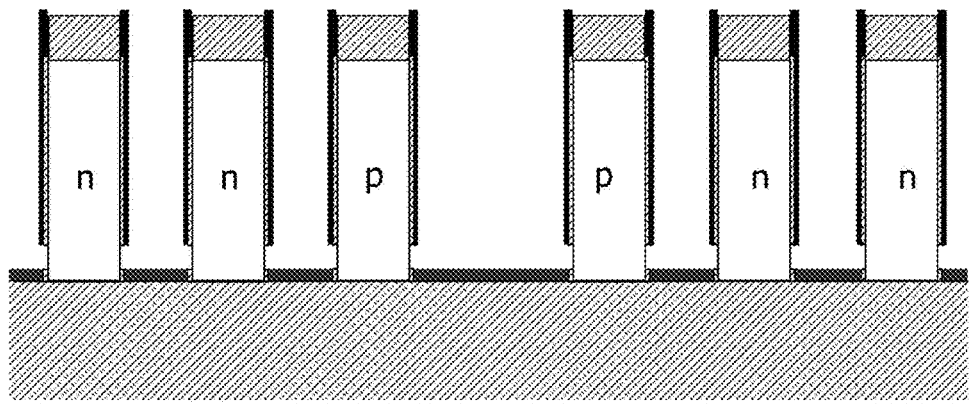
FIG. 36 is an X-X' cross-sectional process drawing showing the manufacture example of the semiconductor device according to the present invention.
Figure 37:
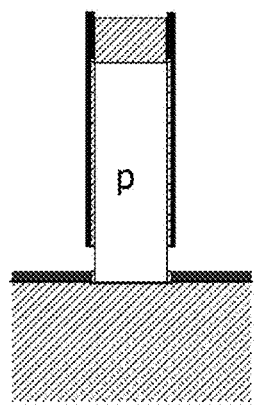
FIG. 37 is a $Y_1$-$Y'_1$ cross-sectional process drawing showing the manufacture example of the semiconductor device according to the present invention.
Figure 38:
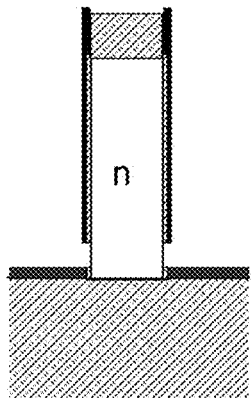
FIG. 38 is a $Y_2$-$Y'_2$ cross-sectional process drawing showing the manufacture example of the semiconductor device according to the present invention.

An oxide film is etched (FIG. 36 (X-X'), FIG. 37 ($Y_1$-$Y'_1$), FIG. 38 ($Y_2$-$Y'_2$)).

Figure 39:
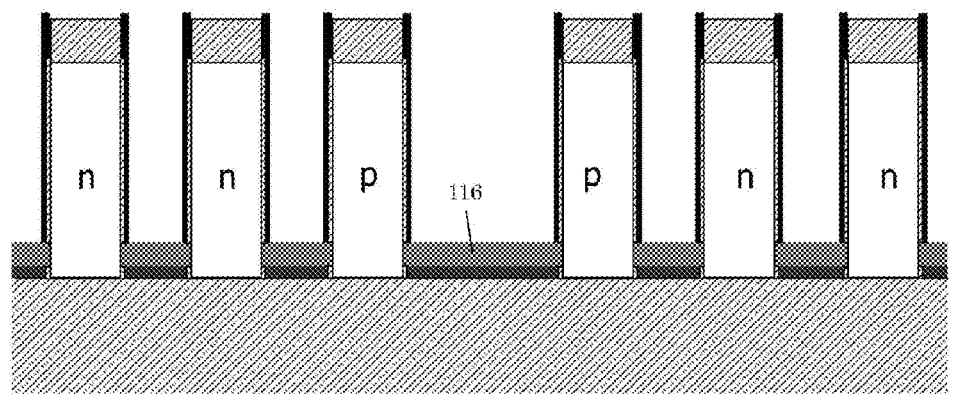
FIG. 39 is an X-X' cross-sectional process drawing showing the manufacture example of the semiconductor device according to the present invention.
Figure 40:
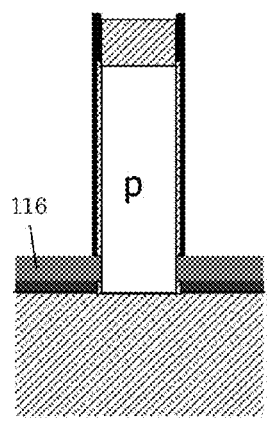
FIG. 40 is a $Y_1$-$Y'_1$ cross-sectional process drawing showing the manufacture example of the semiconductor device according to the present invention.
Figure 41:
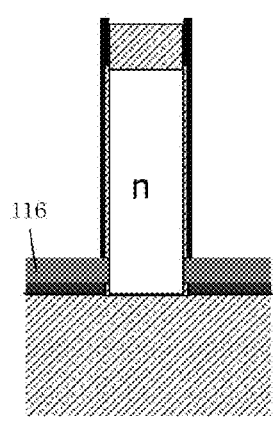
FIG. 41 is a $Y_2$-$Y'_2$ cross-sectional process drawing showing the manufacture example of the semiconductor device according to the present invention.

Polysilicon 116 is deposited, flattened based on CMP, and then etched back (FIG. 39 (X-X'), FIG. 40 ($Y_1$-$Y'_1$), FIG. 41 ($Y_2$-$Y'_2$)).

Figure 42:
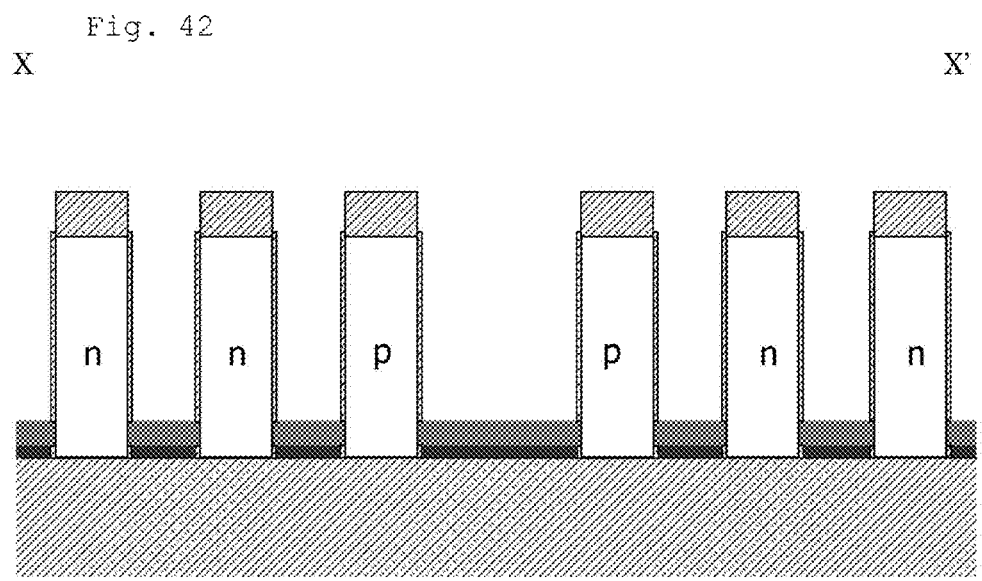
FIG. 42 is an X-X' cross-sectional process drawing showing the manufacture example of the semiconductor device according to the present invention.
Figure 43:
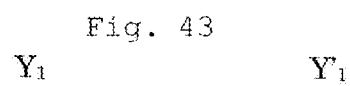
FIG. 43 is a $Y_1$-$Y'_1$ cross-sectional process drawing showing the manufacture example of the semiconductor device according to the present invention.
Figure 43:
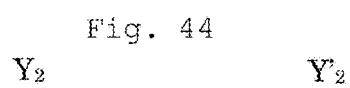
Figure 44:
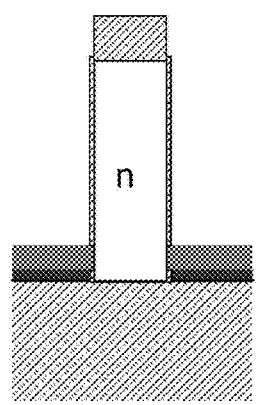
FIG. 44 is a $Y_2$-$Y'_2$ cross-sectional process drawing showing the manufacture example of the semiconductor device according to the present invention.

The nitride film is etched (FIG. 42 (X-X'), FIG. 43 ($Y_1$-$Y'_1$), FIG. 44 ($Y_2$-$Y'_2$)).

Figure 45:
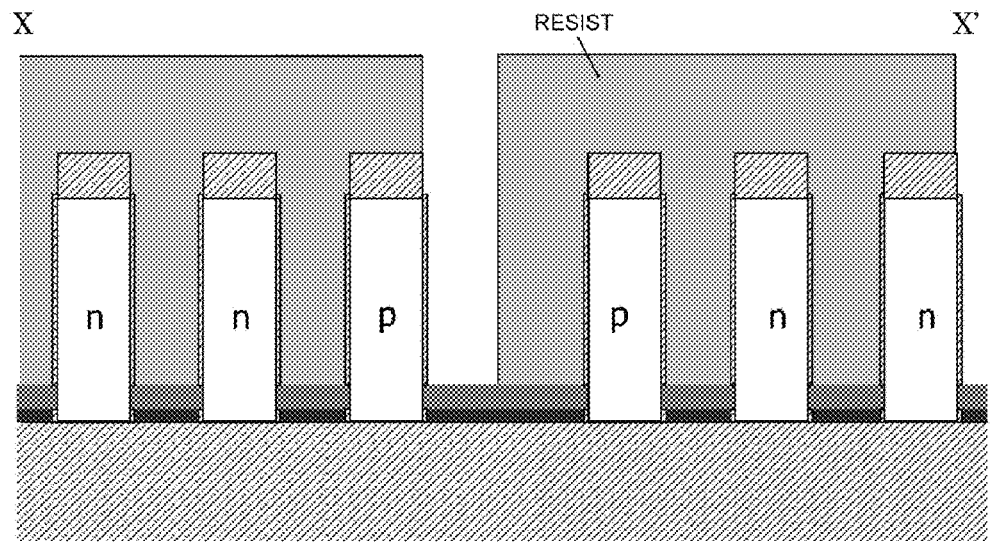
FIG. 45 is an X-X' cross-sectional process drawing showing the manufacture example of the semiconductor device according to the present invention.
Figure 46:
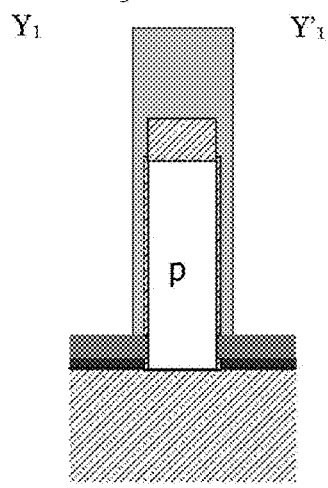
FIG. 46 is a $Y_1$-$Y'_1$ cross-sectional process drawing showing the manufacture example of the semiconductor device according to the present invention.
Figure 47:
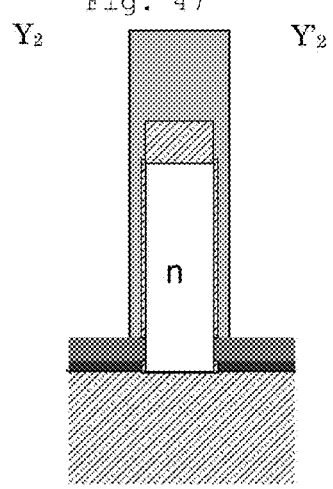
FIG. 47 is a $Y_2$-$Y'_2$ cross-sectional process drawing showing the manufacture example of the semiconductor device according to the present invention.

Resists that are used to form output terminal wiring lines of an island-shaped semiconductor lower layer is formed (FIG. 45 (X-X'), FIG. 46 ($Y_1$-$Y'_1$), FIG. 47 ($Y_2$-$Y'_2$)).

Figure 48:
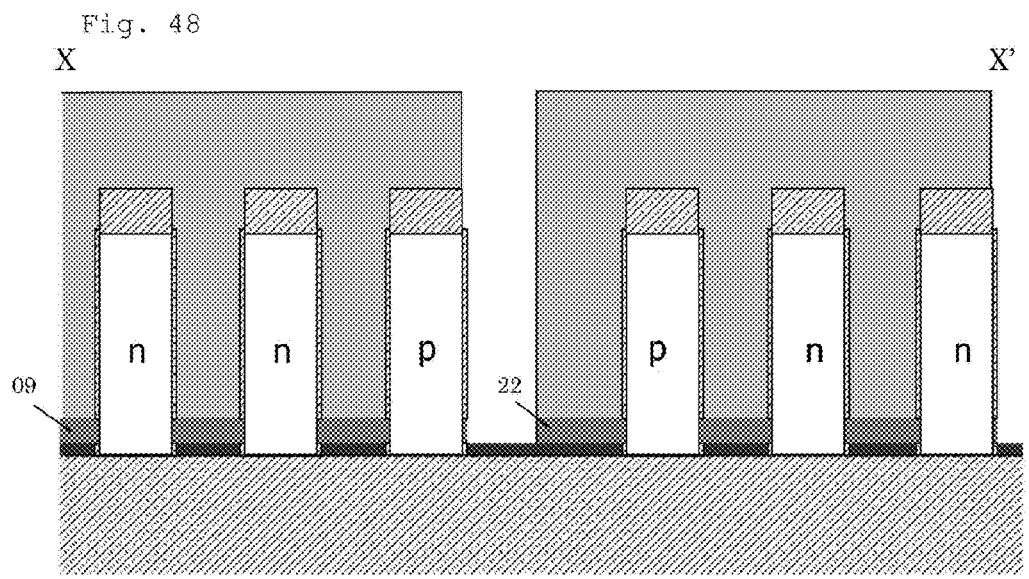
FIG. 48 is an X-X' cross-sectional process drawing showing the manufacture example of the semiconductor device according to the present invention.
Figure 49:
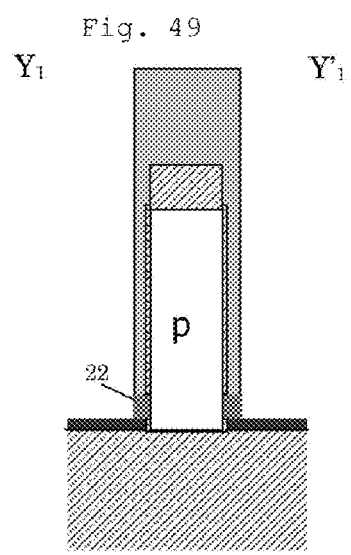
FIG. 49 is a $Y_1$-$Y'_1$ cross-sectional process drawing showing the manufacture example of the semiconductor device according to the present invention.
Figure 50:
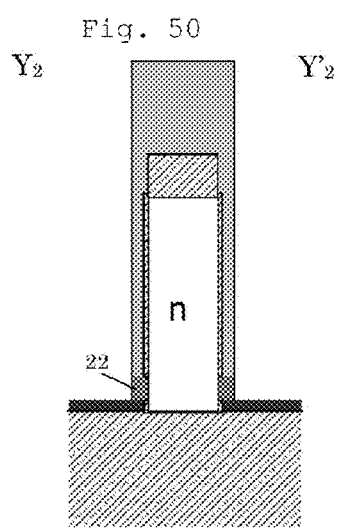
FIG. 50 is a $Y_2$-$Y'_2$ cross-sectional process drawing showing the manufacture example of the semiconductor device according to the present invention.

The polysilicon is etched to form output terminal wiring lines 09 and 22 of the island-shaped semiconductor lower layer (FIG. 48 (X-X'), FIG. 49 ($Y_1$-$Y'_1$), FIG. 50 ($Y_2$-$Y'_2$)).

Figure 51:
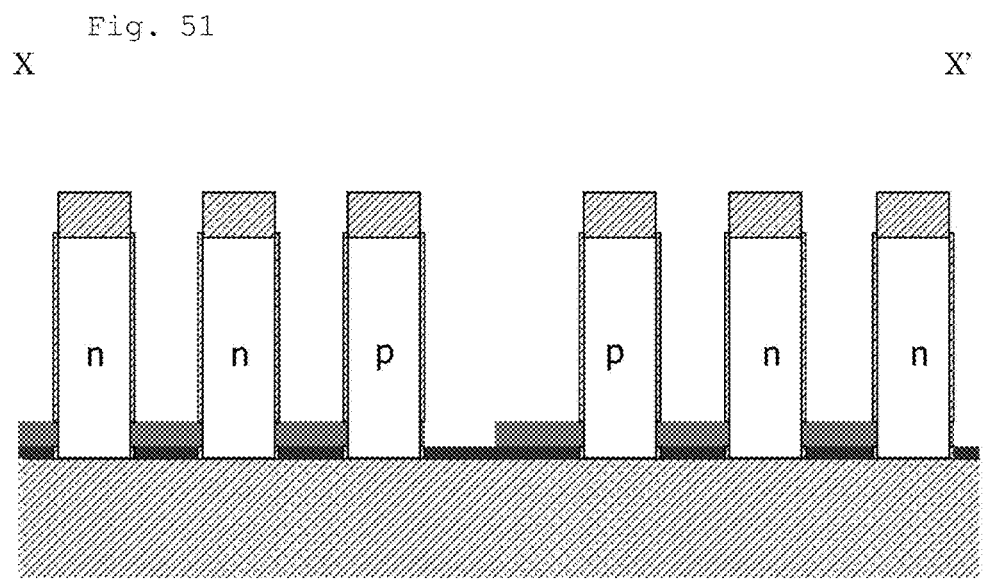
FIG. 51 is an X-X' cross-sectional process drawing showing the manufacture example of the semiconductor device according to the present invention.
Figure 52:
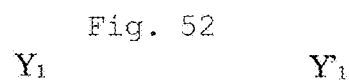
FIG. 52 is a $Y_1$-$Y'_1$ cross-sectional process drawing showing the manufacture example of the semiconductor device according to the present invention.
Figure 52:
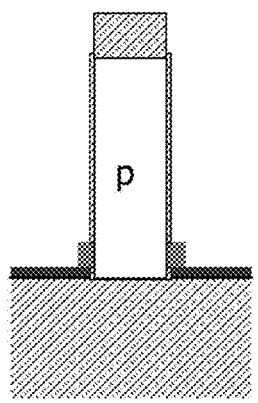
Figure 53:
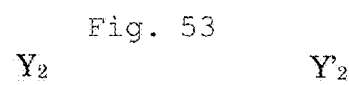
FIG. 53 is a $Y_2$-$Y'_2$ cross-sectional process drawing showing the manufacture example of the semiconductor device according to the present invention.
Figure 53:
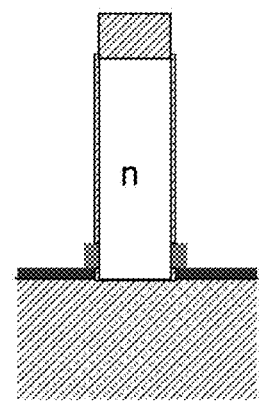

The resists are delaminated (FIG. 51 (X-X'), FIG. 52 ($Y_1$-$Y'_1$), FIG. 53 ($Y_2$-$Y'_2$)).

Figure 54:
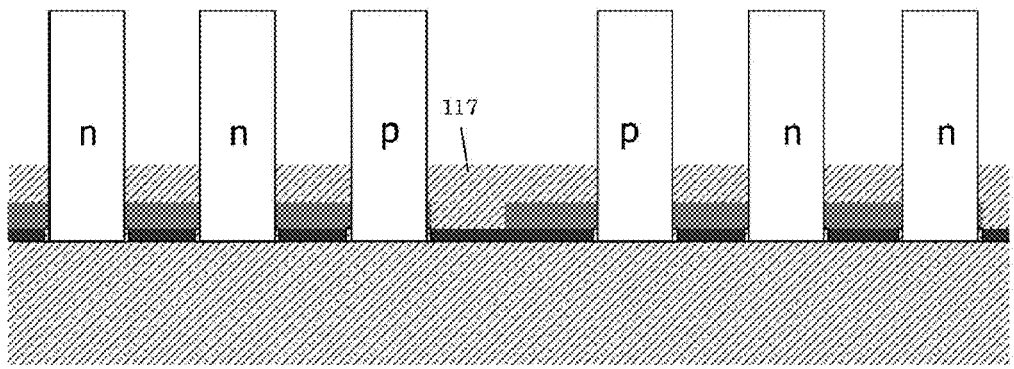
FIG. 54 is an X-X' cross-sectional process drawing showing the manufacture example of the semiconductor device according to the present invention.
Figure 55:
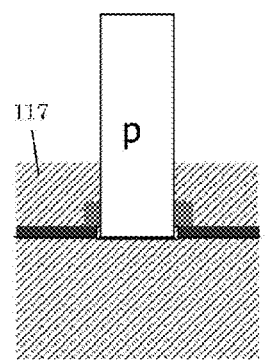
FIG. 55 is a $Y_1$-$Y'_1$ cross-sectional process drawing showing the manufacture example of the semiconductor device according to the present invention.
Figure 56:
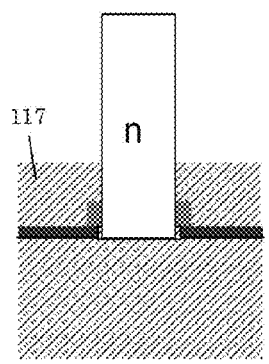
FIG. 56 is a $Y_2$-$Y'_2$ cross-sectional process drawing showing the manufacture example of the semiconductor device according to the present invention.

An oxide film 117 is deposited, flattened based on CMP, and then etched back (FIG. 54 (X-X'), FIG. 55 ($Y_1$-$Y'_1$), FIG. 56 ($Y_2$-$Y'_2$)).

Figure 57:
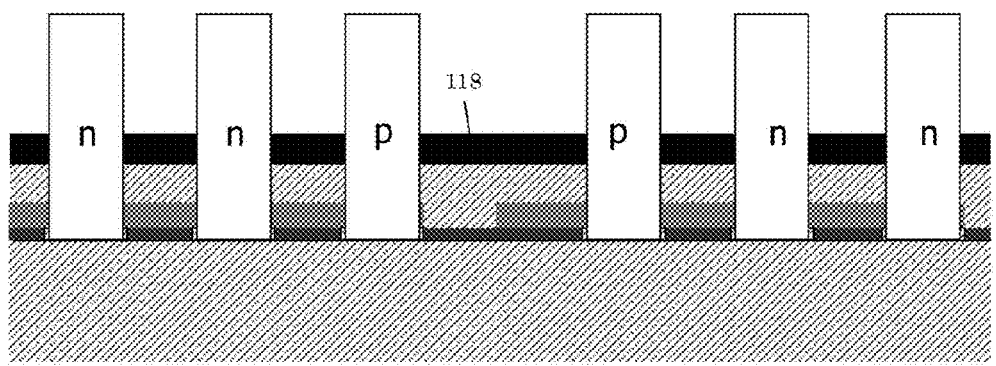
FIG. 57 is an X-X' cross-sectional process drawing showing the manufacture example of the semiconductor device according to the present invention.
Figure 58:
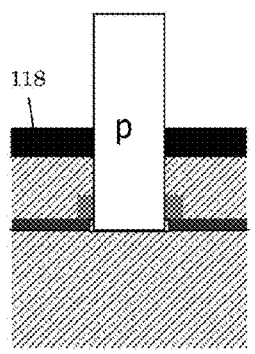
FIG. 58 is a $Y_1$-$Y'_1$ cross-sectional process drawing showing the manufacture example of the semiconductor device according to the present invention.
Figure 59:
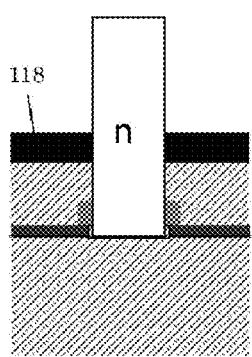
FIG. 59 is a $Y_2$-$Y'_2$ cross-sectional process drawing showing the manufacture example of the semiconductor device according to the present invention.

A nitride film 118 is deposited, flattened based on CMP, and then etched back (FIG. 57 (X-X'), FIG. 58 ($Y_1$-$Y'_1$), FIG. 59 ($Y_2$-$Y'_2$)).

Figure 60:
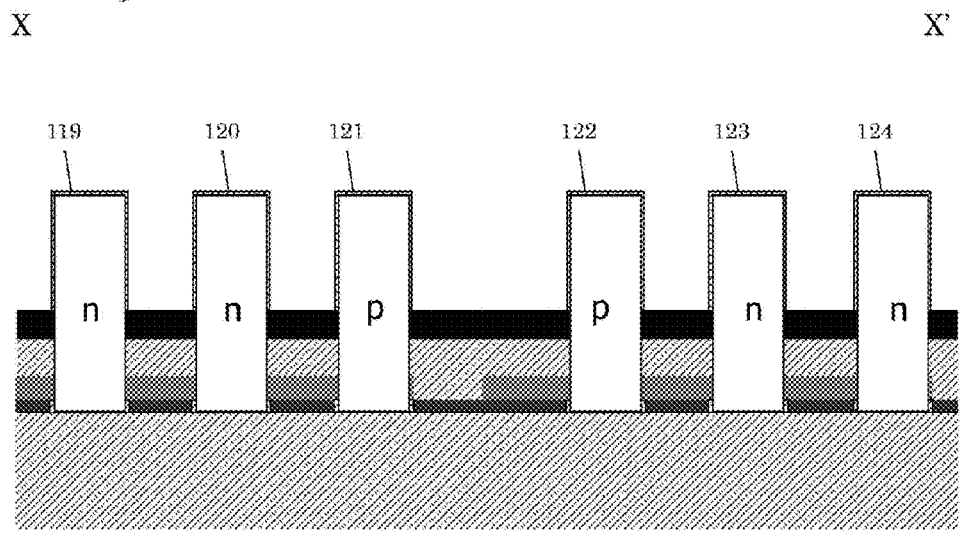
FIG. 60 is an X-X' cross-sectional process drawing showing the manufacture example of the semiconductor device according to the present invention.
Figure 61:
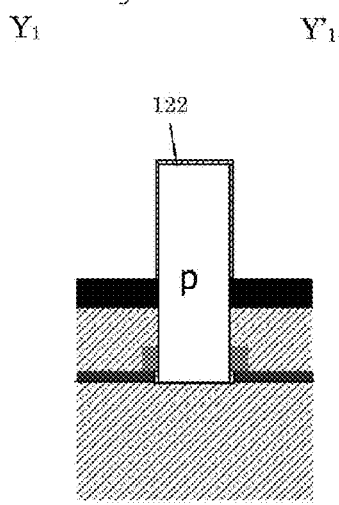
FIG. 61 is a $Y_1$-$Y'_1$ cross-sectional process drawing showing the manufacture example of the semiconductor device according to the present invention.
Figure 62:
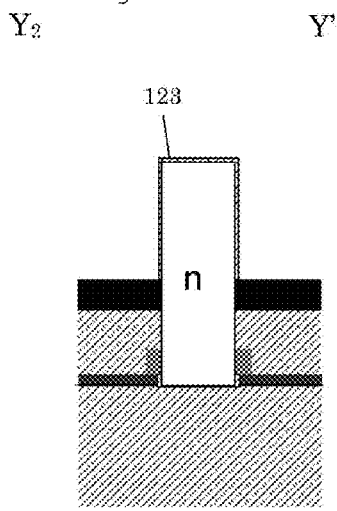
FIG. 62 is a $Y_2$-$Y'_2$ cross-sectional process drawing showing the manufacture example of the semiconductor device according to the present invention.

Oxidation is carried out to form gate insulating films 119, 120, 121, 122, 123, and 124 (FIG. 60 (X-X'), FIG. 61 ($Y_1$-$Y'_1$), FIG. 62 ($Y_2$-$Y'_2$)).

Figure 63:
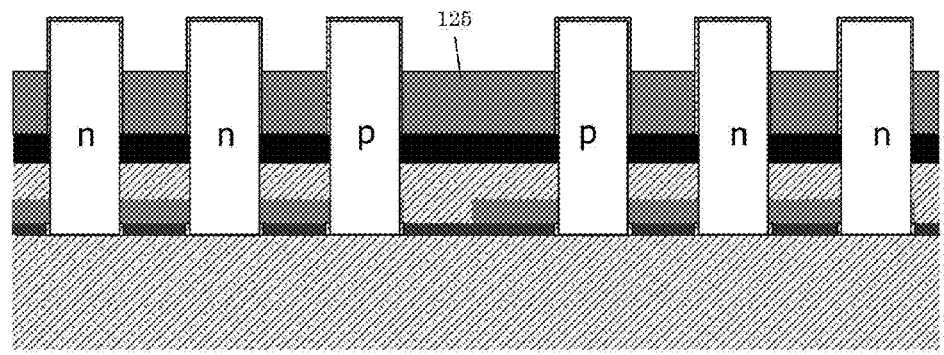
FIG. 63 is an X-X' cross-sectional process drawing showing the manufacture example of the semiconductor device according to the present invention.
Figure 64:
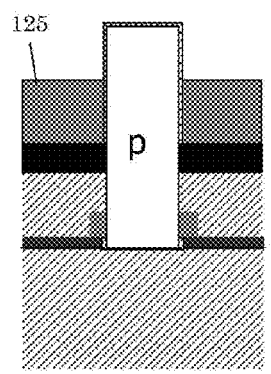
FIG. 64 is a $Y_1$-$Y'_1$ cross-sectional process drawing showing the manufacture example of the semiconductor device according to the present invention.
Figure 65:
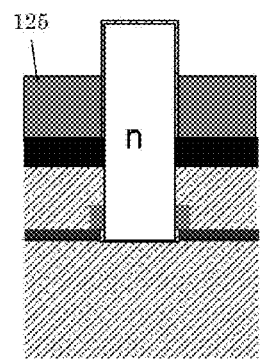
FIG. 65 is a $Y_2$-$Y'_2$ cross-sectional process drawing showing the manufacture example of the semiconductor device according to the present invention.

Polysilicon 125 is deposited, flattened based on CMP, and then etched back (FIG. 63 (X-X'), FIG. 64 ($Y_1$-$Y'_1$), FIG. 65 ($Y_2$-$Y'_2$)).

Figure 66:
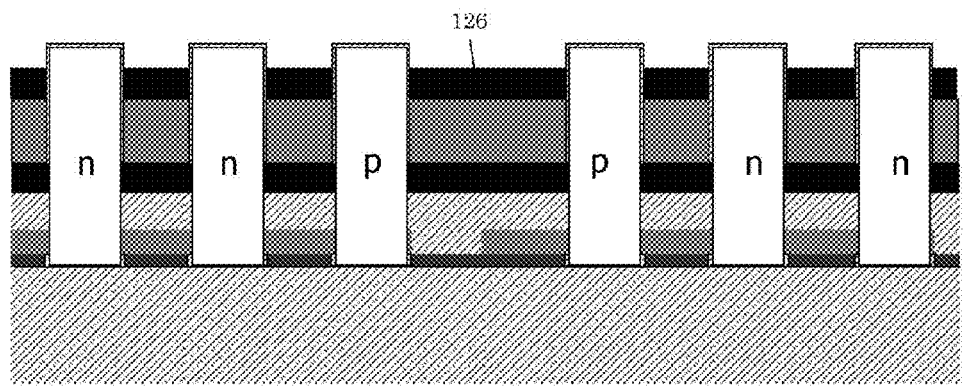
FIG. 66 is an X-X' cross-sectional process drawing showing the manufacture example of the semiconductor device according to the present invention.
Figure 67:
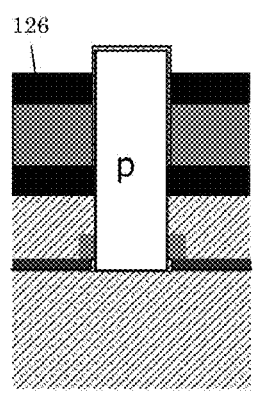
FIG. 67 is a $Y_1$-$Y'_1$ cross-sectional process drawing showing the manufacture example of the semiconductor device according to the present invention.
Figure 68:
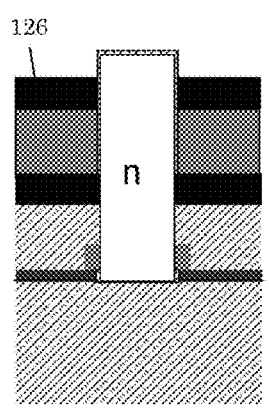
FIG. 68 is a $Y_2$-$Y'_2$ cross-sectional process drawing showing the manufacture example of the semiconductor device according to the present invention.

A nitride film 126 is deposited, flattened based on CMP, and then etched back (FIG. 66 (X-X'), FIG. 67 ($Y_1$-$Y'_1$), FIG. 68 ($Y_2$-$Y'_2$)).

Figure 69:
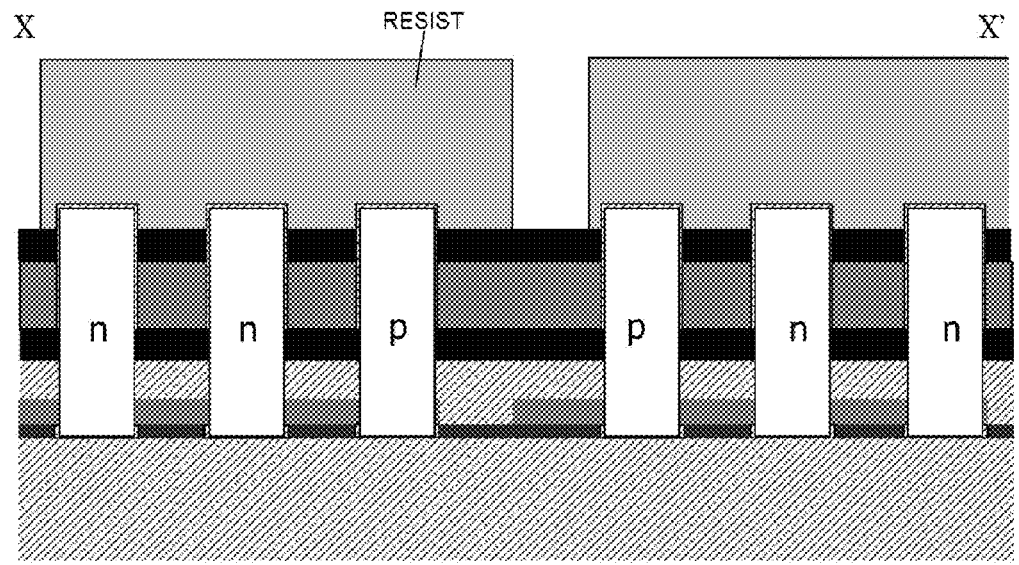
FIG. 69 is an X-X' cross-sectional process drawing showing the manufacture example of the semiconductor device according to the present invention.
Figure 70:
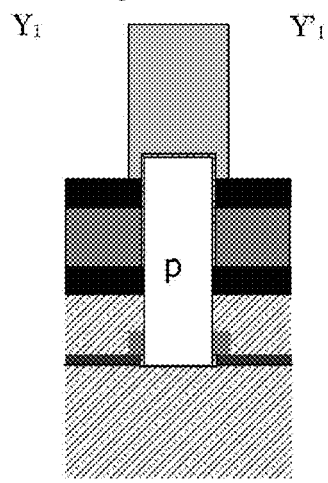
FIG. 70 is a $Y_1$-$Y'_1$ cross-sectional process drawing showing the manufacture example of the semiconductor device according to the present invention.
Figure 71:
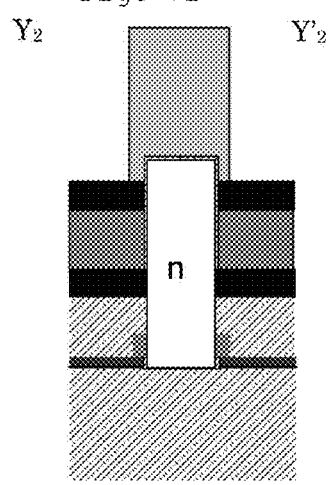
FIG. 71 is a $Y_2$-$Y'_2$ cross-sectional process drawing showing the manufacture example of the semiconductor device according to the present invention.

Resists required to form input terminal lines, i.e., gates 13 and 26 are formed (FIG. 69 (X-X'), FIG. 70 ($Y_1$-$Y'_1$), FIG. 71 ($Y_2$-$Y'_2$)).

Figure 72:
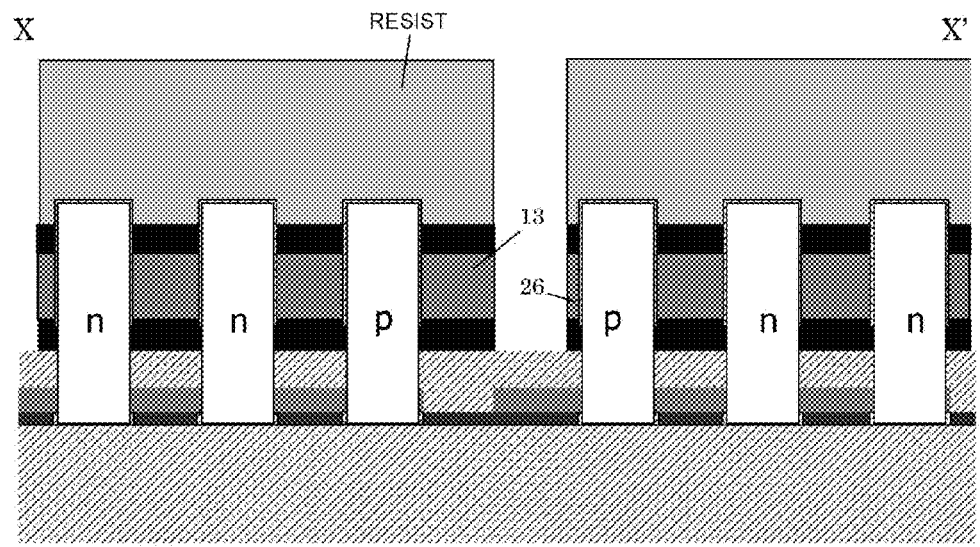
FIG. 72 is an X-X' cross-sectional process drawing showing the manufacture example of the semiconductor device according to the present invention.
Figure 73:
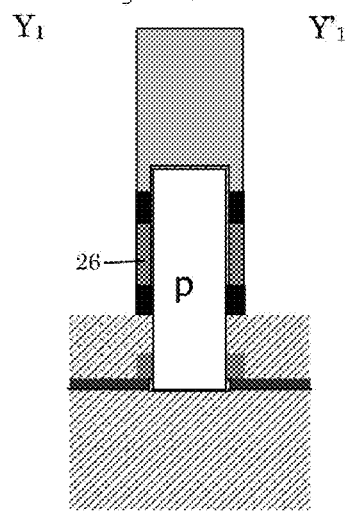
FIG. 73 is a $Y_1$-$Y'_1$ cross-sectional process drawing showing the manufacture example of the semiconductor device according to the present invention.
Figure 74:
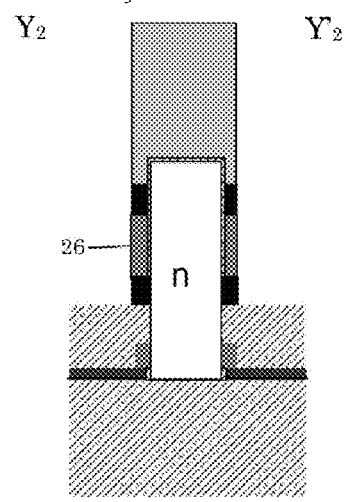
FIG. 74 is a $Y_2$-$Y'_2$ cross-sectional process drawing showing the manufacture example of the semiconductor device according to the present invention.

The nitride film, the polysilicon, and the nitride film are etched to form the input terminal lines, i.e., the gates 13 and 26 (FIG. 72 (X-X'), FIG. 73 ($Y_1$-$Y'_1$), FIG. 74 ($Y_2$-$Y'_2$)).

Figure 75:
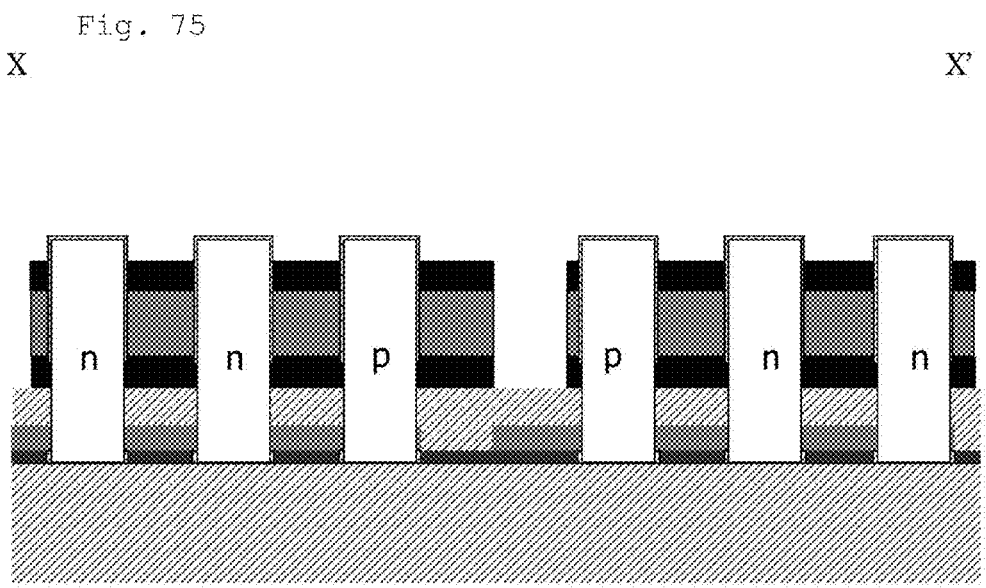
FIG. 75 is an X-X' cross-sectional process drawing showing the manufacture example of the semiconductor device according to the present invention.
Figure 76:
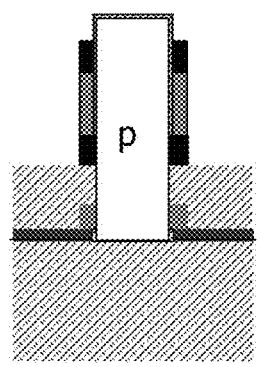
FIG. 76 is a $Y_1$-$Y'_1$ cross-sectional process drawing showing the manufacture example of the semiconductor device according to the present invention.
Figure 77:
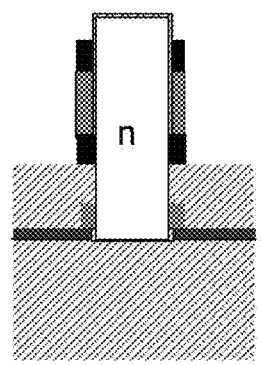
FIG. 77 is a $Y_2$-$Y'_2$ cross-sectional process drawing showing the manufacture example of the semiconductor device according to the present invention.

The resists are delaminated (FIG. 75 (X-X'), FIG. 76 ($Y_1$-$Y'_1$), FIG. 77 ($Y_2$-$Y'_2$)).

Figure 78:
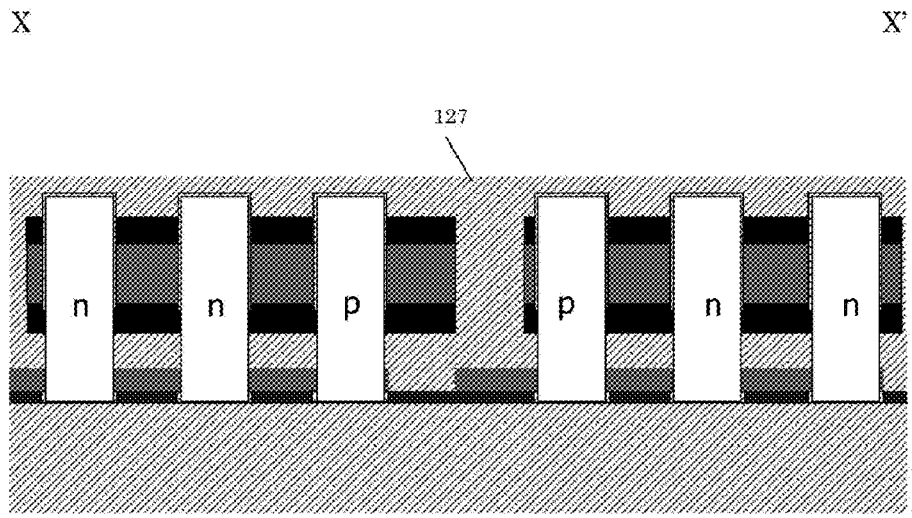
FIG. 78 is an X-X' cross-sectional process drawing showing the manufacture example of the semiconductor device according to the present invention.
Figure 79:
FIG. 79 is a $Y_1$-$Y'_1$ cross-sectional process drawing showing the manufacture example of the semiconductor device according to the present invention.
Figure 79:
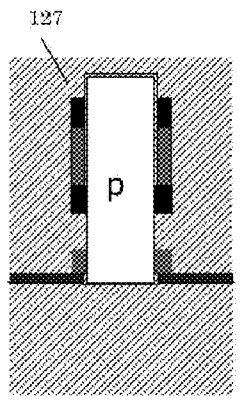
Figure 80:
FIG. 80 is a $Y_2$-$Y'_2$ cross-sectional process drawing showing the manufacture example of the semiconductor device according to the present invention.
Figure 80:
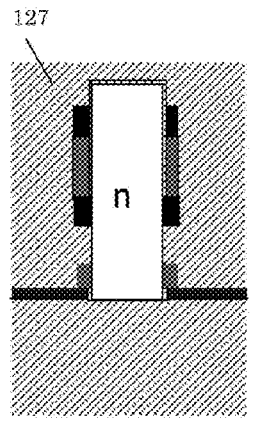

An oxide film 127 is deposited, flattened based on CMP, and then etched back (FIG. 78 (X-X'), FIG. 79 ($Y_1$-$Y'_1$), FIG. 80 ($Y_2$-$Y'_2$)).

Figure 81:
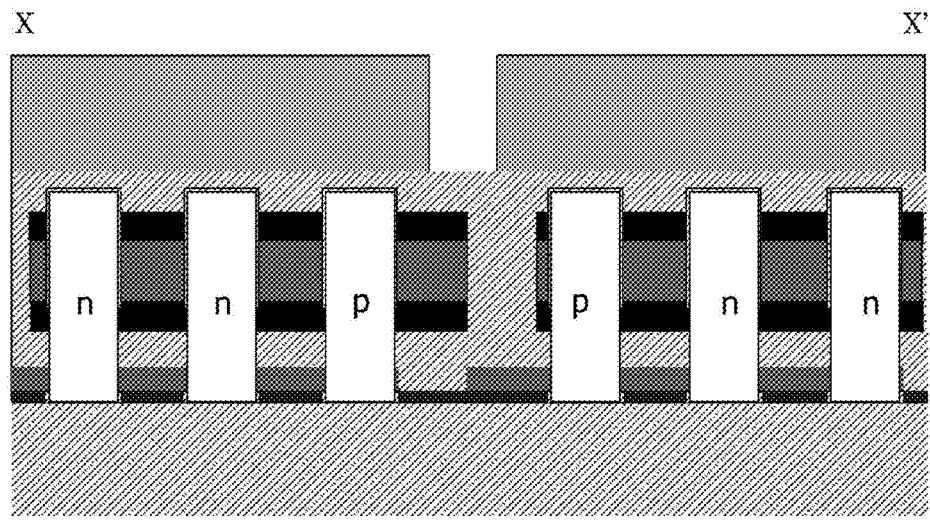
FIG. 81 is an X-X' cross-sectional process drawing showing the manufacture example of the semiconductor device according to the present invention.
Figure 82:
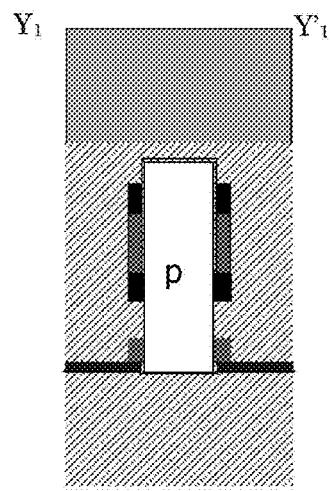
FIG. 82 is a $Y_1$-$Y'_1$ cross-sectional process drawing showing the manufacture example of the semiconductor device according to the present invention.
Figure 83:
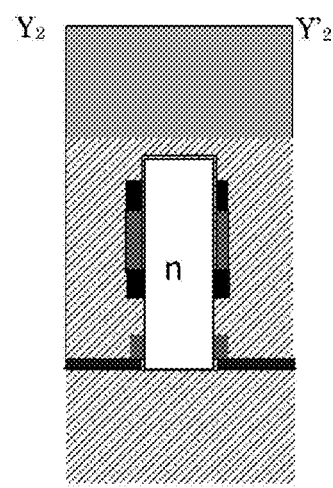
FIG. 83 is a $Y_2$-$Y'_2$ cross-sectional process drawing showing the manufacture example of the semiconductor device according to the present invention.

Resists required to form a contact between the gates and the island-shaped semiconductor lower layer are formed (FIG. 81 (X-X'), FIG. 82 ($Y_1$-$Y'_1$), FIG. 83 ($Y_2$-$Y'_2$)).

Figure 84:
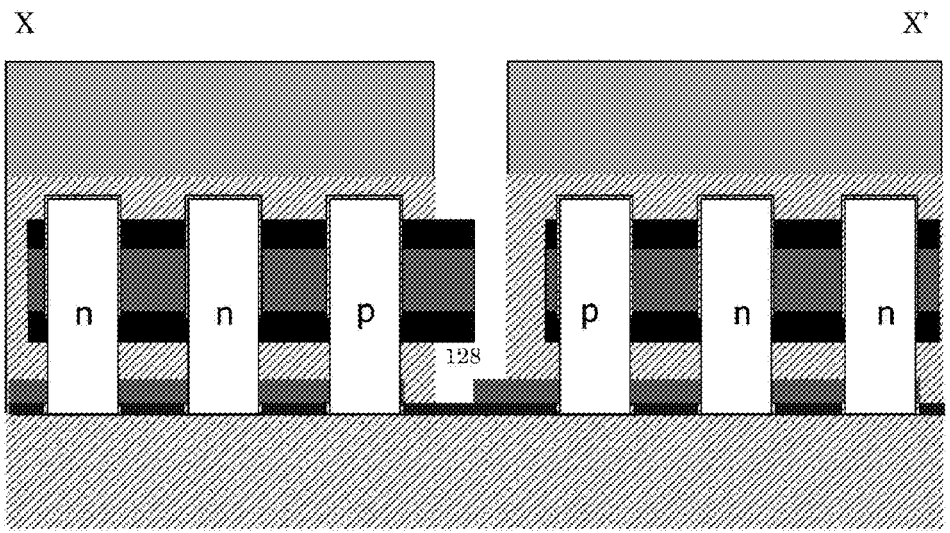
FIG. 84 is an X-X' cross-sectional process drawing showing the manufacture example of the semiconductor device according to the present invention.
Figure 85:
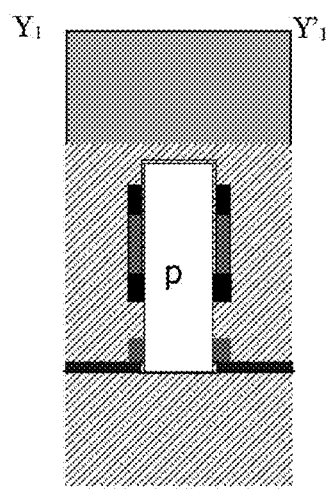
FIG. 85 is a $Y_1$-$Y'_1$ cross-sectional process drawing showing the manufacture example of the semiconductor device according to the present invention.
Figure 86:
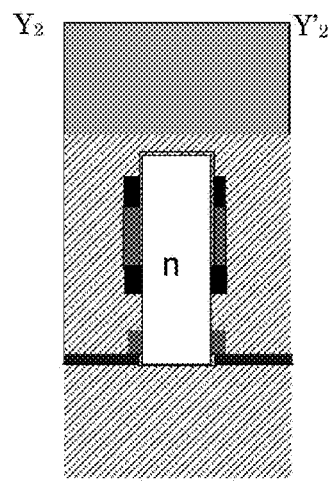
FIG. 86 is a $Y_2$-$Y'_2$ cross-sectional process drawing showing the manufacture example of the semiconductor device according to the present invention.

The oxide film is etched to form a contact 128 between the gates and the island-shaped semiconductor lower layer (FIG. 84 (X-X'), FIG. 85 ($Y_1$-$Y'_1$), FIG. 86 ($Y_2$-$Y'_2$)).

Figure 87:
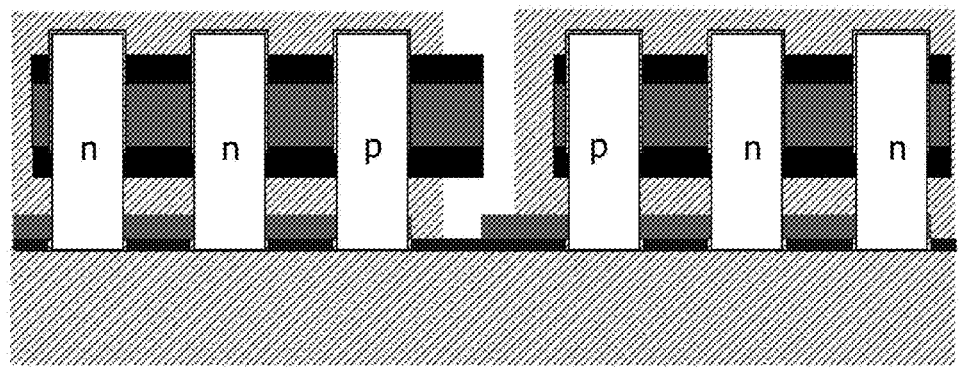
FIG. 87 is an X-X' cross-sectional process drawing showing the manufacture example of the semiconductor device according to the present invention.
Figure 88:
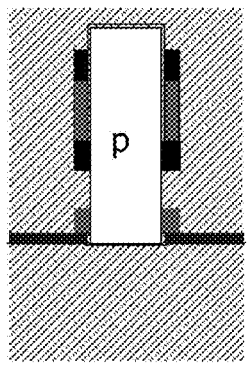
FIG. 88 is a $Y_1$-$Y'_1$ cross-sectional process drawing showing the manufacture example of the semiconductor device according to the present invention.
Figure 89:
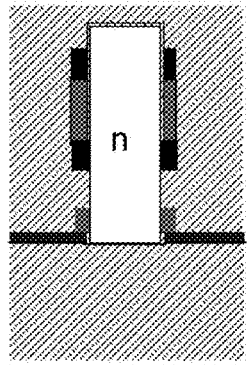
FIG. 89 is a $Y_2$-$Y'_2$ cross-sectional process drawing showing the manufacture example of the semiconductor device according to the present invention.

The resists are delaminated (FIG. 87 (X-X'), FIG. 88 ($Y_1$-$Y'_1$), FIG. 89 ($Y_2$-$Y'_2$)).

Figure 90:
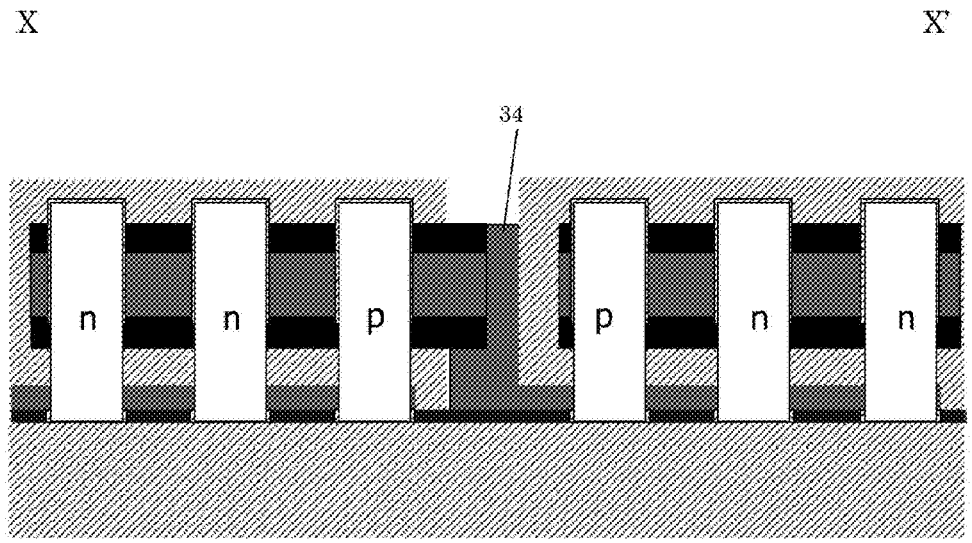
FIG. 90 is an X-X' cross-sectional process drawing showing the manufacture example of the semiconductor device according to the present invention.
Figure 91:
FIG. 91 is a $Y_1$-$Y'_1$ cross-sectional process drawing showing the manufacture example of the semiconductor device according to the present invention.
Figure 91:
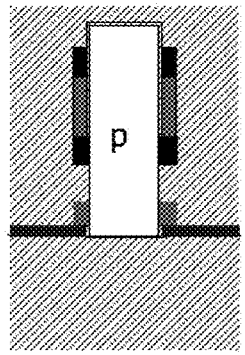
Figure 92:
FIG. 92 is a $Y_2$-$Y'_2$ cross-sectional process drawing showing the manufacture example of the semiconductor device according to the present invention.
Figure 92:
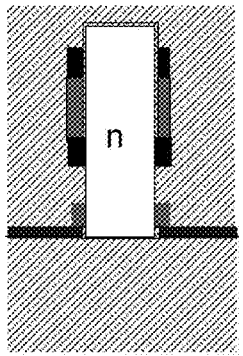

Polysilicon is deposited, flattened based on CMP, and then etched back, thereby forming a contact 34 between the gates and the island-shaped semiconductor lower layer (FIG. 90 (X-X'), FIG. 91 ($Y_1$-$Y'_1$), FIG. 92 ($Y_2$-$Y'_2$)).

Figure 93:
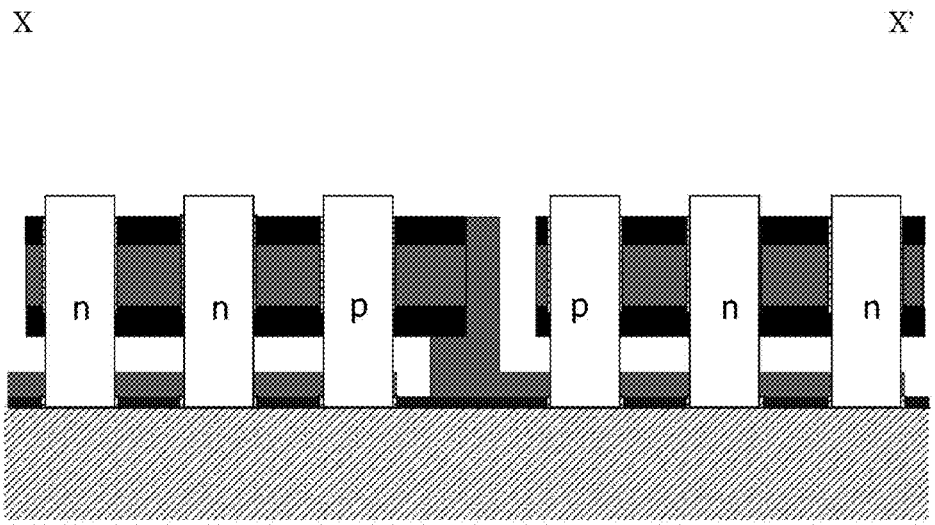
FIG. 93 is an X-X' cross-sectional process drawing showing the manufacture example of the semiconductor device according to the present invention.
Figure 94:
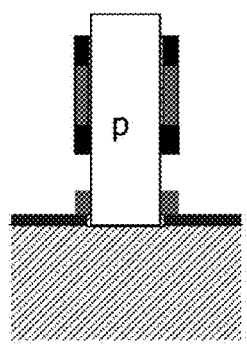
FIG. 94 is a $Y_1$-$Y'_1$ cross-sectional process drawing showing the manufacture example of the semiconductor device according to the present invention.
Figure 95:
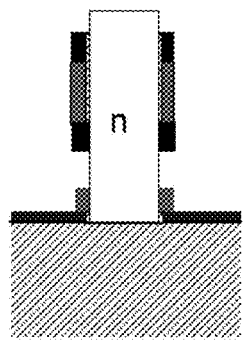
FIG. 95 is a $Y_2$-$Y'_2$ cross-sectional process drawing showing the manufacture example of the semiconductor device according to the present invention.

The oxide film is delaminated (FIG. 93 (X-X'), FIG. 94 ($Y_1$-$Y'_1$), FIG. 95 ($Y_2$-$Y'_2$)).

Figure 96:
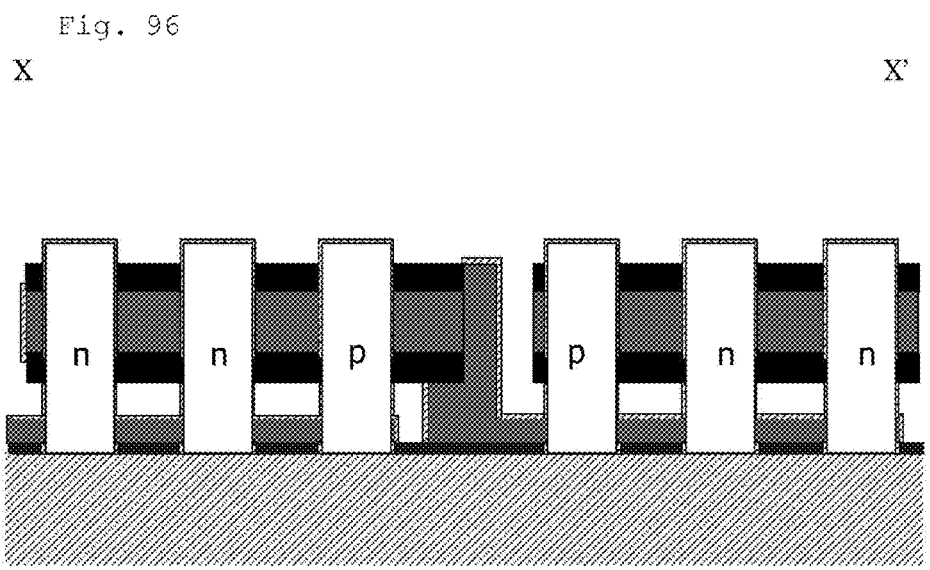
FIG. 96 is an X-X' cross-sectional process drawing showing the manufacture example of the semiconductor device according to the present invention.
Figure 97:
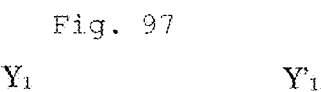
FIG. 97 is a $Y_1$-$Y'_1$ cross-sectional process drawing showing the manufacture example of the semiconductor device according to the present invention.
Figure 97:
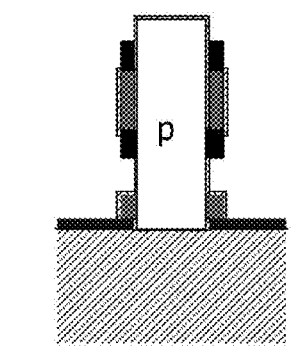
Figure 98:
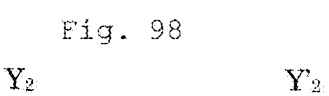
FIG. 98 is a $Y_2$-$Y'_2$ cross-sectional process drawing showing the manufacture example of the semiconductor device according to the present invention.
Figure 98:
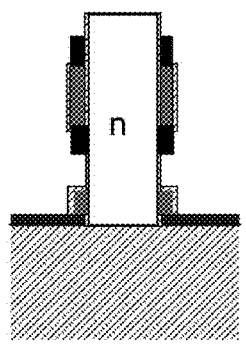

Oxidation is performed (FIG. 96 (X-X'), FIG. 97 ($Y_1$-$Y'_1$), FIG. 98 ($Y_2$-$Y'_2$)).

Figure 99:
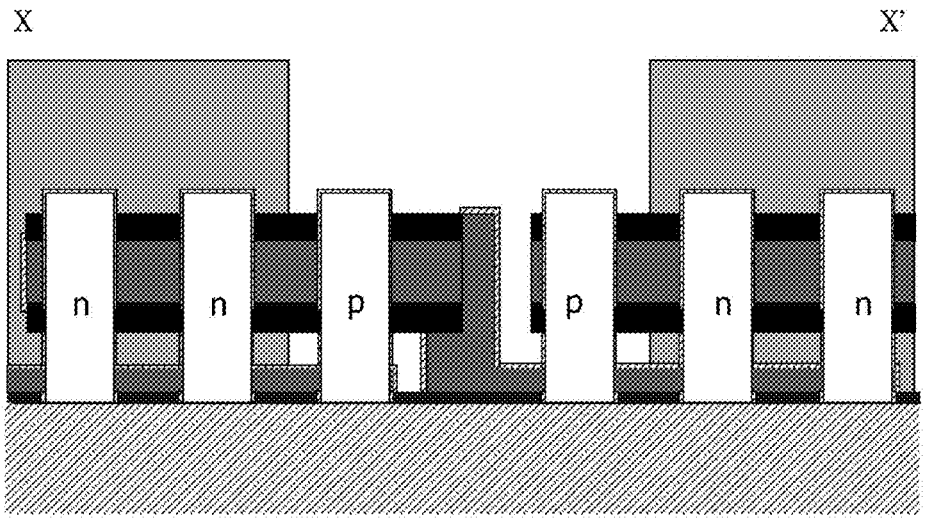
FIG. 99 is an X-X' cross-sectional process drawing showing the manufacture example of the semiconductor device according to the present invention.
Figure 100:
FIG. 100 is a $Y_1$-$Y'_1$ cross-sectional process drawing showing the manufacture example of the semiconductor device according to the present invention.
Figure 100:
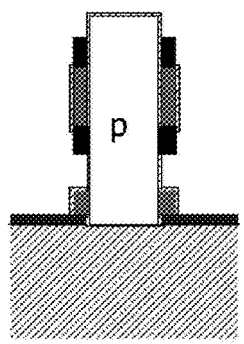
Figure 101:
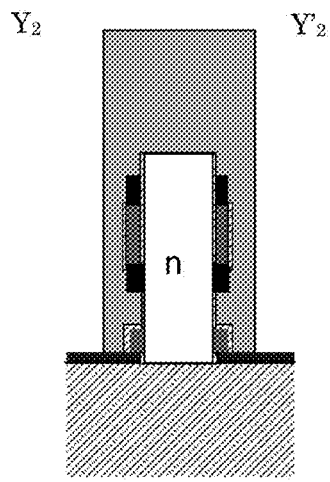
FIG. 101 is a $Y_2$-$Y'_2$ cross-sectional process drawing showing the manufacture example of the semiconductor device according to the present invention.

Resists required to form drain diffusion layers and source diffusion layers of n-channel semiconductor devices are formed (FIG. 99 (X-X'), FIG. 100 ($Y_1$-$Y'_1$), FIG. 101 ($Y_2$-$Y'_2$)).

Figure 102:
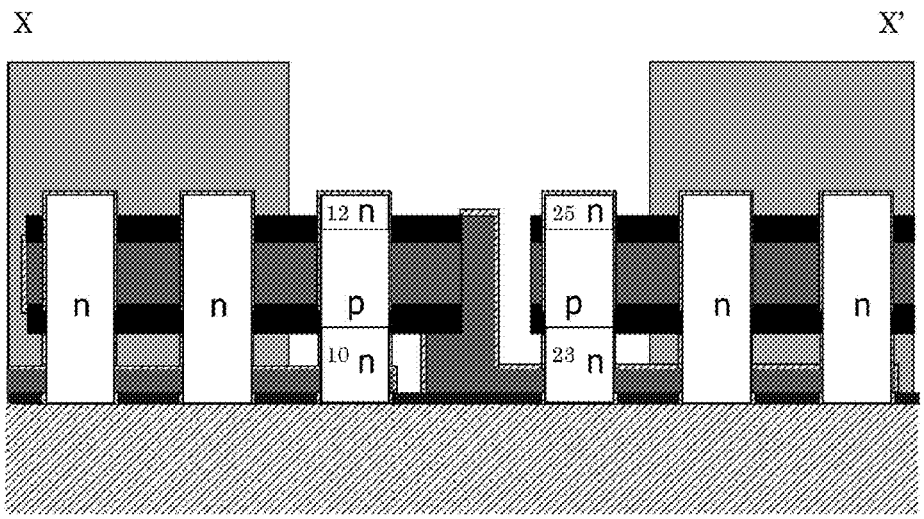
FIG. 102 is an X-X' cross-sectional process drawing showing the manufacture example of the semiconductor device according to the present invention.
Figure 103:
FIG. 103 is a $Y_1$-$Y'_1$ cross-sectional process drawing showing the manufacture example of the semiconductor device according to the present invention.
Figure 103:
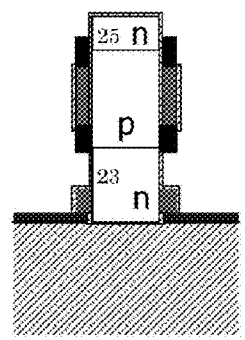
Figure 104:
FIG. 104 is a $Y_2$-$Y'_2$ cross-sectional process drawing showing the manufacture example of the semiconductor device according to the present invention.
Figure 104:
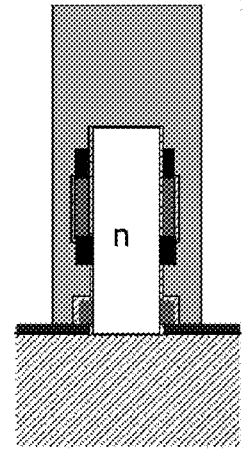

Arsenic is implanted based on, e.g., an ion implantation method to form drain diffusion layers 10 and 23 and source diffusion layers 12 and 25 (FIG. 102 (X-X'), FIG. 103 ($Y_1$-$Y'_1$), FIG. 104 ($Y_2$-$Y'_2$)).

Figure 105:
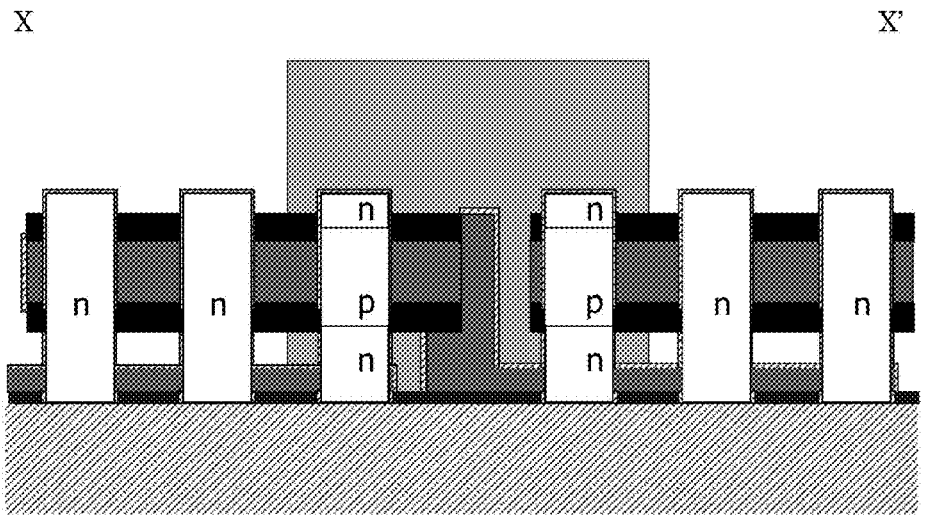
FIG. 105 is an X-X' cross-sectional process drawing showing the manufacture example of the semiconductor device according to the present invention.
Figure 106:
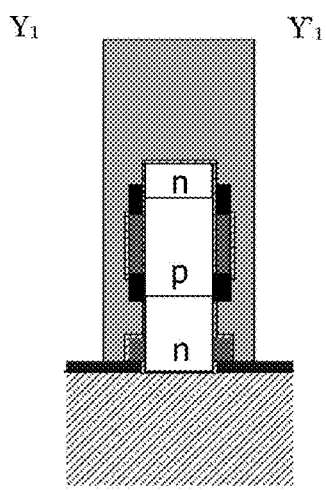
FIG. 106 is a $Y_1$-$Y'_1$ cross-sectional process drawing showing the manufacture example of the semiconductor device according to the present invention.
Figure 107:
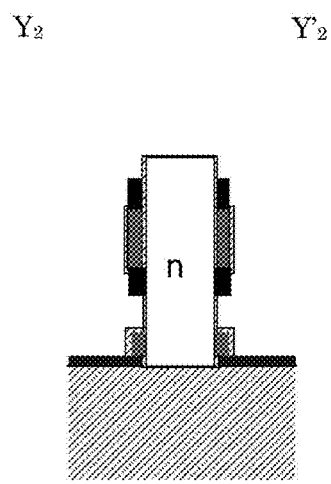
FIG. 107 is a $Y_2$-$Y'_2$ cross-sectional process drawing showing the manufacture example of the semiconductor device according to the present invention.

A resist required to form drain diffusion layers and source diffusion layers of p-channel semiconductor devices is formed (FIG. 105 (X-X'), FIG. 106 ($Y_1$-$Y'_1$), FIG. 107 ($Y_2$-$Y'_2$)).

Figure 108:
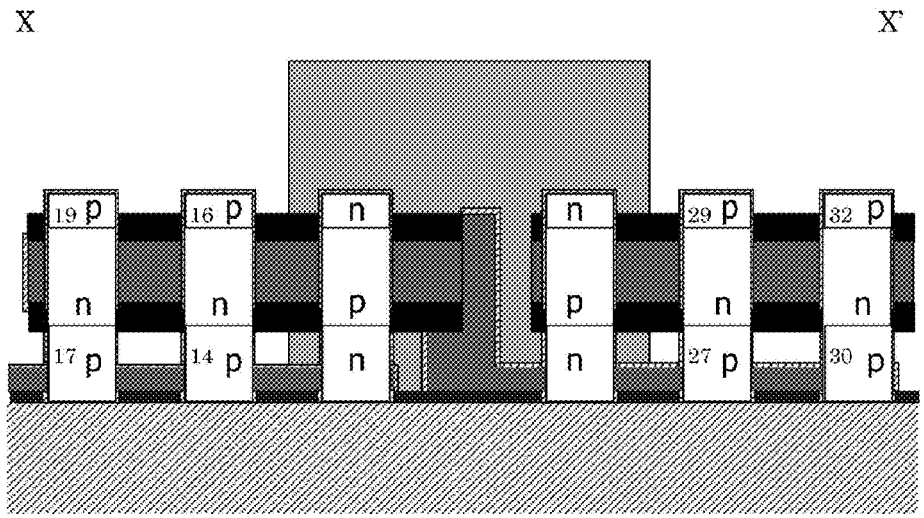
FIG. 108 is an X-X' cross-sectional process drawing showing the manufacture example of the semiconductor device according to the present invention.
Figure 109:
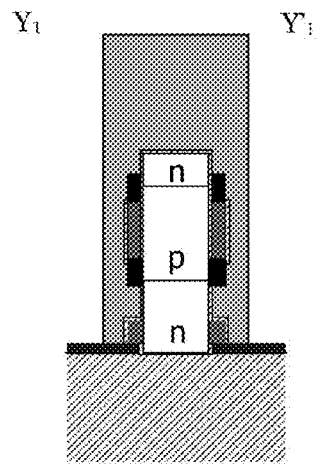
FIG. 109 is a $Y_1$-$Y'_1$ cross-sectional process drawing showing the manufacture example of the semiconductor device according to the present invention.
Figure 110:
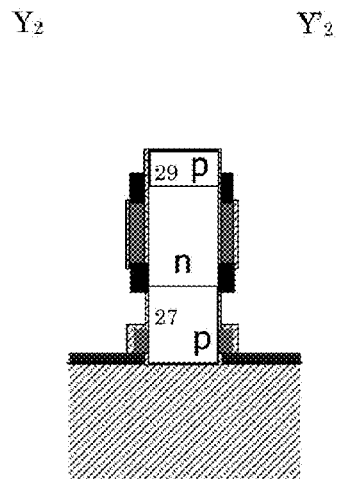
FIG. 110 is a $Y_2$-$Y'_2$ cross-sectional process drawing showing the manufacture example of the semiconductor device according to the present invention.

Boron is implanted based on, e.g., the ion implantation method to form drain diffusion layers 14, 17, 27, and 30 and source diffusion layers 16, 19, 29, and 32 (FIG. 108 (X-X'), FIG. 109 ($Y_1$-$Y'_1$), FIG. 110 ($Y_2$-$Y'_2$)).

Figure 111:
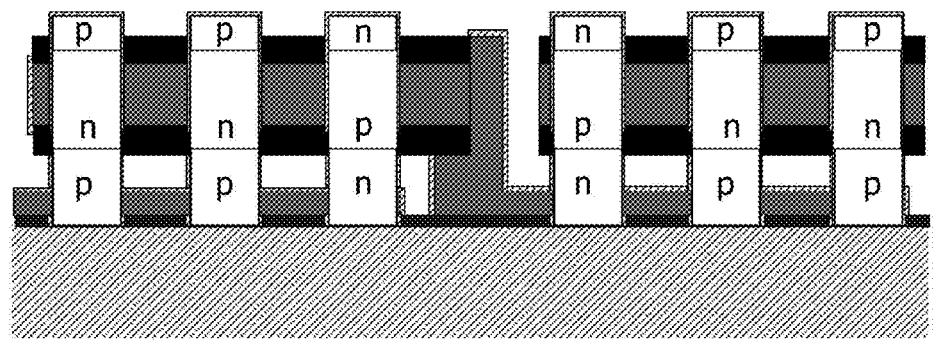
FIG. 111 is an X-X' cross-sectional process drawing showing the manufacture example of the semiconductor device according to the present invention.
Figure 112:
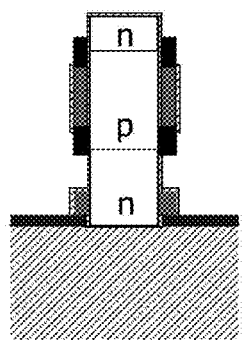
FIG. 112 is a $Y_1$-$Y'_1$ cross-sectional process drawing showing the manufacture example of the semiconductor device according to the present invention.
Figure 113:
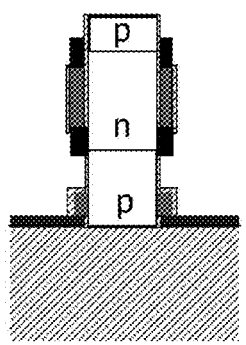
FIG. 113 is a $Y_2$-$Y'_2$ cross-sectional process drawing showing the manufacture example of the semiconductor device according to the present invention.

The oxide film is delaminated, and a heat process is carried out to ionize an impurity (FIG. 111 (X-X'), FIG. 112 ($Y_1$-$Y'_1$), FIG. 113 ($Y_2$-$Y'_2$)).

Figure 114:
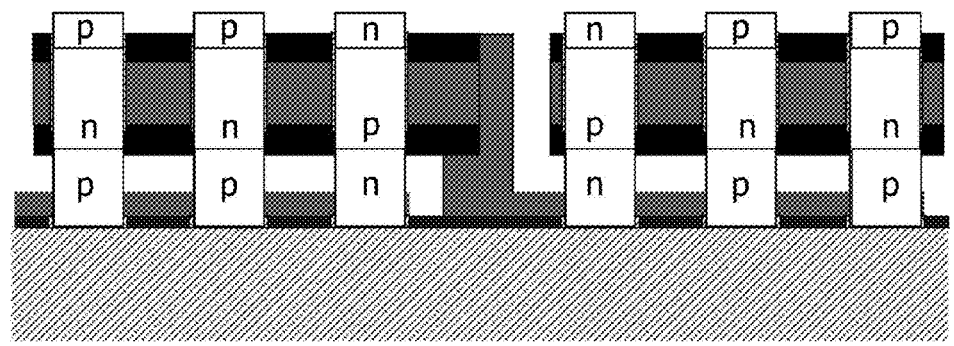
FIG. 114 is an X-X' cross-sectional process drawing showing the manufacture example of the semiconductor device according to the present invention.
Figure 115:
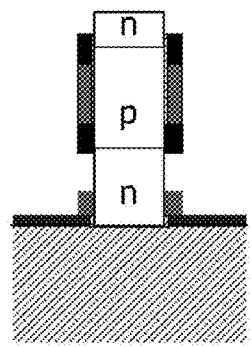
FIG. 115 is a $Y_1$-$Y'_1$ cross-sectional process drawing showing the manufacture example of the semiconductor device according to the present invention.
Figure 116:
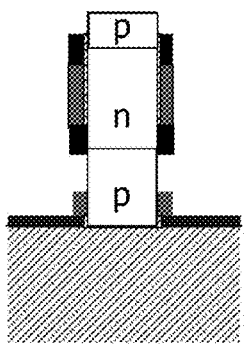

The oxide film is delaminated (FIG. 114 (X-X'), FIG. 115 ($Y_1$-$Y'_1$), FIG. 116 ($Y_2$-$Y'_2$)).

Figure 117:
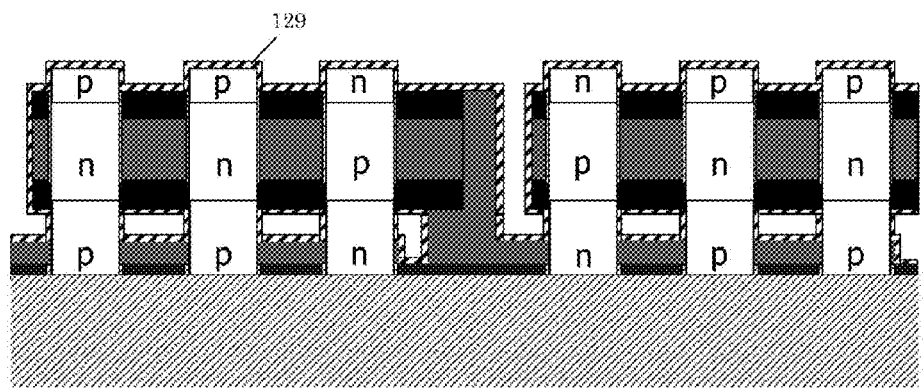
Figure 118:
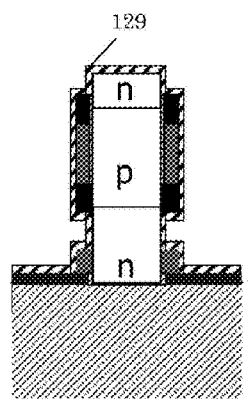
Figure 119:
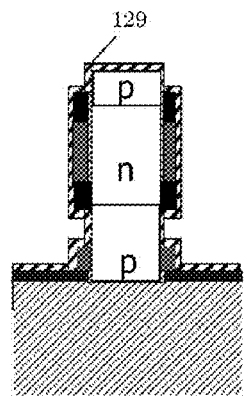

A metal 129, e.g., cobalt or nickel is deposited based on sputtering or CVD (FIG. 117 (X-X'), FIG. 118 ($Y_1$-$Y'_1$), FIG. 119 ($Y_2$-$Y'_2$)).

Figure 120:
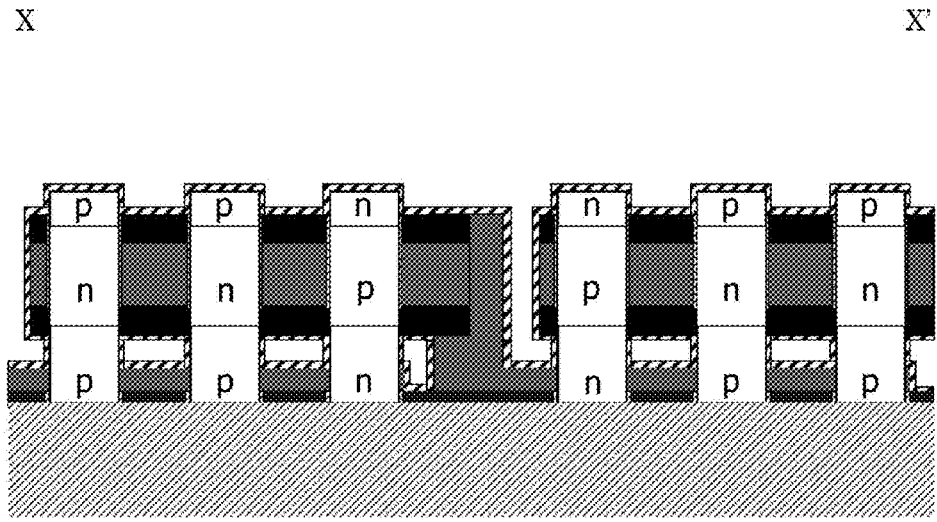
Figure 121:
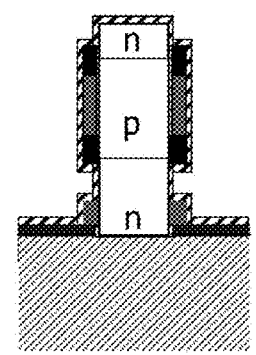
Figure 122:
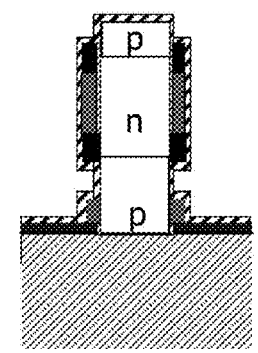

A heat process is carried out to react and salicide the metal and the silicon (FIG. 120 (X-X'), FIG. 121 ($Y_1$-$Y'_1$), FIG. 122 ($Y_2$-$Y'_2$)).

Figure 123:
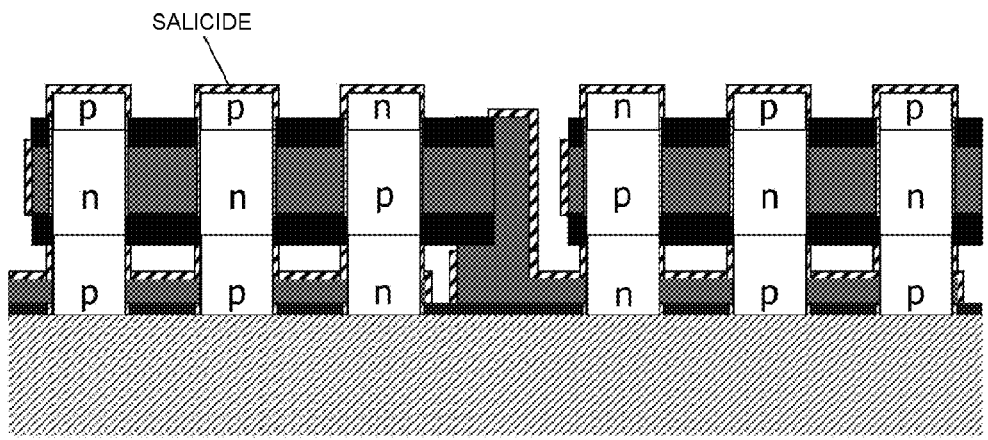
Figure 124:
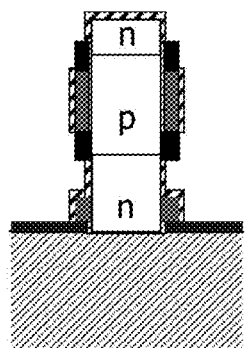
Figure 125:
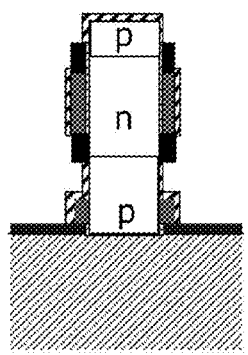

The silicon and the unreacted metal are etched (FIG. 123 (X-X'), FIG. 124 ($Y_1$-$Y'_1$), FIG. 125 ($Y_2$-$Y'_2$)).

Figure 126:
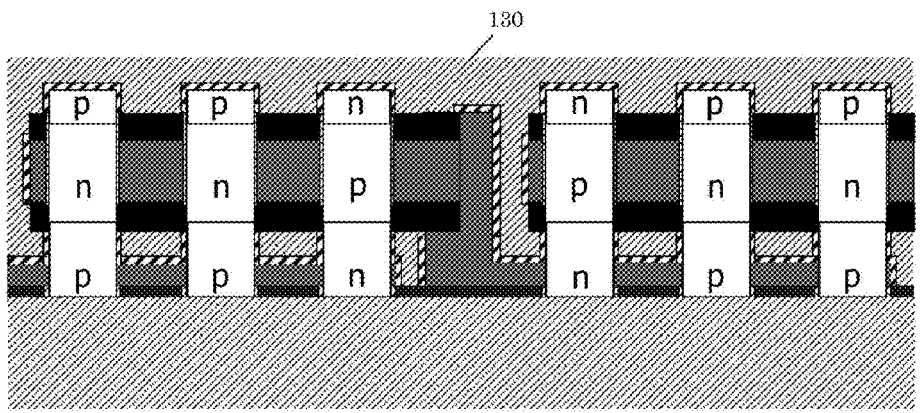
Figure 127:
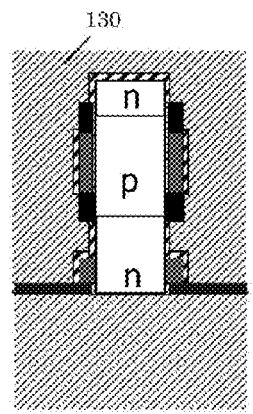

An oxide film 130 is deposited, flattened based on CMP, and then etched back (FIG. 126 (X-X'), FIG. 127 ($Y_1$-$Y'_1$), FIG. 128 ($Y_2$-$Y'_2$)).

Resists required to form contacts that connect the source diffusion layers 12 and 25 of the n-channel semiconductor devices with a first power supply wiring line $V_{SS}$ 20 and contacts that connect the source diffusion layers 29 and 32 of the p-channel semiconductor devices in a first inverter with a second power supply wiring line $V_{CC}$ 33 are formed, and resists required to form contacts that connect the source diffusion layers 16 and 19 of the p-channel semiconductor devices in a second inverter with a second power supply wiring line $V_{CC}$ 21 are formed (FIG. 129 (X-X'), FIG. 130 ($Y_1$-$Y'_1$), FIG. 131 ($Y_2$-$Y'_2$)).

The oxide film is etched to form contacts 133 and 134 that connect the source diffusion layers 12 and 25 of the n-channel semiconductor devices with the first power supply wiring line $V_{SS}$ 20, contacts 135 and 136 that connect the source diffusion layers 29 and 32 of the p-channel semiconductor devices in the first inverter with the second power supply wiring line $V_{CC}$ 33, and contacts 132 and 131 that connect the source diffusion layers 16 and 19 of the p-channel semiconductor devices in the second inverter with the second power supply wiring line $V_{CC}$ 21 (FIG. 132 (X-X'), FIG. 133 ($Y_1$-$Y'_1$), FIG. 134 ($Y_2$-$Y'_2$)).

The resists are delaminated (FIG. 135 (X-X'), FIG. 136 ($Y_1$-$Y'_1$), FIG. 137 ($Y_2$-$Y'_2$)).

A metal 137 is deposited and flattened based on CMP (FIG. 138 (X-X'), FIG. 139 ($Y_1$-$Y'_1$), FIG. 140 ($Y_2$-$Y'_2$)).

Resists required to form the first power supply wiring line $V_{SS}$ 20 and the second power supply wiring lines $V_{CC}$ 21 and 33 are formed (FIG. 141 (X-X'), FIG. 142 ($Y_1$-$Y'_1$), FIG. 143 ($Y_2$-$Y'_2$)).

The metal is etched to form the first power supply wiring line $V_{SS}$ 20 and the second power supply wiring lines $V_{CC}$ 21 and 33 (FIG. 144 (X-X'), FIG. 145 ($Y_1$-$Y'_1$), FIG. 146 ($Y_2$-$Y'_2$)).

The resists are delaminated (FIG. 147 (X-X'), FIG. 148 ($Y_1$-$Y'_1$), FIG. 149 ($Y_2$-$Y'_2$)).

An oxide film 138 is deposited and flattened based on CMP (FIG. 150 (X-X'), FIG. 151 ($Y_1$-$Y'_1$), FIG. 152 ($Y_2$-$Y'_2$)).

Further, although the CMOS inverter coupling circuit in which the CMOS inverters are arranged in one row and two columns has been explained in the example, the CMOS inverters may be arranged in two or more rows and two or more columns as shown in FIG. 153. FIG. 153 shows a CMOS inverter coupling circuit in which CMOS inverters are arranged in three rows and two columns as a specific example of the circuits arranged in m rows (m is two or above). It is to be noted that an example where one CMOS inverter has two P-channel MOS transistors (p-channel semiconductor devices) in a column direction will be explained, but the number of the P-channel MOS transistors in the column direction of the CMOS inverter may be one. Furthermore, three or more CMOS inverter each having one P-channel MOS transistor may be arranged in the column direction. Moreover, FIG. 154 is an $X_1$-$X'_1$ cross-sectional view, FIG. 155 is an $X_2$-$X'_2$ cross-sectional view, FIG. 156 is an $X_3$-$X'_3$ cross-sectional view, FIG. 157 is a $Y_1$-$Y'_1$ cross-sectional view, and FIG. 158 is a $Y_2$-$Y'_2$ cross-sectional view.

In this example, an output terminal wiring line 215 of an island-shaped semiconductor lower layer and a drain diffusion layer 216 are formed on a silicon oxide film 201, an island-shaped semiconductor layer 217 is formed thereon, a source diffusion layer 218 is formed on the island-shaped semiconductor layer 217, and a gate 219 is formed in a channel region of sidewalls sandwiched between the drain diffusion layer and the source diffusion layer through a gate insulating film, thereby forming an n-channel semiconductor device.

Additionally, the output terminal wiring line 215 of the island-shaped semiconductor lower layer and drain diffusion layers 220 and 223 are formed on the silicon oxide film 201, island-shaped semiconductor layers 221 and 224 are formed thereon, source diffusion layers 222 and 225 are formed on the island-shaped semiconductor layers 221 and 224, and the gate 219 is formed in the channel region of sidewalls sandwiched between the drain diffusion layers and the source diffusion layers through the gate insulating film, thereby forming p-channel semiconductor devices. The two p-channel semiconductor devices and the one n-channel semiconductor device form an inverter arranged in a third row and a second column.

Further, an output terminal wiring line 202 of the island-shaped semiconductor lower layer and a drain diffusion layer 203 are formed on the silicon oxide film 201, an island-shaped semiconductor layer 204 is formed thereon, a source diffusion layer 205 is formed on the island-shaped semiconductor layer 204, and a gate 206 is formed in a channel region of sidewalls sandwiched between the drain diffusion layer and the source diffusion layer through a gate insulating film, thereby forming an n-channel semiconductor device.

Furthermore, an output terminal wiring line 202 of the island-shaped semiconductor lower layer and drain diffusion layers 207 and 210 are formed on the silicon oxide film 201, island-shaped semiconductor layers 208 and 211 are formed thereon, source diffusion layers 209 and 212 are formed on the island-shaped semiconductor layers 208 and 211, the gate 206 is formed in the channel region of sidewalls sandwiched between the drain diffusion layers and the source diffusion layers, thereby forming p-channel semiconductor devices. The two p-channel semiconductor devices and the one n-channel semiconductor device form an inverter arranged in a third row and a first column.

The gate 206 serves as an input terminal line of the inverter arranged in the third row and the first column. A contact 227 is formed to connect the gate 206 with the output terminal wiring line 215 of the lower layer of the inverter arranged in the third row and the first column.

Moreover, an output terminal wiring line 315 of the island-shaped semiconductor lower layer and a drain diffusion layer 316 is formed on the silicon oxide film 201, an island-shaped semiconductor layer 317 is formed thereon, a source diffusion layer 318 is formed on the island-shaped semiconductor layer 317, and a gate 319 is formed in a channel region of sidewalls sandwiched between the drain diffusion layer and the source diffusion layer through a gate insulating film, thereby forming an n-channel semiconductor device.

Additionally, the output terminal wiring line 315 of the island-shaped semiconductor lower layer and drain diffusion layers 320 and 323 are formed on the silicon oxide film 201, island-shaped semiconductor layers 321 and 324 are formed thereon, source diffusion layers 322 and 325 are formed on the island-shaped semiconductor layers 321 and 324, and the gate 319 is formed in the channel region of sidewalls sandwiched between the drain diffusion layers and the source diffusion layers through the gate insulating film, thereby forming p-channel semiconductor device. The two p-channel semiconductor devices and the one n-channel semiconductor device form an inverter arranged in a second row and the second column.

Further, an output terminal wiring line 302 of the island-shaped semiconductor lower layer and a drain diffusion layer 303 are formed on the silicon oxide film 201, an island-shaped semiconductor layer 304 is formed thereon, a source diffusion layer 305 is formed on the island-shaped semiconductor layer 304, and a gate 306 is formed in a channel region of sidewalls sandwiched between the drain diffusion layer and the source diffusion layer through a gate insulating film, thereby forming an n-channel semiconductor device.

Furthermore, the output terminal wiring line 302 of the island-shaped semiconductor lower layer and drain diffusion layers 307 and 310 are formed on the silicon oxide film 201, island-shaped semiconductor layers 308 and 311 are formed thereon, source diffusion layers 309 and 312 are formed on the island-shaped semiconductor layers 308 and 311, and the gate 306 is formed in the channel region of sidewalls sandwiched between the drain diffusion layers and the source diffusion layers through the gate insulating film, thereby forming p-channel semiconductor devices. The two p-channel semiconductor devices and the one n-channel semiconductor device form an inverter arranged in the second row and the first column.

The gate 306 serves as an input terminal line of the inverter arranged in the second row and the first column. A contact 327 is formed to connect the gate 306 with the output terminal wiring line 315 of the lower layer of the inverter arranged in the second row and the second column.

Moreover, an output terminal wiring line 415 of the island-shaped semiconductor lower layer and a drain diffusion layer 416 are formed on the silicon oxide film 201, an island-shaped semiconductor layer 417 is formed thereon, a source diffusion layer 418 is formed on the island-shaped semiconductor layer 417, and a gate 419 is formed in a channel region of sidewalls sandwiched between the drain diffusion layer and the source diffusion layer through a gate insulating film, thereby forming an n-channel semiconductor device.

Additionally, the output terminal wiring line 415 of the island-shaped semiconductor lower layer and drain diffusion layers 420 and 423 are formed on the silicon oxide film 201, island-shaped semiconductor layers 421 and 424 are formed thereon, source diffusion layers 422 and 425 are formed on the island-shaped semiconductor layers 421 and 424, and the gate 419 is formed in the channel region of sidewalls sandwiched between the drain diffusion layers and the source diffusion layers through the gate insulating film, thereby forming p-channel semiconductor devices. The two p-channel semiconductor devices and the one n-channel semiconductor device form an inverter arranged in a first row and the second column.

Further, an output terminal wiring line 402 of the island-shaped semiconductor lower layer and a drain diffusion layer 403 are formed on the silicon oxide film 201, an island-shaped semiconductor layer 404 is formed thereon, a source diffusion layer 405 is formed on the island-shaped semiconductor layer 404, and a gate 406 is formed in a channel region of sidewalls sandwiched between the drain diffusion layer and the source diffusion layer through a gate insulating film, thereby forming an n-channel semiconductor device.

Furthermore, the output terminal wiring line 402 of the island-shaped semiconductor lower layer and drain diffusion layers 407 and 410 are formed on the silicon oxide film 201, island-shaped semiconductor layers 408 and 411 are formed thereon, source diffusion layers 409 and 412 are formed on the island-shaped semiconductor layers 408 and 411, and the gate 406 is formed in the channel region of sidewalls sandwiched between the drain diffusion layers and the source diffusion layers through the gate insulating film, thereby forming p-channel semiconductor devices. The two p-channel semiconductor devices and the one n-channel semiconductor device form an inverter arranged in the first row and the first column.

The gate 406 serves as an input terminal line of the inverter arranged in the first row and the first column. A contact 427 is formed to connect the gate 406 with the output terminal wiring line 415 of the lower layer of the inverter arranged in the first row and the second column.

A first power supply wiring line $V_{SS}$ 213 is formed on the source diffusion layers 205, 218, 305, 318, 405, and 418 of the n-channel semiconductor devices, and a second power supply wiring line $V_{CC}$ 226 is formed on the source diffusion layers 222, 225, 322, 325, 422, and 425 of the p-channel semiconductor devices in the inverters arranged in the third row and the first column, in the second row and the first column, and in the first row and the first column.

A second power supply wiring line $V_{CC}$ 214 is formed on the source diffusion layers 209, 212, 309, 312, 409, and 412 of the p-channel semiconductor devices in the inverters arranged in the third row and the first column, in the second row and the first column, and in the first row and the first column.

As explained above, the conventional two-stage CMOS inverter with the SGTs uses the SGTs in which the first power supply voltage $V_{SS}$ and the second power supply voltage $V_{CC}$ are supplied to the diffusion layers of the silicon substrate through the contacts. That is, the power supply wiring lines of the nMOS SGT and the pMOS SGT are arranged on one side of the lower portion of the gate region.

On the other hand, the present invention has the first power supply wiring lines $V_{SS}$ and the second power supply wiring lines $V_{CC}$ supplied from upper sides of both the NMOS SGT and the pMOS SGT, and has:

the first power supply wiring line $V_{SS}$ connected with the source diffusion layer of the n-channel semiconductor device in the first inverter;

the first power supply wiring line $V_{SS}$ connected with the source diffusion layer of the n-channel semiconductor device in the second inverter;

the second power supply wiring line $V_{CC}$ connected with the source diffusion layers of the two p-channel semiconductor devices in the first inverter; and the second power supply wiring line $V_{CC}$ connected with the source diffusion layers of the two p-channel semiconductor devices in the second inverter, thereby providing a semiconductor device formed of the highly integrated CMOS inverter coupling circuit with SGTs in which areas of the first power supply wiring lines $V_{SS}$ and the second power supply wiring lines $V_{CC}$ are reduced.

Moreover, since the present invention has the first power supply wiring lines $V_{SS}$ and the second power supply wiring lines $V_{CC}$ supplied from upper sides of both the nMOS SGT and the pMOS SGT, and has:

the first power supply wiring line $V_{SS}$ connected with the source diffusion layer of the n-channel semiconductor device in the first inverter;

the first power supply wiring line $V_{SS}$ connected with the source diffusion layer of the n-channel semiconductor device in the second inverter;

the second power supply wiring line $V_{CC}$ connected with the source diffusion layers of the two p-channel semiconductor devices in the first inverter; and the second power supply wiring line $V_{CC}$ connected with the source diffusion layers of the two p-channel semiconductor devices in the second inverter, it is possible to provide a semiconductor device formed of the high-speed CMOS inverter coupling circuit with SGTs in which resistances of the first power supply wiring lines $V_{SS}$ and the second power supply wiring lines $V_{CC}$ are reduced.

Since the output terminal wiring lines arranged to connect the drain diffusion layers of the n-channel semiconductor devices with the drain diffusion layers of the p-channel semiconductor devices in the island-shaped semiconductor lower layer are provided, it is possible to eliminate:

a contact that is used to connect the drain diffusion layer of each n-channel semiconductor device with a metal wiring line;

a contact that is used to connect the drain diffusion layer of each p-channel semiconductor device with the metal wiring line; and a metal wiring line connecting the respective contacts with each other is not required, thereby providing a semiconductor device formed of the highly integrated CMOS inverter coupling circuit using SGTs.

The invention claimed is:

1. A semiconductor device comprising a CMOS inverter coupling circuit that couples n (n is two or above) CMOS inverters with each other,
   each of the n CMOS inverters having:
   a first MOS transistor for a first conductivity type channel, which has a structure where a first drain, a first gate, and a first source are arranged in a vertical direction with respect to a substrate and the first gate surrounds an island-shaped semiconductor layer;
   a second MOS transistor for a second conductivity type channel different from the first conductivity type channel, which has a structure where a second drain, a second gate, and a second source are arranged in a vertical direction with respect to the substrate and the second gate surrounds an island-shaped semiconductor layer;
   an input terminal of the CMOS inverter arranged so as to connect the first gate of the first MOS transistor with the second gate of the second MOS transistor;
   an output terminal of the CMOS inverter arranged so as to connect a drain diffusion layer of the first MOS transistor with a drain diffusion layer of the second MOS transistor in an island-shaped semiconductor lower layer;
   a power supply wiring line for the first MOS transistor, which is arranged on a source diffusion layer of the first MOS transistor;
   a power supply wiring line for the second MOS transistor, which is arranged on a source diffusion layer of the second MOS transistor,
   wherein the semiconductor device further has a coupling portion that is used to connect the output terminal of an n−1th CMOS inverter with the input terminal of an nth CMOS inverter when arranging each of the n CMOS inverters with respect to the substrate, and tops of both of the coupling portion and the first gate are located to vertically overlap and align with at least a part of the power supply wiring line, and
   a dielectric film is formed on entire top surfaces of the first gate and the coupling portion.

2. The semiconductor device according to claim 1, wherein, when the n CMOS inverters are arranged in a row with respect to the substrate,
   the first MOS transistor of the n−1th CMOS inverter and the first MOS transistor of the nth CMOS inverter are arranged to be adjacent to each other,
   the second MOS transistor of the nth CMOS inverter and the second MOS transistor of the n+1th CMOS inverter are arranged to be adjacent to each other,
   the power supply wiring line for the first MOS transistor of the n−1th CMOS inverter is connected with the power supply wiring line for the first MOS transistor of the nth CMOS inverter on the source diffusion layers, and
   the power supply wiring line for the second MOS transistor of the nth CMOS inverter is connected with the power supply wiring line for the second MOS transistor of the n+1th CMOS inverter on the source diffusion layers.

3. The semiconductor device according to claim 2, wherein the n CMOS inverters arranged in a row with respect to the substrate are arranged in m rows (m is two or above) with respect to the substrate,
   the power supply wiring lines for the first MOS transistors of the respective CMOS inverters are connected with each other on the source diffusion layers, and
   the power supply wiring lines for the second MOS transistors of the respective CMOS inverters are connected with each other on the source diffusion layers.

4. The semiconductor device according to claim 3, wherein the first MOS transistor is a p-channel MOS transistor, and the second MOS transistor is an re-channel transistor.

5. An n-channel MOS transistor, which is used in the semiconductor device according to claim 4 and has a structure in which a drain, a gate, and a source are arranged in a vertical direction with respect to a substrate and the gate surrounds an island-shaped semiconductor layer,
   wherein insulating film layers are formed above and below the gate,
   a polysilicon wiring line surrounds a part of a drain diffusion layer in an island-shaped semiconductor lower layer,
   the drain diffusion layer, the polysilicon wiring line, the gate, and a source diffusion layer are salicided, and
   a metal wiring line is formed on the source diffusion layer.

6. A p-channel MOS transistor, which is used in the semiconductor device according to claim 4 and has a structure in which a drain, a gate, and a source are arranged in a vertical direction with respect to a substrate and the gate surrounds an island-shaped semiconductor layer,
   wherein insulating film layers are formed above and below the gate,
   a polysilicon wiring line surrounds a part of a drain diffusion layer in an island-shaped semiconductor lower layer,
   the drain diffusion layer, the polysilicon wiring line, the gate, and a source diffusion layer are salicided, and
   a metal wiring line is formed on the source diffusion layer.

7. The semiconductor device according to claim 3, wherein the first MOS transistor is an n-channel MOS transistor, and the second MOS transistor is an n-channel MOS transistor.

8. An n-channel MOS transistor, which is used in the semiconductor device according to claim 7 and has a structure in which a drain, a gate, and a source are arranged in a vertical direction with respect to a substrate and the gate surrounds an island-shaped semiconductor layer,
   wherein insulating film layers are formed above and below the gate,
   a polysilicon wiring line surrounds a part of a drain diffusion layer in an island-shaped semiconductor lower layer,
   the drain diffusion layer, the polysilicon wiring line, the gate, and a source diffusion layer are salicided, and
   a metal wiring line is formed on the source diffusion layer.

9. A p-channel MOS transistor, which is used in the semiconductor device according to claim 7 and has a structure in which a drain, a gate, and a source are arranged in a vertical direction with respect to a substrate and the gate surrounds an island-shaped semiconductor layer,
   wherein insulating film layers are formed above and below the gate,
   a polysilicon wiring line surrounds a part of a drain diffusion layer in an island-shaped semiconductor lower layer,
   the drain diffusion layer, the polysilicon wiring line, the gate, and a source diffusion layer are salicided, and a metal wiring line is formed on the source diffusion layer.

10. The semiconductor device according to claim 3, wherein the first MOS transistor is an n-channel MOS transistor, the second MOS transistor is a p-channel MOS transistor, and the number of the p-channel MOS transistors is double the number of the n-channel MOS transistors.

11. An n-channel MOS transistor, which is used in the semiconductor device according to claim 10 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

12. A p-channel MOS transistor, which is used in the semiconductor device according to claim 10 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

13. The semiconductor device according to claim 3, wherein the first MOS transistor is a p-channel MOS transistor, the second MOS transistor is an n-channel MOS transistor, and the number of the p-channel MOS transistors is double the number of the n-channel MOS transistors.

14. An n-channel MOS transistor, which is used in the semiconductor device according to claim 13 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

15. A p-channel MOS transistor, which is used in the semiconductor device according to claim 13 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

16. The semiconductor device according to claim 2, wherein the first MOS transistor is a p-channel MOS transistor, and the second MOS transistor is an re-channel transistor.

17. An n-channel MOS transistor, which is used in the semiconductor device according to claim 16 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

18. A p-channel MOS transistor, which is used in the semiconductor device according to claim 16 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

19. The semiconductor device according to claim 2, wherein the first MOS transistor is an n-channel MOS transistor, and the second MOS transistor is an n-channel MOS transistor.

20. An n-channel MOS transistor, which is used in the semiconductor device according to claim 19 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

21. A p-channel MOS transistor, which is used in the semiconductor device according to claim 19 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

22. The semiconductor device according to claim 2, wherein the first MOS transistor is an n-channel MOS transistor, the second MOS transistor is a p-channel MOS transistor, and the number of the p-channel MOS transistors is double the number of the n-channel MOS transistors.

23. An n-channel MOS transistor, which is used in the semiconductor device according to claim 22 and has a structure in which a drain, a gate, and a source are arranged in a vertical direction with respect to a substrate and the gate surrounds an island-shaped semiconductor layer, wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

24. A p-channel MOS transistor, which is used in the semiconductor device according to claim 22 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

25. The semiconductor device according to claim 2, wherein the first MOS transistor is a p-channel MOS transistor, the second MOS transistor is an n-channel MOS transistor, and the number of the p-channel MOS transistors is double the number of the n-channel MOS transistors.

26. An n-channel MOS transistor, which is used in the semiconductor device according to claim 25 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

27. A p-channel MOS transistor, which is used in the semiconductor device according to claim 25 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

28. The semiconductor device according to claim 1, wherein the n CMOS inverters arranged in a row with respect to the substrate are arranged in m rows (m is two or above) with respect to the substrate,
the power supply wiring lines for the first MOS transistors of the respective CMOS inverters are connected with each other on the source diffusion layers, and
the power supply wiring lines for the second MOS transistors of the respective CMOS inverters are connected with each other on the source diffusion layers.

29. The semiconductor device according to claim 28, wherein the first MOS transistor is a p-channel MOS transistor, and the second MOS transistor is an re-channel transistor.

30. An n-channel MOS transistor, which is used in the semiconductor device according to claim 29 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

31. A p-channel MOS transistor, which is used in the semiconductor device according to claim 29 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

32. The semiconductor device according to claim 28, wherein the first MOS transistor is an n-channel MOS transistor, and the second MOS transistor is an n-channel MOS transistor.

33. An n-channel MOS transistor, which is used in the semiconductor device according to claim 32 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

34. A p-channel MOS transistor, which is used in the semiconductor device according to claim 32 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

35. The semiconductor device according to claim 28, wherein the first MOS transistor is an n-channel MOS transistor, the second MOS transistor is a p-channel MOS transistor, and the number of the p-channel MOS transistors is double the number of the n-channel MOS transistors.

36. An n-channel MOS transistor, which is used in the semiconductor device according to claim 35 and has a structure in which a drain, a gate, and a source are arranged in a vertical direction with respect to a substrate and the gate surrounds an island-shaped semiconductor layer,
wherein insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

37. A p-channel MOS transistor, which is used in the semiconductor device according to claim 35 and has a structure in which a drain, a gate, and a source are arranged in a vertical direction with respect to a substrate and the gate surrounds an island-shaped semiconductor layer, wherein insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

38. The semiconductor device according to claim 28, wherein the first MOS transistor is a p-channel MOS transistor, the second MOS transistor is an n-channel MOS transistor, and the number of the p-channel MOS transistors is double the number of the n-channel MOS transistors.

39. An n-channel MOS transistor, which is used in the semiconductor device according to claim 38 and has a structure in which a drain, a gate, and a source are arranged in a vertical direction with respect to a substrate and the gate surrounds an island-shaped semiconductor layer, wherein insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

40. A p-channel MOS transistor, which is used in the semiconductor device according to claim 38 and has a structure in which a drain, a gate, and a source are arranged in a vertical direction with respect to a substrate and the gate surrounds an island-shaped semiconductor layer, wherein insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

41. The semiconductor device according to claim 1, wherein the first MOS transistor is a p-channel MOS transistor, and the second MOS transistor is an re-channel transistor.

42. An n-channel MOS transistor, which is used in the semiconductor device according to claim 41 and has a structure in which a drain, a gate, and a source are arranged in a vertical direction with respect to a substrate and the gate surrounds an island-shaped semiconductor layer, wherein insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

43. A p-channel MOS transistor, which is used in the semiconductor device according to claim 41 and has a structure in which a drain, a gate, and a source are arranged in a vertical direction with respect to a substrate and the gate surrounds an island-shaped semiconductor layer, wherein insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

44. The semiconductor device according to claim 1, wherein the first MOS transistor is an n-channel MOS transistor, and the second MOS transistor is an n-channel MOS transistor.

45. An n-channel MOS transistor, which is used in the semiconductor device according to claim 44 and has a structure in which a drain, a gate, and a source are arranged in a vertical direction with respect to a substrate and the gate surrounds an island-shaped semiconductor layer, wherein insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

46. A p-channel MOS transistor, which is used in the semiconductor device according to claim 44 and has a structure in which a drain, a gate, and a source are arranged in a vertical direction with respect to a substrate and the gate surrounds an island-shaped semiconductor layer, wherein insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

47. The semiconductor device according to claim 1, wherein the first MOS transistor is an n-channel MOS transistor, the second MOS transistor is a p-channel MOS transistor, and the number of the p-channel MOS transistors is double the number of the n-channel MOS transistors.

48. An n-channel MOS transistor, which is used in the semiconductor device according to claim 47 and has a structure in which a drain, a gate, and a source are arranged in a vertical direction with respect to a substrate and the gate surrounds an island-shaped semiconductor layer, wherein insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

49. A p-channel MOS transistor, which is used in the semiconductor device according to claim 47 and has a structure in which a drain, a gate, and a source are arranged in a vertical direction with respect to a substrate and the gate surrounds an island-shaped semiconductor layer, wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

50. The semiconductor device according to claim 1, wherein the first MOS transistor is a p-channel MOS transistor, the second MOS transistor is an n-channel MOS transistor, and the number of the p-channel MOS transistors is double the number of the n-channel MOS transistors.

51. An n-channel MOS transistor, which is used in the semiconductor device according to claim 50 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

52. A p-channel MOS transistor, which is used in the semiconductor device according to claim 50 and has a structure in which a drain, a gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

53. A semiconductor device comprising a CMOS inverter coupling circuit in which CMOS inverters on at least two stages are coupled with each other, the CMOS inverter having a first CMOS inverter and a second CMOS inverter,
wherein the first CMOS inverter is a CMOS inverter having:
an n-channel semiconductor device having a structure where a drain, gate, and a source are arranged in a vertical direction with respect to a substrate and the gate surrounds an island-shaped semiconductor layer;
a p-channel semiconductor device having a structure where a drain, a gate, and a source are arranged in the vertical direction with respect to the substrate and the gate surrounds an island-shaped semiconductor layer;
an input terminal of the first CMOS inverter arranged so as to connect the gate of the n-channel semiconductor device with the gate of the p-channel semiconductor device;
an output terminal of the first CMOS inverter arranged so as to connect a drain diffusion layer of the n-channel semiconductor device with a drain diffusion layer of the p-channel semiconductor device in an island-shaped semiconductor lower layer;
a first power supply wiring line connected with a source diffusion layer of the n-channel semiconductor device; and
a second power supply wiring line connected with a source diffusion layer of the p-channel semiconductor device, the second CMOS inverter is a CMOS inverter having:
an n-channel semiconductor device having a structure where a drain, a gate, and a source are arranged in the vertical direction with respect to the substrate and the gate surrounds an island-shaped semiconductor layer;
a p-channel semiconductor device having a structure where a drain, a gate, and a source are arranged in the vertical direction with respect to the substrate and the gate surrounds an island-shaped semiconductor layer;
an input terminal of the second CMOS inverter arranged so as to connect the gate of the n-channel semiconductor device with the gate of the p-channel semiconductor device;
an output terminal of the second CMOS inverter arranged so as to connect a drain diffusion layer of the n-channel semiconductor device with a drain diffusion layer of the p-channel semiconductor device in the island-shaped semiconductor lower layer;
a first power supply wiring line connected with a source diffusion layer of the n-channel semiconductor device; and
a second power supply wiring line connected with a source diffusion layer of the p-channel semiconductor device,
the output terminal of the first CMOS inverter connected by a coupling portion with the input terminal of the second CMOS inverter, and tops of both of the coupling portion and the gate are located to vertically overlap and align with at least a part of the first power supply wiring line,
a dielectric film is formed on entire top surfaces of the gate and the coupling portion,
the first power supply wiring line connected with the source diffusion layer of the n-channel semiconductor device in the first CMOS inverter is connected with the first power supply wiring line connected with the source diffusion layer of the n-channel semiconductor device in the second CMOS inverter on the source diffusion layers, and
the second power supply wiring line connected with the source diffusion layer of the p-channel semiconductor device in the first CMOS inverter is connected with the second power supply wiring line connected with the source diffusion layer of the p-channel semiconductor device in the second CMOS inverter on the source diffusion layers.

54. An n-channel semiconductor device, which is used in the semiconductor device according to claim 53 and has a structure where a drain, gate, and a source are arranged in a vertical direction with respect to a substrate and the gate surrounds an island-shaped semiconductor layer,
wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

55. A p-channel semiconductor device, which is used in the semiconductor device according to claim 53 and has a structure where a drain, a gate, and a source are arranged in a vertical direction with respect to a substrate and the gate surrounds an island-shaped semiconductor layer,
wherein insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

56. A semiconductor device comprising a CMOS inverter coupling circuit in which CMOS inverters on at least two stages are coupled with each other, the CMOS inverter having a first CMOS inverter and a second CMOS inverter, wherein the first CMOS inverter is a CMOS inverter having:

one n-channel semiconductor device having a structure where a drain, gate, and a source are arranged in a vertical direction with respect to a substrate and the gate surrounds an island-shaped semiconductor layer;

two p-channel semiconductor devices each having a structure where a drain, a gate, and a source are arranged in the vertical direction with respect to the substrate and the gate surrounds an island-shaped semiconductor layer;

an input terminal of the first CMOS inverter arranged so as to connect the gate of the n-channel semiconductor device with the gate of each p-channel semiconductor device;

an output terminal of the first CMOS inverter arranged so as to connect a drain diffusion layer of the n-channel semiconductor device with a drain diffusion layer of each p-channel semiconductor device in an island-shaped semiconductor lower layer;

a first power supply wiring line connected with a source diffusion layer of the n-channel semiconductor device; and a second power supply wiring line connected with source diffusion layers of the two p-channel semiconductor devices, the second CMOS inverter is a CMOS inverter having:

one n-channel semiconductor device having a structure where a drain, a gate, and a source are arranged in the vertical direction with respect to the substrate and the gate surrounds an island-shaped semiconductor layer;

two p-channel semiconductor devices each having a structure where a drain, a gate, and a source are arranged in the vertical direction with respect to the substrate and the gate surrounds an island-shaped semiconductor layer;

an input terminal of the second CMOS inverter arranged so as to connect the gate of the n-channel semiconductor device with the gate of each p-channel semiconductor device;

an output terminal of the second CMOS inverter arranged so as to connect a drain diffusion layer of the n-channel semiconductor device with a drain diffusion layer of each p-channel semiconductor device in the island-shaped semiconductor lower layer;

a first power supply wiring line connected with a source diffusion layer of the n-channel semiconductor device; and a second power supply wiring line connected with source diffusion layers of the two p-channel semiconductor devices, the output terminal of the first CMOS inverter is connected by a coupling portion with the input terminal of the second CMOS inverter, and tops of both of the coupling portion and the gate are located to vertically overlap and align with at least a part of the first power supply line, a dielectric film is formed on entire surfaces of the gate and the coupling portion, the first power supply wiring line connected with the source diffusion layer of the n-channel semiconductor device in the first CMOS inverter is connected with the first power supply wiring line connected with the source diffusion layer of the n-channel semiconductor device in the second CMOS inverter on the source diffusion layers, and the second power supply wiring line connected with the source diffusion layers of the p-channel semiconductor devices in the first CMOS inverter is connected with the second power supply wiring line connected with the source diffusion layers of the two p-channel semiconductor devices in the second CMOS inverter on the source diffusion layers.

57. An n-channel semiconductor device, which is used in the semiconductor device according to claim 56 and has a structure where a drain, gate, and a source are arranged in a vertical direction with respect to a substrate and the gate surrounds an island-shaped semiconductor layer, wherein insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

58. A p-channel semiconductor device, which is used in the semiconductor device according to claim 56 and has a structure where a drain, a gate, and a source are arranged in a vertical direction with respect to a substrate and the gate surrounds an island-shaped semiconductor layer, wherein insulating film layers are formed above and below the gate, a polysilicon wiring line surrounds a part of a drain diffusion layer in an island-shaped semiconductor lower layer, the drain diffusion layer, the polysilicon wiring line, the gate, and a source diffusion layer are salicided, and a metal wiring line is formed on the source diffusion layer.

59. A semiconductor device comprising a CMOS inverter coupling circuit in which CMOS inverters arranged in at least two rows and two columns are coupled with each other, wherein the CMOS inverter in a first row and a second column is a CMOS inverter having:

one n-channel semiconductor device having a structure where a drain, gate, and a source are arranged in a vertical direction with respect to a substrate and the gate surrounds an island-shaped semiconductor layer;

two p-channel semiconductor devices each having a structure where a drain, a gate, and a source are arranged in the vertical direction with respect to the substrate and the gate surrounds an island-shaped semiconductor layer;

an input terminal of the CMOS inverter in the first row and the second column, which is arranged so as to connect the gate of the n-channel semiconductor device with the gate of each p-channel semiconductor device;

an output terminal of the CMOS inverter in the first row and the second column, which is arranged so as to connect a drain diffusion layer of the n-channel semiconductor device with a drain diffusion layer of both of the p-channel semiconductor devices in an island-shaped semiconductor lower layer;

a first power supply wiring line connected with a source diffusion layer of the n-channel semiconductor device; and a second power supply wiring line connected with source diffusion layers of the two p-channel semiconductor devices, the CMOS inverter in the first row and a first column is a CMOS inverter having:

one n-channel semiconductor device having a structure where a drain, a gate, and a source are arranged in the vertical direction with respect to the substrate and the gate surrounds an island-shaped semiconductor layer;

two p-channel semiconductor devices each having a structure where a drain, a gate, and a source are arranged in the vertical direction with respect to the substrate and the gate surrounds an island-shaped semiconductor layer;

an input terminal of the CMOS inverter in the first row and the first column, which is arranged so as to connect the gate of the n-channel semiconductor device with the gate of each p-channel semiconductor device;

an output terminal of the CMOS inverter in the first row and the first column, which is arranged so as to connect a drain diffusion layer of the n-channel semiconductor device with a drain diffusion layer of each p-channel semiconductor device in the island-shaped semiconductor lower layer;

a first power supply wiring line connected with a source diffusion layer of the n-channel semiconductor device; and a second power supply wiring line connected with source diffusion layers of the two p-channel semiconductor devices, the output terminal of the CMOS inverter in the first row and the second column is connected by a coupling portion with the input terminal of the CMOS inverter in the first row and the first column in the CMOS inverter coupling circuit, and tops of both of the coupling portion and the gate are located to vertically overlap and align with at least a part of the first power supply line, a dielectric film is formed on entire top surfaces of the gate and the coupling portion, the CMOS inverter in a second row and the second column is a CMOS inverter having:

one n-channel semiconductor device having a structure where a drain, a gate, and a source are arranged in the vertical direction with respect to the substrate and the gate surrounds an island-shaped semiconductor layer;

two p-channel semiconductor devices each having a structure where a drain, a gate, and a source are arranged in the vertical direction with respect to the substrate and the gate surrounds an island-shaped semiconductor layer;

an input terminal of the CMOS inverter in the second row and the second column, which is arranged so as to connect the gate of the n-channel semiconductor device with the gate of both of the p-channel semiconductor devices;

an output terminal of the CMOS inverter in the second row and the second column arranged so as to connect a drain diffusion layer of the n-channel semiconductor device with a drain diffusion layer of each p-channel semiconductor device in the island-shaped semiconductor lower layer;

a first power supply wiring line connected with a source diffusion layer of the n-channel semiconductor device; and a second power supply wiring line connected with source diffusion layers of the two p-channel semiconductor devices, the CMOS inverter in the second row and the first column is a CMOS inverter having:

one n-channel semiconductor device having a structure where a drain, a gate, and a source are arranged in the vertical direction with respect to the substrate and the gate surrounds an island-shaped semiconductor layer;

two p-channel semiconductor device having a structure where a drain, a gate, and a source are arranged in the vertical direction with respect to the substrate and the gate surrounds an island-shaped semiconductor layer;

an input terminal of the CMOS inverter in the second row and the first column, which is arranged so as to connect the gate of the n-channel semiconductor device with the gate of each p-channel semiconductor device;

an output terminal of the CMOS inverter in the second row and the first column, which is arranged so as to connect a drain diffusion layer of the n-channel semiconductor device with a drain diffusion layer of each p-channel semiconductor device in the island-shaped semiconductor lower layer;

a first power supply wiring line connected with a source diffusion layer of the n-channel semiconductor device; and a second power supply wiring line connected with source diffusion layers of the two p-channel semiconductor devices, the output terminal of the CMOS inverter in the second row and the second column is connected by a coupling portion with the input terminal of the CMOS inverter in the second row and the first column in the CMOS inverter coupling circuit, and a top of the coupling portion is located lower than tops of the source diffusion layers of the CMOS inverters, and the first power supply wiring line connected with the source diffusion layer of the n-channel semiconductor device in the CMOS inverter in the first row and the second column;

the first power supply wiring line connected with the source diffusion layer of the n-channel semiconductor device in the CMOS inverter in the first row and the first column;

the first power supply wiring line connected with the source diffusion layer of the n-channel semiconductor device in the CMOS inverter in the second row and the second column; and the first power supply wiring line connected with the source diffusion layer of the n-channel semiconductor device of the CMOS inverter in the second row and the first column are connected with each other on the source diffusion layers, and the second power supply wiring line connected with the source diffusion layers of the two p-channel semiconductor devices in the CMOS inverter in the first row and the second column;

the second power supply wiring line connected with the source diffusion layers of the two p-channel semiconductor devices in the CMOS inverter in the second row and the second column;

the second power supply wiring line connected with the source diffusion layers of the two p-channel semiconductor devices in the CMOS inverter in the first row and the first column; and the second power supply wiring line connected with the source diffusion layers of the two p-channel semiconductor devices in the CMOS inverter in the second row and the first column are connected with each other on the source diffusion layers.

60. An n-channel semiconductor device, which is used in the semiconductor device according to claim 59 and has a structure where a drain, gate, and a source are arranged in a vertical direction with respect to a substrate and the gate surrounds an island-shaped semiconductor layer, wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

61. A p-channel semiconductor device, which is used in the semiconductor device according to claim 59 and has a structure where a drain, a gate, and a source are arranged in a vertical direction with respect to a substrate and the gate surrounds an island-shaped semiconductor layer, wherein insulating film layers are formed above and below the gate,
a polysilicon wiring line surrounds a part of a drain diffusion layer in an island-shaped semiconductor lower layer,
the drain diffusion layer, the polysilicon wiring line, the gate, and a source diffusion layer are salicided, and
a metal wiring line is formed on the source diffusion layer.

* * * * *

UNITED STATES PATENT AND TRADEMARK OFFICE
CERTIFICATE OF CORRECTION

PATENT NO. : 8,039,893 B2
APPLICATION NO. : 12/284327
DATED : October 18, 2011
INVENTOR(S) : Fujio Masuoka et al.

It is certified that error appears in the above-identified patent and that said Letters Patent is hereby corrected as shown below:

In the Claims

In column 24, claim 4, line 13, after "MOS transistor is an" replace "re-channel" with --n-channel--.

In column 25, claim 16, line 67, after "MOS transistor is an" replace "re-channel" with --n-channel--.

In column 27, claim 29, line 65, after "MOS transistor is an" replace "re-channel" with --n-channel--.

In column 29, claim 41, line 54, after "MOS transistor is an" replace "re-channel" with --n-channel--.

Signed and Sealed this
Third Day of April, 2012

David J. Kappos
*Director of the United States Patent and Trademark Office*